(12) United States Patent
Kobayashi

(10) Patent No.: US 6,271,773 B1
(45) Date of Patent: Aug. 7, 2001

(54) COHERENT SAMPLING METHOD AND APPARATUS

(75) Inventor: Kensuke Kobayashi, Kokubunji (JP)

(73) Assignee: Teratec Corporation, Musashino (JP)

( * ) Notice: Subject to any disclaimer, the term of this patent is extended or adjusted under 35 U.S.C. 154(b) by 0 days.

(21) Appl. No.: 09/552,302

(22) Filed: Apr. 18, 2000

(30) Foreign Application Priority Data

Jul. 13, 1999 (JP) .................................. 11-198272

(51) Int. Cl.[7] .................................................. H03M 7/34
(52) U.S. Cl. .......................... 341/51; 341/123; 327/271
(58) Field of Search ............................. 341/123, 51, 122; 327/271, 272

(56) References Cited

U.S. PATENT DOCUMENTS 4,638,185 * 1/1987 Kobayashi et al. ..................... 327/93
4,839,652 * 6/1989 O'Donnel et al. ..................... 341/123
5,229,668 * 7/1993 Hughes, Jr. et al. ................. 327/271
5,589,763 * 12/1996 Burns ................................. 324/76.15
5,708,432 * 1/1998 Reynolds et al. ..................... 341/123

* cited by examiner

*Primary Examiner*—Peguy JeanPierre
*Assistant Examiner*—Jean Bruner Jeanglaude
(74) *Attorney, Agent, or Firm*—Oblon, Spivak, McClelland, Maier & Neustadt, P.C.

(57) ABSTRACT

A coherent sampling method and apparatus in which synchronizing signal is synchronously obtained from an input signal. The synchronizing signal repetition time period is measured and thereby the clock cycle time, which executes a coherent sampling for the input signal, is sought. A clock generator generates the clock sought and because the sampling clock being optimized for the input signal is used, no waveform missing phenomena happens and a reproduced waveform is immediately displayable.

10 Claims, 47 Drawing Sheets

Tmh=10.3×Tc, Tc=10×(1+8/M), FL=0.001

Tmh=1000.3×Tc, Tc=10×(1+8/M), FL=0.001

Tmh=50000.3×Tc, Tc=10×(1+32/M), FL=0.0003

COHERENT SAMPLING METHOD AND APPARATUS

BACKGROUND OF THE INVENTION

1. Field of the Invention

The present invention relates to the coherent sampling method and apparatus.

The invention is particularly concerned with a digital sampling oscilloscope (DSO) employing the coherent sampling to measure input repetitive signals with fine time resolution.

The novel digital oscilloscope can acquire waveforms without waveform missing phenomena for a short time period by means of a equivalent time sampling.

2. Description of the Prior Art

The equivalent time sampling is widely employed in the digital oscilloscopes. The sampling is well known as the measures to obtain waveforms sampled with the finer time resolution than that of the time period of the sampling clock.

The equivalent time sampling includes three systems. The first is the sequential sampling. The second is the random sampling. The third is the coherent sampling.

The prior art of digital oscilloscopes and their related technics are disclosed as follows.

Prior Art 1; Picosecond Domain Waveform Measurements, N. S. Nahman, Time-Domain Measurements in Electromagnetics, Van Nostrand Reinhold Prior Art 2; IEEE Standard for Digitizing Waveform Recorders, IEEE Std 1057–1994 pp. pp. 5 & 28

Prior Art 3; U.S. Pat. No. 5,708,432, Jan. 13, 1998, Coherent Sampling Digitizer System, Reynolds et al.

Prior Art 4; Electrical Test Instruments, —Theory and Applications—R. A. Witte RTR Prentice Hall, pp. 120–121

Prior Art 5; The Microwave Transition Analyzer; A new Instrument Architecture for Component and Signal Analysis, D. J. Ballo and J. A. Wendler, October 1992, Hewlett-Packard Journal Prior Art 6; Japanese Provisional Publication No. 10-293140 Nov. 4, 1998, Random Sampling Holdoff Method and Circuit, Uchida et al.

Prior Art 7; Waveform Missing Mechanisms and a Countermeasure in a Random Sampling System, IEEE Instrumentation and Measurement Technology conference, St. Paul Minnesota, U.S.A. May 18–21, 1998. K. Uchida et al.

Prior Art 8; Acquisition Clock Dithering in a Digital Oscilloscope, D. E. Tpeppen, April 1997, Hewlett-Packard Journal In the prior art 1, the sequential sampling and the random sampling are disclosed.

In FIG. 1, there is shown a circuit of the sequential sampling disclosed in the prior art 1. In the sequential method, the signal f(t) of the recurrent pulse generator 81 is passed through a delay line DL to allow time for the sampling pulse to be generated. On successive signal occurrences, the delay generator 82 shifts the sampling time in a known a priori way, usually uniformly. The successive samples are stored in the signal (vertical) channel f(t) memory 84. The memory output 85 from the memory 84 is displayed in a order as indicated by the numbers at the points. No signal channel delay line may be required for triggerable signal sources if satisfactory electronic delay is available.

In FIG. 2, there is shown a circuit of the random sampling disclosed by the prior art 1. In the random method, the time value of each sample is not known a priori but is determined by measuring the relative time position (time point) between the start of the signal f(t) and the sampling pulse. The signal f(t) is generated by a recurrent pulse generator 81. The value so determined is stored in the time-base memory 87. Note that (1) the sampling pulse is not synchronized to the signal, (2) no signal delay line is thus required, and (3) non zero samples are obtained whenever the signal and sampling pulse occur simultaneously. The time ramp 86 could just as well be started by the signal f(t) and stopped by the sampling pulse 90.

The sequential sampling shown in FIG. 1 requires the delay line DL to obtain samples at trigger points or theretofore. The wider the bandwidth of the delay line DL is, the thinner it's diameter is. The thin delay line has the high cutoff frequency, however, the line is accompanied with much dissipation in a high frequency range. The bandwidth is, therefore, compromisingly limited by employing the delay line.

In order to obtain the fine time resolution of time in the operation of the sampling data acquisition, it is required to employ the time base with the fine time resolution and the wide bandwidth feature together. If no pretrigger signal is obtainable in the sequential sampling, the bandwidth and the fine time resolution are compromised because of the delay line.

In FIG. 2, the time ramp 86 is started by the start of the signal f(t) and stopped by the sampling pulse a(t). Thereby the outputs 85 of the memory 84 are displayed at the points indicated by the outputs n of the time base memory 87 in a random order as shown by the numbers from 1 to 13. In this way, the signal f(t) is reproduced as f(n).

The random sampling shown in FIG. 2 has the pretrigger ability to be able to sampling at points previous to the start of the signal f)t) to be measured. Accordingly, the random sampling requires no delay line which limits the bandwidth.

In the paragraph 4.1.5 of the prior art 2, the coherent sampling is disclosed as one of the equivalent time sampling. The coherent sampling is realized by setting the input signal's repetition frequency to that of sampling clock appropriately.

In the prior art 3, another coherent sampling is disclosed. Therein, the repetition frequency Fs of the sampling clock is set appropriately to the input signal's repetition frequency Ft in contrast with the prior art 2. The prior art 3 shows the condition to realized the coherent sampling. In the conditions, Ft/Fs=M/N, in which M and N are relatively prime integers. The integer N is the number of samples during a repetition cycle of the input waveform to be measured. The integer M is the number of cycles of the input waveform to produce data of N different time points representing one cycle of the input waveform.

In the prior arts 2 and 3, the coherent sampling is realized by means of appropriately setting one repetition frequency to another between the input signal and the sampling clock.

In the prior art 4, the random sampling is described as follows.

Since random repetitive sampling provides pretrigger information, it has largely displaced sequential sampling, except at microwave frequencies. At microwave frequencies, the time/division setting on the scope can be very small, causing the window of time that is viewed on the display to also be very small (perhaps 100 ps). The probability of a randomly acquired sample falling into the desired time window is so small that random repetitive sampling would take a long time to acquire the entire waveform. Alternatively, sequential sampling forces the sample points to occur within the desired time window so the entire waveform can be acquired quickly.

In the sequential sampling, the sampling frequency depends on the input signal's repetition frequency. When the repetition frequency becomes over several hundred kHz, the sampling frequency Fs of 100 kHz or so is generally employed. The sequential sampling's data acquisition time Tseq is given by $$Tseq=(Tw/Tres)(1/Fs) \quad (1)$$

in which Fs is the sampling frequency, Tw is the time window and Tres is the time resolution.

The equation (1) means, for example, that the acquisition time $$Tseq=(100 \text{ ps}/1 \text{ ps})(10 \text{ } \mu s)=1 \text{ ms}$$

in which the time window Tw is 100 ps, the time resolution Tres is 1 ps, and the sampling frequency Fs is 100 kHz or 1/10 μs.

In the random sampling, the data acquisition time Tran is given by $$Tran=\{(Tmh)/(FsTw)\}(Tw/Tres)k$$

or $$Tran=\{(Tmh)/(FsTres)\}k \quad (2)$$

The Tmh is the hold time duration, (1/(FsTw)) is the reciprocal of the probability to sample the signal within the time window Tw by the sampling clock. The (Tw/Tres) is the number of acquisition data.

The reading, writing and other processes are executed during the hold time duration Tmh. The constant k is approximately given by 2 log(Tw/Tres)+1, which depends on the sampling uniformity. Because, the sampling are not executed uniformly for the limited time period. At arbitrary two points on signal, for example, one point can be sample many times, however, another can not be sampled. In case of Tw/Tres=100, k takes a value between 4 and 6, typically 5.

A conventional wideband random sampling oscilloscope operates with a clock rate Fs of 40 MHz. Let it be supposed in FIG. 2, that the clock cycle time Tc is (1/Fs) or 25 ns, the hold time duration Tmh is 100 clock's period of 2.5 μs, the time resolution Tres is 1 ps, the time window Tw is 100 ps and the constant k is 4. Then, the random sampling data acquisition time period Tran (=2.5 μs(25 ns/1 ps)k) is approximately 250 ms.

The sequential sampling frequency Fs is 100 kHz and the random sampling rate Fs is 40 MHz.

Accordingly the random sampling rate is 400 times (40 MHz/100 kHz) higher than that of the sequential sampling. The data acquisition time periods Tran and Tseq in the random sampling and the sequential sampling are 250 ms and 1 ms respectively. The time period Tran is 200 times or more longer than Tseq.

A conventional digital storage oscilloscope (DSO) employs a time interpolator of the dual slope type. The time interpolator requires, for example, 25000 (=25 ns/1 ps) clocks (Tmh=(25000)(25 ns)=625 μs) in order to obtain a time resolution Tres of 1 ps by using a sampling rate Fs of 40 MHz (1Fs=25 ns). Then, the random sampling requires a very long data acquisition time period Tran of about 60 s. The time period Tran of 60 s is too long to use it practically.

In the coherent sampling shown in the prior art 3, there is the relationship given by $$Ft/Fs=M/N$$

in which M and N are relatively prime integers, Ft is the input signal's repetition frequency, Fs is the sampling clock rate, N is the number of samples during a cycle of the input waveform to be measured, and M is the number of cycles of the input waveform to produce data of N different time points representing one cycle of the input waveform. The N is shown by $$N=1/(FtTres)$$

in which the Tres is the time resolution. Therefore, the coherent sampling's data acquisition time period Tcoh is obtained by $$Tcoh=M/Ft=N/Fs=1/(FsFtTres) \quad (3)$$

in which Tcho does not include a measuring time period of the input signal's repetition frequency Ft and a setting time period of the clock rate.

Let it be supposed that the coherent sampling clock rate Fs is 40 HMz (1/Fs=25 ns), the input signal's repetition frequency Ft is 1 GHz (1/Ft=1 ns), and the time resolution Tres is 1 ps. Then the coherent sampling data acquisition time Tcoh is given by $$Tcoh=25 \text{ ns}(1 \text{ ns}/1 \text{ ps})=0.025 \text{ ms}$$

In spite of the coherent sampling clock rate Fs is the same as that of the random, Tcoh (=0.025 ms) is 1/10000 times shorter than the random sampling's data acquisition time Tran (=250 ms). When the input signal's repetition frequency Ft is 10 GHz, the time Tcoh becomes 2.5 μs. If the sequential sampling frequency Fs of 40 MHz is available, the sequential sampling data acquisition time Tseq of 2.5 μs being equal to Tcoh can be obtained.

In the coherent sampling, the sampling clock rate is sought, and then different time positions on the input waveform are successively sampled at the sampling clock rate. In the sequential sampling, the required portion of the input waveform after the trigger are sampled. In the coherent sampling, however, after sampling one cycle of the input waveform, the required portion of the waveform is displayed.

The prior art 5 describes, in its page 5, the case to sample coherently a microwave signal as follows.

The signal at the IF is a replicas of the input signal, but at a much lower fundamental frequency. When this signal is digitized and displayed, the wave shape matches that of the input.

To keep the display triggered, low-frequency trigger circuitry is connected to the IF signal and used to initiate the storage of a data record relative to a rising or falling edge. Data samples in the buffer before the trigger occurrence are displayed as negative time (pretrigger view). Through the combination of periodic sampling and a low-frequency trigger circuit, the microwave transition analyzer is able to trigger internally on periodic signals across the full 40-GHz input bandwidth and offer negative-time capability without delay lines.

As above-mentioned, the coherent sampling is an excellent high frequency waveform data acquisition system with the pre-trigger ability.

To sample coherently, it is the premise that fluctuations of the signal to be measured and the sampling clock rate are negligible small. The premise does not exist in the sequential or random sampling. It is, therefore, the new restriction.

FIGS. 3, 4, 5 and 6 show waveforms reproduced by simulation of the coherent sampling and the fixed clock random sampling, of which X and Y coordinates are respectively the time t and the signal amplitude A.

In those FIGS. 3 to 6, it is assumed that a mean time period of fluctuated signal Tbase=10 and the standard deviation of the fluctuation FL=0.01 and 0.003. FIGS. 3 and 4 show the cases of the coherent sampling. FIGS. 5 and 6 show the cases of the random sampling.

The simulation is executed under the following conditions. The time resolution Tres is Tc/64. Data acquisitions are executed 640 times, i.e., 10 times per a time resolution Tres. The sampling clock cycle time Tc is 10(1+1/64) with no fluctuation of Tc.

Here assumed that the accumulated fluctuation of the signal increases with a square root of the lapse of time ($\delta$ t=(rndm)t$^{1/2}$) and is given by $$\text{signal } (t)=\text{Sin}[2\pi\{t+(rndm)t^{1/2}\}/Tbase] \quad (4)$$

Therein, rndm=(FL)Random [ ]Tbase$^{1/2}$ in which Random [ ] means to generate the Gaussian random numbers with its variance of 1 and its mean value of zero.

In the random sampling of FIGS. 5 and 6, there are quantizing errors depending on the time resolution of Tc/64. However, the jitters at the rising edge of the triggered time (equivalent time t=0) are decreased to zero. On the other hand, in the coherent sampling of FIGS. 3 and 4, cyclic fluctuation appear depending no the starndard deviation FLs and the jitters are observable over the whole waveforms. It is, therefore, difficult to measure a rise time or a settling time of the acquired waveform data. If data processing like averaging is applied to acquired data, there occur problems of degradation of a bandwidth, a time resolution and so on. The problems are to be solved.

The outlines of the three systems of the equivalent-time sequential, random and coherent sampling, and their advantages and disadvantages have been described. They can reach a compromise. The sequential sampling includes a barrier against the wide bandwidth. The coherent sampling involves a demerit of the time jitter occurrence. And the random sampling has a subject of the long data acquisition time.

In accordance with computers or digital circuits operating with high clock rate, a convenient realtime DSO operates with the sampling clock rate of 5 GHz or so. In the random sampling, let assume that a sampling clock rate Fs is 1 GHz, a hold time duration Tmh is 10 times period (10 ns) of the clock cycle time (1 Fs=1 ns), a time window Tw is 100 ps and a time resolution Tres is 1 ps. A random sampling data acquisition time Tram will be given by $$Tran=10 \text{ ns}(1 \text{ ns}/100 \text{ ps})(100 \text{ ps}/1 \text{ ps})k=0.04 \text{ ms}$$

in which k=4. The above-assumption is easily realizable by the current technology. However, to obtain a shorter time period Tran, the random sampling must be confronted by the peculiar phenomena of waveform missing.

The prior arts 6 and 7 describe about the waveform missing phenomena as follows.

When the sampling clock rate is constant, one of the waveform missing phenomena is caused by the holdoff.

The prior arts 6 and 7 detailedly describe the mechanism causing the phenomena and the relationship between the random holdoff and the constant holdoff as dealing method with the phenomena. Therein, some problems have been solved.

There is, however, an unsolved problem. The problem is the waveform missing phenomena caused by a relation of a signal's repetition frequency Ft and a sampling clock rate Fs. When an input signal's repetition frequency Ft equals harmonics or subharmonics of a sampling clock rate Fs, namely, on one of the coherent states, specific time points on the waveform are repeatedly sampled. The operation of data acquisition over the whole waveform cannot be, therefore, expected. Then, the waveform missing phenomena happens inevitable. This phenomena happen not only by harmonic or subharmonic relation of Ft and Fs.

In the coherent sampling, there is the relationship described by $$Ft/Fs=M/N$$

M and N are relatively prime integers, Ft is the input signal's repetition frequency, Fs is the sampling clock rate, N is the number of samples during a cycle of the input waveform to be measured, and M is the number of cycles of the input waveform to produce data of N different time points representing one cycle of the input waveform.

When the number of acquisition data N (=MFs/Ft) becomes smaller than the number of required interpolation data, which is Tw/Tres, the waveform missing phenomena are caused. Two measures for solving the phenomena are known as follows.

(1) In the first method of the random sampling, accumulated fluctuations (or random walks) of the input signal's repetition time period 1/Ft increase with the lapse of time by setting a long hold time duration Tmh, in which, for example, a time interpolator called the dual slope type is employed.

(2) In the second method of the random sampling, a sampling clock phase is randomly shifted every time after interpolation.

In the prior art 8, the second method is disclosed, in which the clock phase is randomly shifted by compulsive control. So, the operation of data acquisition over the whole waveforms can be executed without being influenced with the fluctuations of the input signal's repetition frequency Ft. It requires several tens or hundreds clocks periods or more until the shifted clock phase converges and the clock cycle time becomes constant. Accordingly, the second method is better than that of the first from the viewpoint of the waveform missing phenomena. In the shortening the hold time duration Tmh, the improvement is not, however, enough for convenient use.

In the first method, the long hold time duration Tmh is originally set. It is not, therein, intended to obtain a short hold time duration.

In FIGS. 7, 8, 9 and 10, reproduced waveforms (replicas) are shown by simulation. The simulation is executed by the first method of the random sampling setting the short or long hold time duration Tmh. Each of the clock cycle times Tcs being set causes the constant holdoff system to trouble with the waveform missing phenomena. In those sampling operations, data acquisitions are executed 640 times, i.e., 10 times per a time resolution Tres=Tc/64, and each of signal waveforms has a mean cycle time of 10.

Each of those sampling is operated by the hold time duration Tmh, the clock cycle time Tc, the starndard deviation of the fluctuation FL, and the number M (=64) of data to be displayed per Tc.

In FIG. 7, Tmh=10.3(Tc), Tc=10)1+8/M), and FL=0.001

In FIG. 8, Tmh=1000.3(Tc), Tc=10(1+8/M, and FL=0.001

In FIG. 9, Tmh=1000.3(Tc), Tc=10(1+32/M), and FL=0.0003

In FIG. 10, Tmh=50000.3(Tc), Tc=10(1+32/M), and FL=0.00003

The waveform missing phenomena can be found in FIG. 7 of Tmh=10.3(Tc). In FIG. 8 employing longer Tmh=

1000.3(Tc) than that of FIG. 7, no waveform missing phenomena can be found. By changing the fluctuation FL=0.001 of FIG. 8 to a smaller FL=0.0003 of FIG. 9, the waveform missing phenomena appears. By change Tmh=1000.3(Tc) of FIG. 9 to a longer Tmh=50000.3(Tc), the waveform missing phenomena can not be found again.

In FIGS. 7 to 10 showing random sampling simulations, when the starndard deviation of the input signal fluctuation FL becomes small, it becomes difficult sometimes to execute data acquisition over the whole waveform. And the waveform missing phenomena can be observed. Happenings of the phenomena are avoidable with a long hold time duration Tmh.

However, the measures using the long hold time duration are impractical. Because a long period of time is needed to acquire waveform data.

There are pretrigger and posttrigger acquisition processes in the random sampling. The pretrigger acquisition process is for acquiring signal data before a trigger input. The posttrigger acquisition process is for acquiring signal data after the trigger input.

In both processes, each of time bins corresponding to each of points on the signal waveform stores each of data of the signal waveform. It is the cause of waveform missing phenomena that some of time bins remain vacant.

FIG. 11 shows the operating of the pretrigger and posttrigger acquisition processes.

The signal 1 of FIG. 11 (a) is to be measured. The signal 1 is sampled by the sampling clock 3 at time points t109 to t114 to obtain data D1 to D6.

The synchronizing signal 52 of FIG. 11 (b) is selected for reference from triggers synchronizing with the input signal 1 of (a) to be measured.

The synchronizing signal 52 of (b) occurs at the signal 1 rising edge t100. The synchronizing signal 52 can be picked off from the signal 1. In the hold state HO of (d), no trigger is acceptable. The data D1 is obtained by sampling the signal 1 at the time point t109 of the hold state HO. The data D1 is stored into the acquisition memory 30 of (e) which is FIFO (first in first out memory).

The memory 30 of FIG. 11 consists of 3 data words for convenience' sake.

The data D2 sampled at the time point t110 is stored into the acquisition memory 30 of 3 words. The first and second words are respectively occupied with the data D2, D1. But, the third word is vacant at t110.

At the time appoint t102, the hold signal HO of FIG. 11 (d) turns from the hold state to inhibit triggering to the unhold state HOF to be triggerable.

Although it is in unhold state HOF, no trigger is applied. So, at the time point t112, the signal 1 of (a) is sampled by the clock 3 of (c) to obtain the data D4. The data D4 is stored into the acquisition memory 30 of (e). At the time point t112, the acquisition memory 30 has been already fully occupied.

The oldest data D1 is, therefore, abandoned and the data D4, D3 and D2 are stored into the memory 30.

At the time point t100, a synchronizing signal 52 of FIG. 11 (b) is applied and the unhold state HOF is turned to the hold state to inhibit triggering. The signal 52 synchronizes with the signal 1 of (a).

At the time points t113, the signal 1 of (a) is sampled by the clock 3 of (c) to obtain the data D5 stored into the acquisition memory 30 of (e). In the memory 30, the oldest data D2 is abandoned and the data D5, D4 and D3 are stored into the memory 30. In like manner, at the time point t114, the data D6, D5 and D4 are stored into the memory 30 of (e).

A time window of FIG. 11 (g) is preset before the measurement. The time window of (g) consists of two time periods for the pretrigger and posttrigger acquisition processes. In the pretrigger acquisition process, the data before the synchronized signal 52 at the time point t100 are acquired. In the posttrigger acquisition silicon process, the data after the synchronizing signal 52 at the time point t100 are acquired.

In FIG. 11, the acquisition memory of three words are employed as an example. One of the three words is assigned to the pretrigger acquisition process. The remaining two words are assigned to the posttrigger acquisition process. Then, the data D4 is stored into a time bin, which is one of five time bins assigned to the pretrigger acquisition process. Each of time bins corresponds to the time resolution Tc/5.

The data D5 and D6 are stored as the posttrigger acquisition. When two words of data D5 and D6 are stored into time bins of the waveform memory 50, the operation of the data acquisition ends.

In FIG. 11 (f), contents of the waveform memory 50 are shown. The memory 50 consists of 15(=3×5) time bins for 3Tc, in which the time resolution is Tc/5. There is a time difference Tsn between the time point t100 of the synchronizing signal 52 and the time point t113 of the sampling clock 3 just after t100. The data D6, D5 and D4 acquired in the memory 30 at the time point t114 are respectively stored into bins corresponding to the time difference Tsn in FIG. 11 (f). The data D4 is posted by the clock cycle time Tc before the data D5. The data D6 is posted by the clock cycle time Tc after the data D5.

Data of five time bins are obtained during the pretrigger acquisition processes. In the time window of FIG. 11 (g), only the data D4, which is acquired during t109 to t100 of one pretrigger acquisition process, is representatively shown. In like manner, data of ten time bins are obtained during the posttrigger acquisition processes. In the time window of FIG. 11 (g), only the data D5 and D6, which are acquired during t100 to t114 of one posttrigger acquisition process, are representatively shown.

In the following pretrigger and posttrigger acquisition processes after the next synchronizing signal 52 not shown, different points from points D1 to D6 of (a) will be sampled to obtain other data. Those data will be respectively stored into time bins of the waveform memory 50 of (f) corresponding to sampled points. The above-mentioned operations are repeated the predetermined times. Thus, the data of the fifteen time bins are displayed. In case that all of the fifteen time bins are occupied with data, the waveform missing phenomena can not be caused.

In FIG. 12, there are shown time charts of the equivalent time sampling for displaying are produced waveform (replica). In (a), the sampling clock 3 is shown, In (b), the sampling clock 3' following the clock 3 of (a) is shown. A signal 1 to be measured is shown in (c). The reference triggers RTs are generated at the rising edge of signal waveforms displayed with thick lines. The reference triggers RTs are used as the synchronizing signal 52 not shown.

The sample point SP1-1 on the signal 1 of (c) is sampled by the clock 3 of (a) at the clock timing c1 just after the reference trigger RT1 of the signal 1 of (c). The data of the sample point SP1-1 is acquired and displayed as one instantaneous value of the reproduced waveform (replica) of (d). In like manner, the sample point SP1-2 is sampled at c2, the sampled data is acquired and displayed as (d).

The clock timing c13 of (a) corresponds to c1' of (b). The data of the sample point SP2-1 is sampled by the clock 3 at the clock timing c13 (or c1') just after the reference trigger RT2. The data of the sample point SP2-1 is acquired and displayed as another instantaneous value of the reproduced waveform (replica) of (d). The data of SP2-2 is sampled at c14 (or c2') to be dis played as shown in (d). Four data of SP1-1, -2, SP2-1 and -2 are acquired from two signal waveforms of (c). The reproduced waveform (replica) of (d) is equivalent to data acquired from a single waveform.

The rising edge of the displayed waveform (replica) of (d) corresponds to the reference trigger RT1 or RT2. The time difference Ts1 is between the reference trigger RT1 and the clock timing c1 just after RT1, and Ts2 is between RT2 and c13 (or c1') just after RT2.

The reference trigger time period Trr1 between RT1 and RT2 is described by $$Trr1 = 12Tc + Ts1 - Ts2 = 12Tc - \delta Ts1$$

in which $$\delta Ts1 = Ts2 - Ts1$$

In the same manner, the reference trigger time period Trr2 between RT2 and RT3 is described by $$Trr2 = 12Tc + Ts2 + Tc - Ts3 = 12Tc - \delta Ts2 + Tc$$

in which $$\delta Ts2 = Ts3 - Ts2$$

In the timings of FIG. 12, $\delta$ Ts1 and $\delta$ Ts2 are respectively given by $$\delta Ts1 = Ts2 - Ts1 = -(1/5)Tc$$

$$\delta Ts2 = Ts3 - Ts2 = (4/5)Tc$$

wherein as if $\delta$ Ts1 and $\delta$ Ts2 are unequal. However, $\delta$ Ts2−Tc=−(1/5)Tc. If $\delta$ Ts2−Tc is anew replaced to $\delta$ Ts2, the new $\delta$ Ts2 is equal to $\delta$ Ts1. This is easily understandable from the fact of Trr1=Trr2 in FIG. 12.

In FIG. 13, there are shown relationships between the reproduced waveforms (replica) of FIG. 12 (d) and many time bins which store data of sample points SP referring the reference trigger RT. The signal 1 and the clock 3 are, therein, set in their cycle time so as to obtain the relation of $$\delta Ts = -(1/5)Tc$$

Upward arrows indicate clock timings cs of the clock 3 (or 3'). Horizontal arrows show time differences Tss. Eight time bins are provided for a clock cycle time Tc. Namely, the time resolution is Tc/8. When all of the eight time bins are occupied with waveform data, no waveform missing phenomena occurs.

With the lapse of time, seven reference triggers RT1 to 5, RT1' and 2' are continuously generated. Reference triggers RT4, 5, 1' and 2' are not shown in FIG. 12. They are continuously generated after the RT3.

The black dots on the signal 1 are sampled points representing instantaneous amplitudes of the signal 1. The sampling are executed by the clock 3 generated during a period of about 1.5Tc after each of the seven reference triggers RTs. The seven black dots obtained by the equivalent time sampling reproduce a waveform as the input signal 1.

In the example of FIG. 13, the clocks 3 of the reference triggers RT1 to 5 sample different time points on the signal 1. But the clock 3 of the reference trigger RT1' samples at relatively the same time point as that of RT1, and the clock 3 of RT2' samples at relatively the same time point as that of RT2. The same time points as the previous series of samples on the signal 1 are repeatedly sampled. In spite of the continuation of the sampling, it is difficult to obtain more sample points than five.

In FIG. 13, the time resolution for acquiring sampled data is Tc/8. There are employed eight time bins corresponding the clock 3 of the reference trigger RT1. The clock cycle time Tc is resolved by eight time bins. Five time bins with circles are occupied with data sampled by the clocks 3 of RT1 to RT2'. The other three time bins are vacant, namely, the waveform missing phenomena can be observed.

SUMMARY OF THE INVENTION

An object of the invention is to provide a novel equivalent time sampling system for acquiring waveform data.

Another object of the invention is to provide a sampling system having characteristics as follows;

(1) to have a pretriggering capability without limiting wide bandwidth, (2) to acquire jitterless waveform data from an input signal of a fluctuated repetition rate, (3) to occur no waveform missing phenomena in a data acquisition operation, and (4) to be excellent in speed of the data acquisition operation.

In conventional coherent sampling, when an input signal repetition rate fluctuates, waveform jitters occur.

In a random sampling, when fluctuating, a jitterless operation is obtained. However, in the random sampling, the waveform missing phenomena can inevitably happen, and to avoid the phenomena, a long hold time is required. Therefore, it needs an impractical long measuring time.

A further object of the invention is to provide a sampling oscilloscope being capable of a jitterless and short measuring time operation.

In the present invention, features of the coherent sampling are usefully employed and faults of that are removed.

Therefore, in a sampling oscilloscope of the invention, a synchronizing signal is synchronously obtained from an input signal. The synchronizing signal is used as a reference trigger. The reference trigger repetition time period is measured.

Then, the sampling clock cycle time is sought by the reference trigger repetition time period. The clock cycle time is controlled so as to execute a coherent sampling for the input signal. As the sampling clock being optimized for the input signal is used, no waveform missing phenomena can happen and a reproduced waveform (replica) is immediately displayable. The change rate of the controlled clock cycle time is, for example, within 1/10000 of a clock cycle time.

BRIEF DESCRIPTION OF THE DRAWINGS

The principle, construction and operation of the present invention will be clearly understood from following detailed description taken in conjunction with the accompanying drawings, in which.

DESCRIPTION OF THE PREFERRED EMBODIMENTS

In the present invention, an input signal repetition frequency is not sought, but a synchronizing signal repetition time period, namely a reference trigger repetition time period, which is the same as a hold repetition time period, is sought. Then a sampling clock time period is calculated and set so that time interpolation data, which is a series of time differences between the reference triggers and the sampling clocks, satisfy conditions of a coherent sampling.

The embodiments of the present invention will be described herein under in detail with reference to the accompanying drawings.

Figure 14:
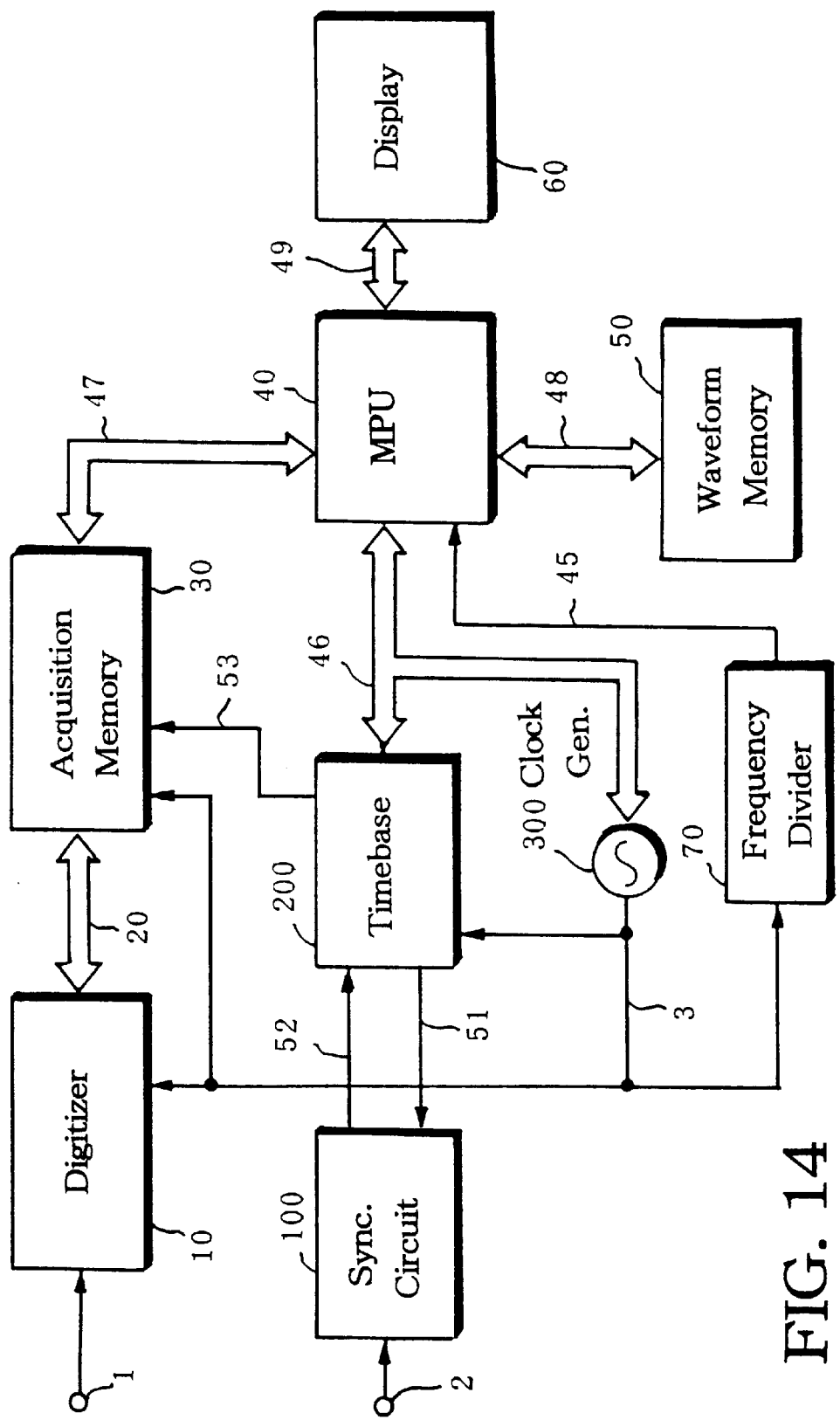
FIG. 14 is a circuit block diagram of an embodiment of the present invention.
Figure 15:
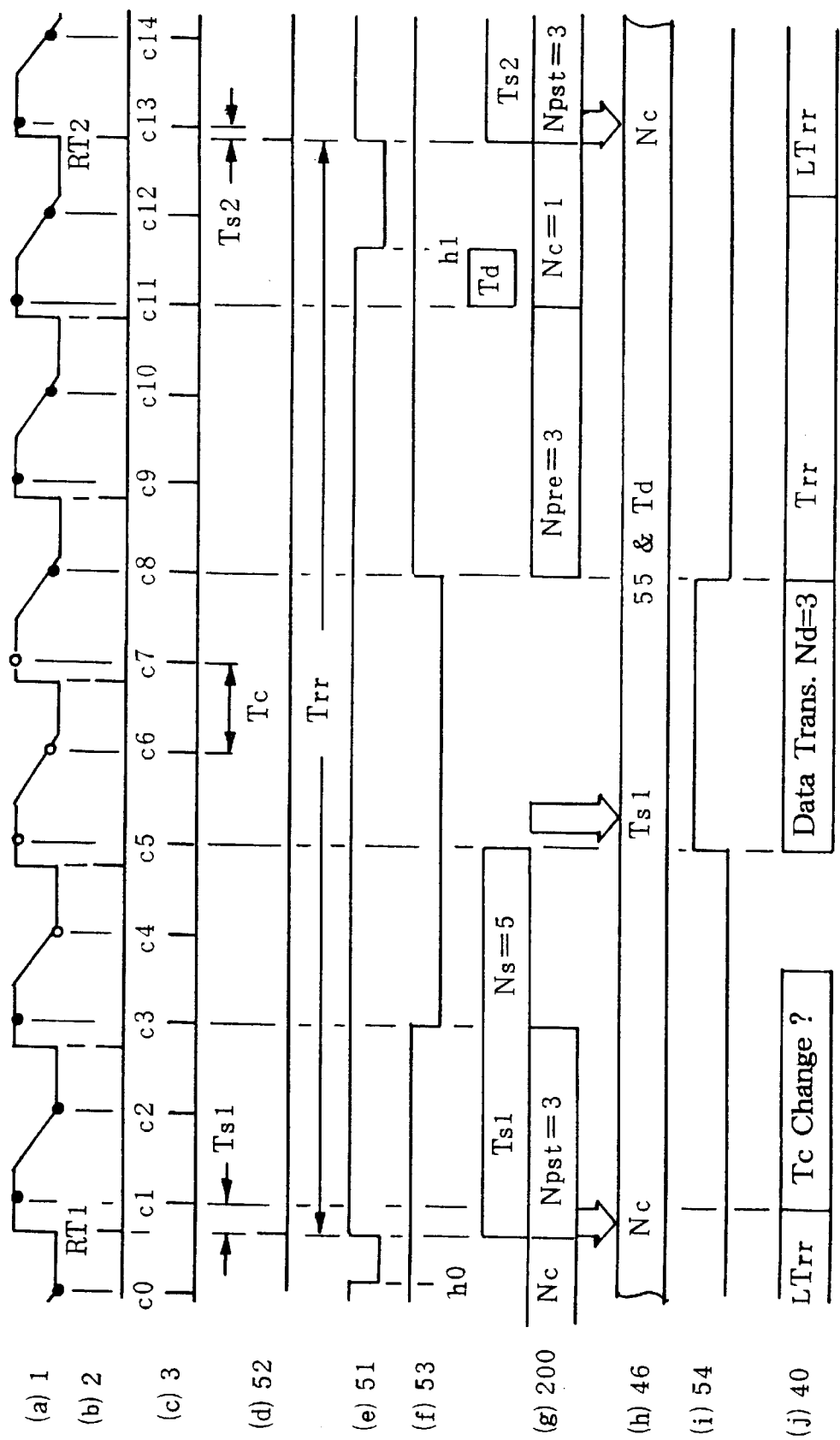
FIG. 15 is a time chart showing an operation of the embodiment of FIG. 14 according to the present invention.

FIGS. 14 and 15 show respectively a circuit block diagram of an embodiment of the present invention and waveforms of points in the circuit for describing the operation.

A signal 1 to be measured is applied to a digitizer 10. When receiving clock 3 of FIG. 15 (c), the signal 1 of FIG. 15 (a) is digitized by the digitizer 10 to obtain digital data 20. The digital data 20 are sent to a acquisition memory 30 consisting of shift registers synchronizing with the clock 3. When a store signal 53 of FIG. 15 (f) is "1", the acquisition memory 30 stores the data 20 synchronizing with the clock 3. Black dots on the signal 1 of FIG. 15 (a) indicate amplitudes of sampled points to be stored. White dots on the signal 1 of (a) indicate amplitudes of sampled points not to be stored when the store signal 53 of (f) is "0".

A trigger 2 of FIG. 15 (b) synchronizes with the signal 1. The trigger 2 is, therefore, obtained from the signal 1 by picking off in many cases.

The trigger 2 is applied to a synchronizing circuit 100. When a hold signal 51 of (e) is "1", the circuit 100 inhibits the function of the trigger 2 and when "0", the circuit 100 accepts the trigger 2. The hold signal 51 of (e) turns from "1" to "0" at a hold timing h0 and after that the first pulse of the trigger 2 is applied as a reference trigger RT1. When applied the trigger 2 of RT1, the circuit 100 generates a synchronizing signal 52 of (d). After the generation, the circuit 100 inhibits the function of the trigger 2.

A timebase 200 receives the synchronizing signal 52 of (d) and the clock 3 of (c). By the input of the signal 52, the timebase 200 operates as follows.

The timebase 200 includes three counters. The first counter counts the number of pulses of the clock 3 of (c). The first counter starts to count the clock 3 at the clock timing c0 of (c) and the counting operation is stopped at RT1. A counted number Nc=0 is obtained as the number of clocks while the hold signal 51 of (e) is "0", for instance.

At the clock timing c1 of the clock 3 of (c) generated after the reference trigger RT1, the number of clock Nc=0 is sent to a microprocessor (MPU) 40 via a data bus 46 of (h).

The timebase 200 of (g) measures a time difference Ts1 between the synchronizing signal 52 of (d) obtained from the reference trigger RT1 and the clock timing c1 just after the synchronizing signal 52. The measuring operation of the timebase 200 is executed during the predetermined time period, for example, four clock time periods between c1 and c5, namely the number of clocks Ns=5 for measuring time difference. The measured time difference Ts1 is sent from the timebase 200 to the microprocessor 40 at the clock timing c5 via the data bus 46 of (h).

On the other side, the second counter included in the timebase 200 of (g) counts the number of pulses of the clock 3, in which the predetermined posttrigger value Npst (for example, =3) is preset. When the second counter counts down the number of pulses of the clock 3 from c1 to c3 to obtain its count value to be "0", the store signal 53 of (f) turns from "1" to "0". The turned store signal 53 is delivered to an acquisition memory 30 to inhibit it from storing operation. Then, the white dots on the signal 1 of (a) are not stored to be abandoned.

When the timebase 200 of (g) ends to measure the time difference Ts1 and to count the posttrigger value Npst at the clock timing c5, the timebase 200 turns an acquisition end signal 54 of (i) from "0" to "1" and sends to the microprocessor 40 via the bus 46 of (h), the measured time difference Ts1 and the end of the waveform data acquisition operation.

When the acquisition end signal 54 of (i) turns to "1", the microprocessor 40 of (j) transmits a set of Ts1 and a data stored in the acquisition memory 30 to a waveform memory 50 via the data bus 48 during clock timings c5 to c8. The time difference Ts1 shows the time position of the data in the set.

A data stored at the top address of the acquisition memory 50 is set with the time delayed by $$Ts1+(Npst)Tc$$

from the reference trigger RT1.

A data stored at the second address of the memory 50 is set with the time delayed by $$Ts1+(Npst-1)Tc$$

from RT1.

In like manner, the series of operations are continuously executed. In FIG. 15, Npst=3 and Npre=3, which is described later, are exemplarily shown.

The six waveform data set with the corresponding time position are transmitted during from c5 to c8. The time period between c5 and c8 is predetermined as the number of data transmission clocks Nd (for example, =3, time periods of three clocks).

The waveform data during from c5 to c8 have been already transmitted. Then, the microprocessor 40 delivers a acquisition start signal 55 and a calculated delay time Td (=Tc−Ts1) to the timebase 200 via the data bus 46 of (h).

When the acquisition end signal 54 of (i) turns from "1" to "0" at c8, the microprocessor 40 of (j) executes the following operations before the next turning to "1". They are a calculation of a reference trigger repetition time period Trr, an accumulation of the reference trigger repetition time periods Trrs to obtain LTrr, and the judgment. It is the judgment that the clock cycle time Tc is to be changed or not in like manner with the operation of (j) at c0 to c4.

The microprocessor 40 receives the clock count value Nc and the time difference Ts1 from the timebase 200. The posttrigger value Npst, the pretrigger value Npre, the time difference measuring clock's number Ns and the data transmission clock's number Nd are known in the microprocessor 40. The Npst, Npre and Nd are calculated according to a measurement condition by the microprocessor 40, while the Ns is constant. The microprocessor 40 executes processes as follows.

1. Calculation of the reference trigger time period Trr which is the repetition time period of the synchronizing signal 52 of (d). The Trr is the time period between two pulses of the trigger 2 of (b) corresponding to two reference triggers RT1 and RT2.
2. Adding the calculated Trr to the contents of the memory included in the microprocessor 40 to obtain the accumulated reference trigger time period LTrr.
3. Judgment of the clock cycle time Tc to be changed or not on the basis of the accumulated reference trigger time period LTrr.

Those three processes will be described later.

When receiving the acquisition start signal 55 and the delay time Td(=Tc−Ts1) via the data bus 46 of (h) at the clock timing c8, the time base 200 of (g) operates as follows.

The timebase 200 counts the clock 3 until the pretrigger value Npre is obtained.

In a case of Npre=3 of FIG. 15, the timebase 200 counts pulses of the clock 3 of (c) at the clock timing c9 to c11. After the end of the counting operation of c11, the hold signal of "1" lasts till the timing h1, which is delayed by Td(=Tc−Ts1) from c11. The timebase 200 turns the hold signal 51 of (e) at h1 from "1" to "0" representing an unhold state. The hold signal 51 of "0" is applied to the synchronizing circuit 100.

The third counter included in the timebase 200 starts to count the clock 3 from c11 and stops counting at RT2. The count number Nc(=1 in FIG. 15 (g)) is obtained. The Nc is the clock count value while the hold signal 51 of (e) is "0". The Nc is delivered to the microprocessor 40 via the data bus 46 of (h).

The timebase 200 turns the store signal 53 of (f) from "0" to "1" at the clock timing c8. Then, the acquisition memory 30 starts again to store the digital data 20.

When receiving the hold signal 51 of (e) turned from "1" to "0" at the hold timing h1, the synchronizing circuit 100 becomes ready again to accept the input of the trigger 2.

In this state, the reference trigger RT2 is the first inputted trigger 2 of (b). When receiving RT2, the synchronizing circuit 100 generates a synchronizing signal 52 of (d). The time period between two reference triggers RT1 and RT2 is the reference trigger time period Trr.

Thus, the operation of one cycle as above-mentioned is executed to obtain the reference trigger time period Trr and the time difference Ts1. The operations of the cycles of Trrs are repeatedly executed to store waveform data into the waveform memory 50. The microprocessor 40 suitably interrupts the operations to transmit the acquired waveform data in the waveform memory 50 to the display 60 via the data bus 49 for displaying the waveform.

In the transition of the hold signal 51 of (e) turning from "1" to "0" at the hold timing h0, the trigger 2 of (b) can be sometimes applied.

By the coincidence of the transition and the trigger 2, it is apprehended to happen time jitters. The trigger 2 is not, therefore, selected as the reference trigger RT1. Immediately after the transition of the hold timing h0 has been ended, namely, the hold time duration has been ended, the trigger 2 added is used as the reference trigger RT1. Such a technique to avoid time jitters has been well known.

The time difference Ts1 between the reference trigger RT1 of (b) and the clock timing c1 is, sometimes, too short to get accuracy enough, because a time interpolator to measure the time difference Ts1 operates in the nonlinear range.

In such a case, a time difference between the trigger reference RT1 and the clock timing c2 of (c) is measurable. Such a technique has been well known.

Figure 16:
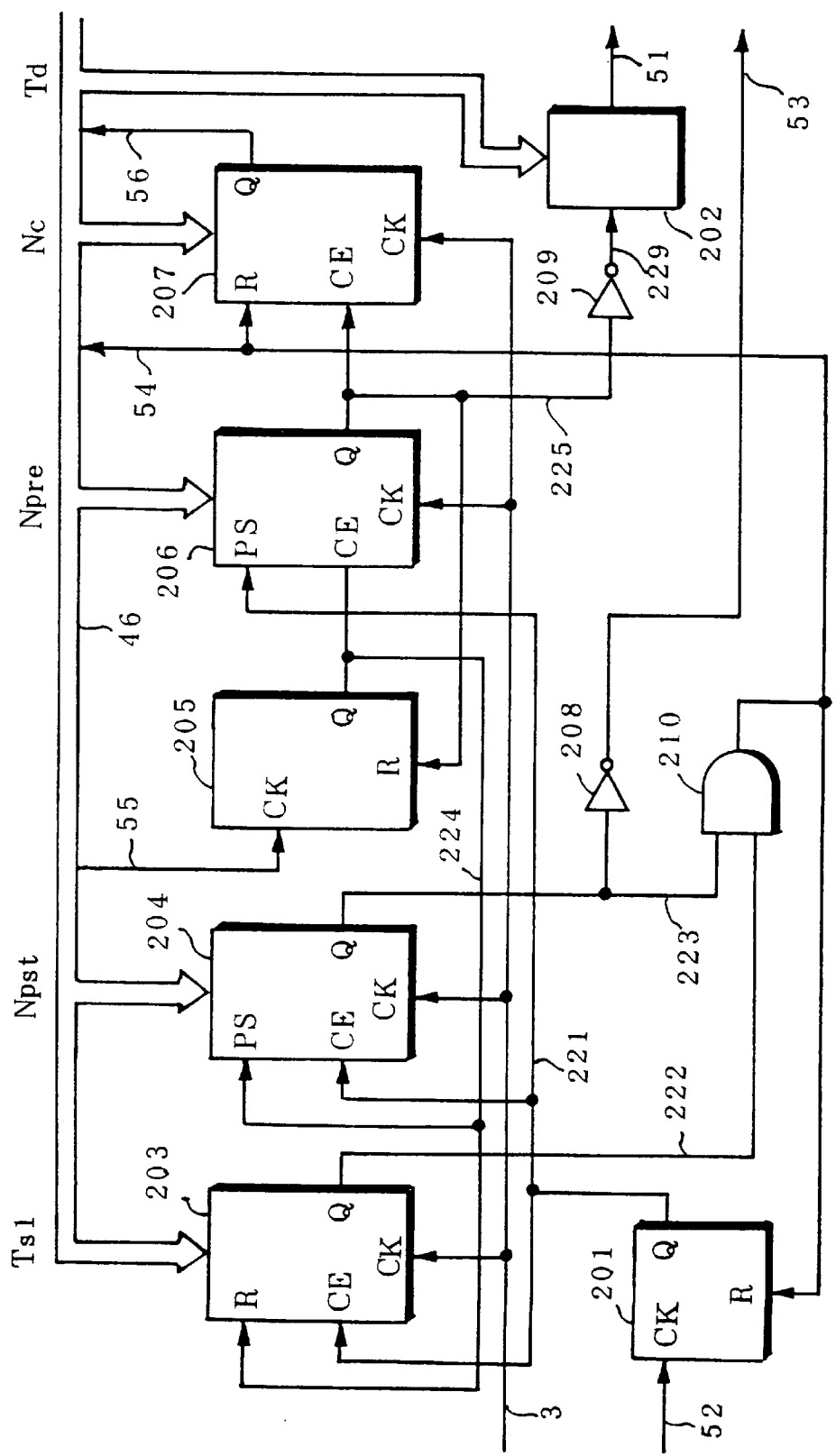
FIG. 16 is a circuit diagram showing an embodiment of a timebase which is an element in FIG. 14 according to the present invention.

In FIG. 16, a detailed circuit of the timebase 200 is shown. In a combination of FIGS. 17 and 18, time charts of many points of the circuit are indicated.

Figure 17:
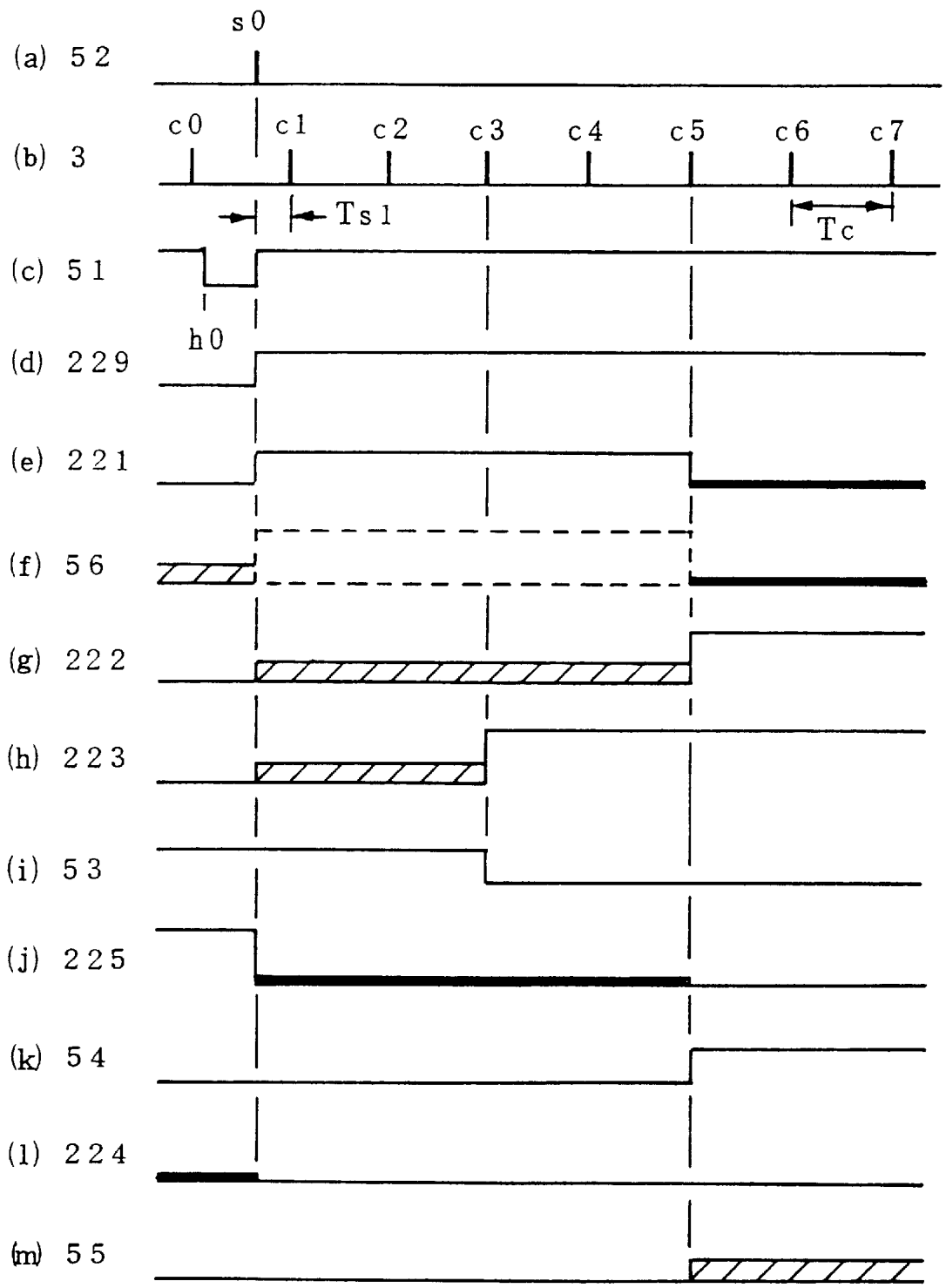
FIG. 17 is a time chart showing operations of the timebase in FIG. 16 according to the present invention.

At the clock timing c0 of the clock 3 in FIG. 17 (b), the acquisition end signal 54 of (k), which is an output of an AND gate 210, is "0", and a signal 221 of (e), which is a Q output of a hold latch 201 of a D flip flop type, is "0", too. In this state, when the synchronizing signal 52 is applied to a clock terminal CK of the hold latch 201 at the synchronizing timing s0, the signal 221 of (e) turns from "0" to "1".

When the signal 221 of (e) turns to "1", a clock enable terminal CE of a time interpolator 203 for measuring a time difference Ts turns from "0" to "1".

A signal 224 of (l) applied at its reset terminal R is "0" before the synchronizing timing s0 as shown by a thick line, which means that a D flip-flop 205 is forced to be reset, described later. Therefore, when the terminal CE turns to "1", the time interpolator 203 starts the operation for measuring the time difference Ts shown by oblique lines of (g). These oblique lines show that the time interpolator 203 is under Ts measuring operation even the Q output 222 of the time interpolator 203 still remains "0".

In the time difference measuring operation, the time difference Ts1, between the synchronizing timing s0 and the clock timing of the clock 3 of (b) just after s0, is measured. When five pulses of clock timing from c1 to c5 of the clock 3 are applied, the operation is ended as shown by oblique lines of (g). Then, the time interpolator 203 turns its Q output 222 of (g) from "0" to "1" showing the end of the Ts measuring operation. The measured time difference Ts1 is delivered to the microprocessor 40 via the data bus 46.

The operation measuring the time difference Ts of the time interpolator 203 is well known as the time to voltage converter. When the signal 221 of (e) turns to "1" at the timing s0, a ramp generation starts. At the clock timing c1 of the clock 3 just after s0, the ramp generation stops and the voltage amplitude generated is kept constant. The constant voltage is converted to a digital signal at the timing of c2 to c5. Thus, the well known operation is executed by the time interpolator 203.

A clock enable terminal CE of a posttrigger counter 204 receives the signal 221. At the timing s0 of the synchronizing signal 52, the signal 221 of (e) turns from "0" to "1". Then, the counter 204 which is preset the posttrigger value Npst by the timing, starts to count down every pulse of the clock 3, as the signal 224 of (l) of its preset terminal PS is "0". The preset posttrigger value Npst (=3) is counted down from three to zero every pulse of the clock 3 during c1 to c3 as shown by oblique lines of (h).

At the clock timing c3, the counted down value arrives at "0" and the signal 223 of (h) being the output Q of the counter 204 turns from "0" to "1". The signal 223 is delivered to an AND gate 210 and an inverter 208.

When the signal 221 of (e) turns from "0" to "1" and is applied to a preset terminal PS of a pretrigger counter 206, the counter 206 turns a signal 225 of (j) of its output terminal Q from "1" to "0" as shown by a thick line. At the same time, the pretrigger counter 206 presets the pretrigger value Npre (=3), which has been delivered by the microprocessor 40 via the data bus 46.

When the signal 225 turns from "1" to "0" at the synchronizing timing s0 and is applied to a clock enable terminal CE of a period counter 207, the period counter 207 stops counting the clock 3 during the time period shown by oblique lines of (f). The value Nc counted at s0 is, thereby, kept.

At the same time, the clock time period value Nc is delivered to the microprocessor 40 via the data bus 46. The delivery is executed during the time period of s0 to c5 shown by the broken lines of (f) synchronizing with the clock 3 of (b).

In the time period shown by the broken lines, the output Q of the period counter 207 is delivered as a flag signal 56.

When the counter 207 counts the clock 3 up to the maximum value during the time period shown by oblique lines of (f), the flag signal 56 turns to "1". When the counter 207 does not count the clock 3 up to its maximum value during the time period, the flag is kept being "0". The performance of the flag signal 56 will be described later.

When the signal 229 of (d) turns from "0" to "1" at the synchronizing timing s0, a time adder 202 immediately turns its output being the hold signal 51 of (c) from "0" to "1". The time adder 202 delivers it to the synchronizing circuit 100. The circuit 100 dose not operate in spite of the trigger 2 applied while the hold signal 51 is at "1".

An inverter 208 inverts the signal 223 and outputs as the store signal 53. When the signal 223 of (h) turns from "0" to "1" at c3, the store signal 53 turns from "1" to "0" and is delivered to the acquisition memory 30. By receiving the signal 53 of "0", the memory 30 stops to store the digital data 20 thereinto.

A signal 54 is an AND output of the signal 222 of (g) and the signal 223 of (h). The signal 223 turns to "1" at the clock timing c3 as described before, but the signal 54 keeps "0" while the signal 222 is "0". At the clock timing c5, the signal 222 turns to "1". Then, the AND gate 210 turns its output from "0" to "1" to delivery the acquisition end signal 54 of (k) to the microprocessor 40 via the data bus 46.

When receiving the acquisition end signal 54 of (k) changed to "1", the microprocessor 40 transmits the waveform data stored in the memory 30 to the waveform memory 50 during c5 to c8 shown by oblique lines of (m).

At the clock timing c5, the acquisition signal 54 of (k) turns from "0" to "1" to be applied to the reset terminals Rs of the hold latch 201 of the D flip flop and the period counter 207.

Then, the signal 221 of (e) and the flag signal 56 of (f) are forced to be "0" shown respectively by thick lines. The clock count value Nc, which is the output of the period counter 207, is reset to "0" also.

At c5, the signal 221 of (e) turns to "0" to be applied to clock enable terminals CE of the time interpolator 203 and the posttrigger counter 204. So, the interpolator 203 and the counter 204 stop their operations remaining as their outputs Qs are at "1 s" even if the clock 3 is applied.

At c5, the signal 221 of (e) turns to "0" to be applied to a preset terminal PS of the pretrigger counter 206, too. The counter 206 is released from the preset state. The input of the clock 3 to the counter 206 is inhibited because its clock enable terminal CE receives the signal 224 of (1) of "0".

At the clock timing c8 of the end of the data transmission shown by oblique lines of (m), the microprocessor 40 delivers and acquisition start signal 55 of (m). The signal 55 shown by an upward arrow is applied to a clock terminal CK of a D flip-flop 205 via the data bus 46. At the same time, the delay time Td is preset from the microprocessor 40 into the time adder 202 via the data bus 46.

Receiving the acquisition start signal 55 of (m) at the clock timing c8, the D flip-flop 205 turns the signal 224 of its output Q from "0" to "1" as its reset terminal R applied with the signal 225 of (j) is "0".

Then a clock enable terminal CE of the pretrigger counter 206 becomes "1", and as the preset terminal PS remains as "0", the counter 206 counts down from the preset pretrigger value Npre(=3) to "0" every input pulse of the clock 3 during the time period c8 to c11 shown by oblique lines of (j). When the counting value reaches "0", the output Q of the counter 206, which is the signal 225, turns from "0" to "1".

At the clock timing c8, the signal 224 of (1) turns to "1". Then, the reset terminal R of the time interpolator 203 and the preset terminal PS of the posttrigger 204 are set to "1". Their outputs Qs are respectively returned from "1" to "0" as shown by the signal 222 of (g) and the signal 223 of (f). At the same time, the posttrigger counter 204 presets the posttrigger value Npst therein. The thick lines of (g) and (h) represent that the time interpolator 203 is reset and the posttrigger counter 204 is preset during c8 to c11.

When the signals 222 of (g) and 223 of (h) turn to "0" at c8 respectively, the store signal 53 of (i), which is the inverted signal of the signal 223 of "h" by the inverter 208, and the acquisition end signal 54 of "k", which is the AND output of the signals 222 and 223 by the AND gate 210, turn to "1" and "0" respectively. The store signal 53 is delivered to the acquisition memory 30. Therefore, the memory 30 starts again to store the digital data 20.

At the clock timing c8, the acquisition end signal 54 of (k) turns to "0". Thereafter, receiving "0" at the reset terminals Rs, the hold latch 201 of the DFF and the period counter 207 are released from the reset states.

When the signal 225 of (j) turns from "0" to "1" at c11, a clock enable terminal CE of the period counter 207 is set to "1". Its reset terminal R has been already set to "0" by the acquisition end signal 54 of (k). Therefore, the period counter 207 starts to count upward every input pulse of the clock 3 during the time period of c11 to c13 shown by oblique lines of (f).

Figure 18:
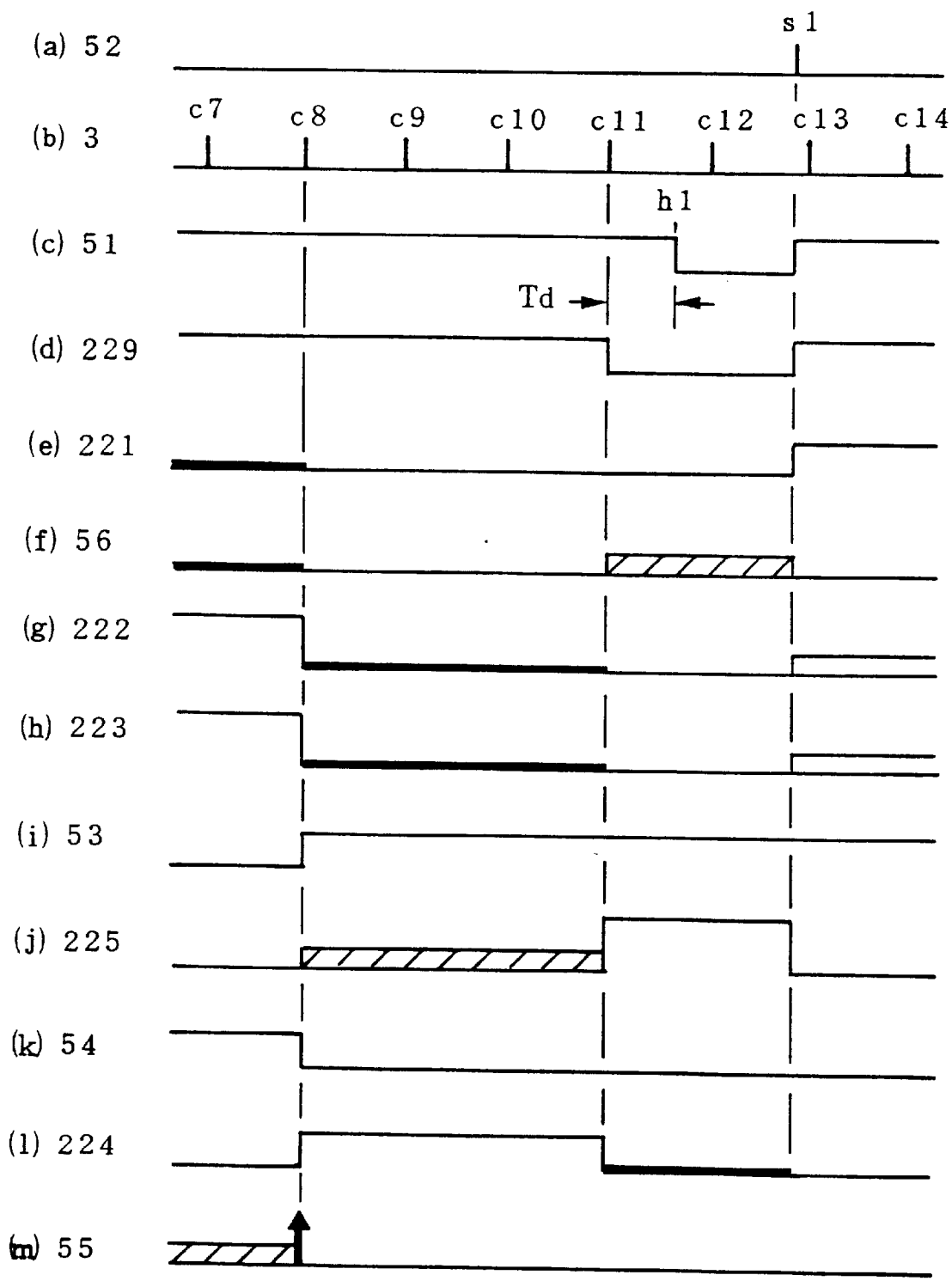
FIG. 18 is a time chart showing operations of the timebase of FIG. 16 in combination with FIG. 17 according to the present invention.

At the clock timing c11, the signal 225 of FIG. 18 (j) turns from "0" to "1", and the signal 229 of (d) turns to "0" to be provided to the time adder 202. The time adder 202 has already received the delay time Td (=Tc−Ts1) from the microprocessor 40 via data bus 46. At the hold timing h1 after Td from c11, the hold signal 51 of (c) returns from "1" to "0". Such a time adder embodiment as the time adder 202 is disclosed in the prior art 6.

At c11, the signal 225 of (j) turns from "0" to "1" and the D flip-flop 205 is reset by receiving "1" on its reset terminal R. Then, its output Q returns to "0" as shown by a thick line of the signal 224 of (1).

The signal 51 is provided to the synchronizing circuit 100. When the hold signal 51 of (c) returns from "1" to "0" at h1, the circuit 100 is, thereby, set in the unhold state. When the trigger 2 is applied just after h1, the circuit 100 operates to generate the synchronizing signal 52 of (a) at a synchronizing timing s1. The trigger 2 causing the circuit 100 to generate the signal 52 at s1 is shown as the reference trigger RT2 of FIG. 15 (b). When receiving the signal 52 of FIG. 18 (a) at s1, the timebase 200 executes repeatedly the same operations as those after the timing s0 of FIG. 17 (a).

The operation sequence has been described above. The microprocessor 40 employs the system clock that is the clock 3 or the MPU clock 45 divided from the clock 3 by a frequency divider 70. Operations are executed by synchronizing with the clock 3, excepting the generation of the hold signal 51 caused by the input of the synchronizing signal 52 and the stoppage of the signal 51. The signal 51, which is called as the holdoff signal, is delayed by the delay time Td(=Tc−Ts1) from a pulse of the clock 3.

The method terminating the holdoff signal delayed by Td is useful for preventing the waveform missing phenomena caused by the holdoff release timing. The methods using the holdoff signal delayed by the delay time Td are disclosed by the prior arts 6 and 7.

The measuring method of the reference trigger time period Trr (or the hold repetition time period) will be described in the following.

The time period of the synchronizing signal 52 or the hold signal 51 is sought on the assumption that the trigger time period Tt is constant and the measuring system time error is zero.

Figure 19:
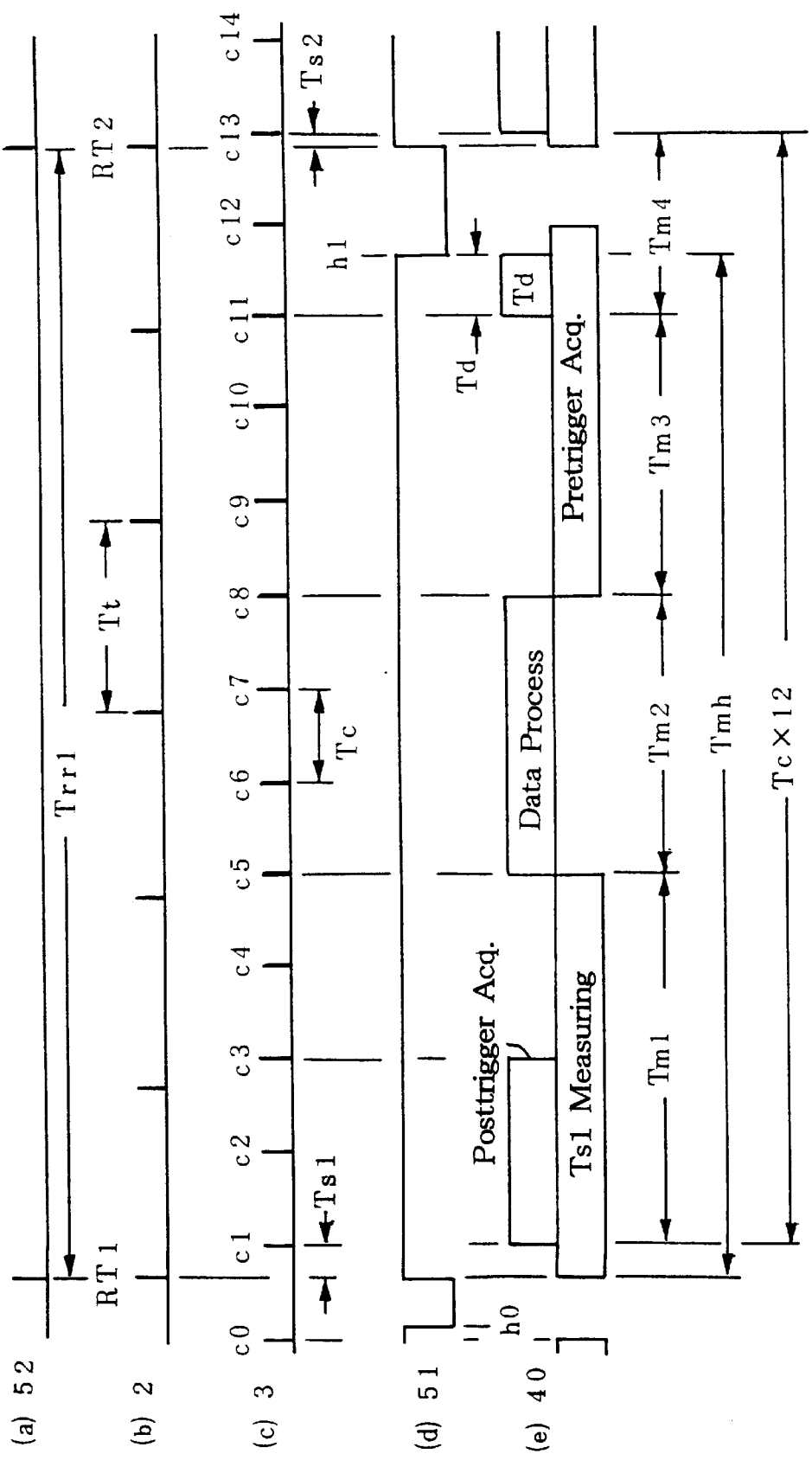
FIG. 19 is a time chart showing a measuring operation of a hold repetition time period according to the present invention.

In FIG. 19, the measuring method of the reference trigger time period Trr (or the hold repetition time period) of the invention is shown. The trigger 2 of (b) and the clock 3 of (c) are used as the timing bases.

The trigger time period Tt of the trigger 2 of (b) is synchronizing with the input signal 1 to be measured (not shown). Tc denotes the cycle time of the clock 3 of (c).

The synchronizing circuit 100 receives the hold signal 51 of (d) and the trigger 2 of (b). The first trigger 2 after the hold signal 51 of (d) turning from "1" to "0" at the hold timing h0 is the reference trigger RT1. When receiving the reference trigger RT1, the circuit 100 generates the synchronizing signal 52 of (a).

When receiving the signal 52, the timebase 200 sets the hold signal 51 from "0" to "1" to deliver it to the circuit 100 and inhibits the trigger 2 input after the reference trigger RT1. The time difference Ts1 between the reference trigger RT1 and the clock timing c1 of the clock 3 of (c) after RT1 is measured. And the operation of counting the clock 3 (from c1 to c3) for the posttrigger data acquisition is executed.

In the time period Tm1 between c1 and c5, the measuring operation of Ts1 and the clock counting operation for the posttrigger data acquisition are completed. The time period Tm1 is a multiple of Tc.

The measuring operation of the time difference Ts1 and the operation for the posttrigger data acquisition are ended at c5. Then the microprocessor 40 processes the measured data of Ts1 and the posttrigger acquired data during the time period Tm2 between c5 and c8. The time period Tm2 is a multiple of Tc. When the data processing are completed at c8, the timebase 200 counts the number of pulses of the clock 3 during the preset pretrigger acquisition time period Tm3 between c8 and c11. The time period Tm3 is a multiple of Tc.

At the hold timing h1 delayed by Td(=Tc−Ts1) from c11, the hold signal 51 of (d) turns from "1" to "0". The next operation counting pulses of the clock 3 starts at c11.

The hold signal 51 is set to "1" again by the reference trigger RT2, which is the first input pulse of the trigger 2 after the hold timing h1. At RT2, the timebase 200 stops counting pulses of the clock 3 to deliver the count value corresponding to Tm4 to the microprocessor 40. The Tm4 is the time period between the clock timing c11 which is the time end of Tm3 and the clock timing c13 of the clock 3 just after the reference trigger RT2.

The process of the pretrigger acquisition is executed during the time periods Tm3 and Tm4-Tc.

The time period between the reference triggers RT1 and RT2 is indicated as the reference trigger time period Trr1. Trr1 is equal to the hold repetition time period, in which the hold signal 51 turns from "0" to "1" at RT1 and turns again from "0" to "1" at RT2. The hold time duration Tmh represents the time period of the hold signal 51 being "1". Tmh is given by $$Tmh=Ts1+Tm1+Tm2+Tm3+(Tc-Ts1)$$

namely $$Tmh=Tm1+Tm2+Tm3+Tc \qquad (5)$$

In the equation (5), each of the time periods Tm1, Tm2 and Tm3 is a constant and also a multiple of the clock cycle time Tc respectively. The hold time duration Tmh is, therefore, a constant and a multiple of Tc.

On the operation principle, the reference trigger repetition time period Trr1 is given by $$Trr1=Tt\text{Ceiling}[Tmh/Tt] \qquad (6)$$

in which Ceiling[x] is the smallest integer greater than or equal to x. The reference trigger time period Trr1 is accordingly constant when the trigger time period Tt is constant.

The reference trigger time period Trr1 is also given with Tm1 to Tm4, and two successive time differences of Ts1 and Ts2 as $$Trr1=Ts1+Tm1+Tm2+Tm3+Tm4-Ts2$$

namely $$Trr1=NmTc-\delta Ts1 \qquad (7)$$

in which $$\delta Ts1=Ts2-Ts1$$

and $$Nm=(Tm1+Tm2+Tm3+Tm4)/Tc$$

δTs1 is the time difference variation of Ts1 and Ts2. The number Nm represents the number of clocks during Trr1.

It is understandable from the equation (7) that the time difference variation δTs1 becomes constant, provided that both of Trr1 and (NmTc) are constant.

Figure 20:
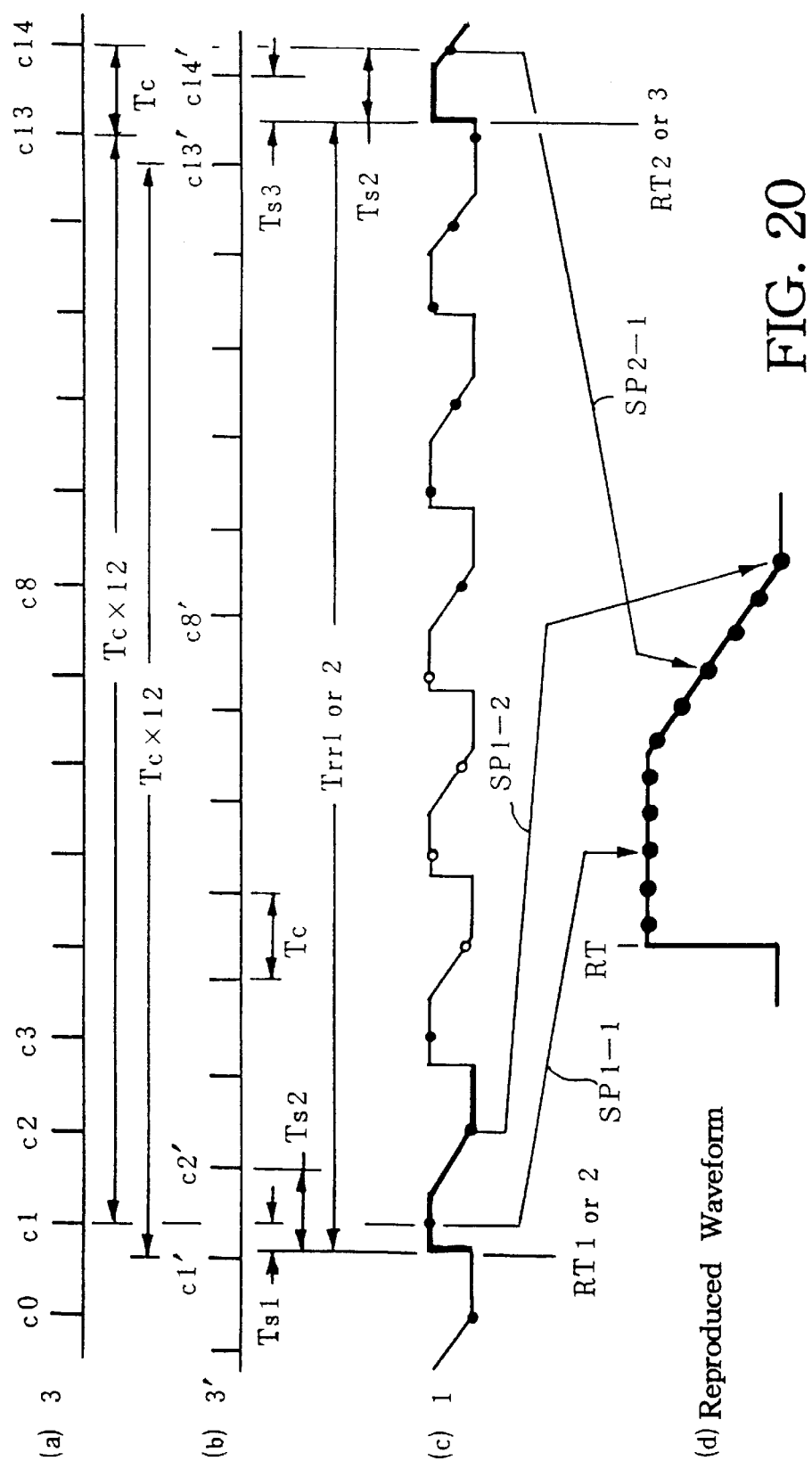
FIG. 20 is a time chart showing an operational principle seeking a clock cycle time of a coherent sampling of FIG. 14 according to the present invention.
Figure 21:
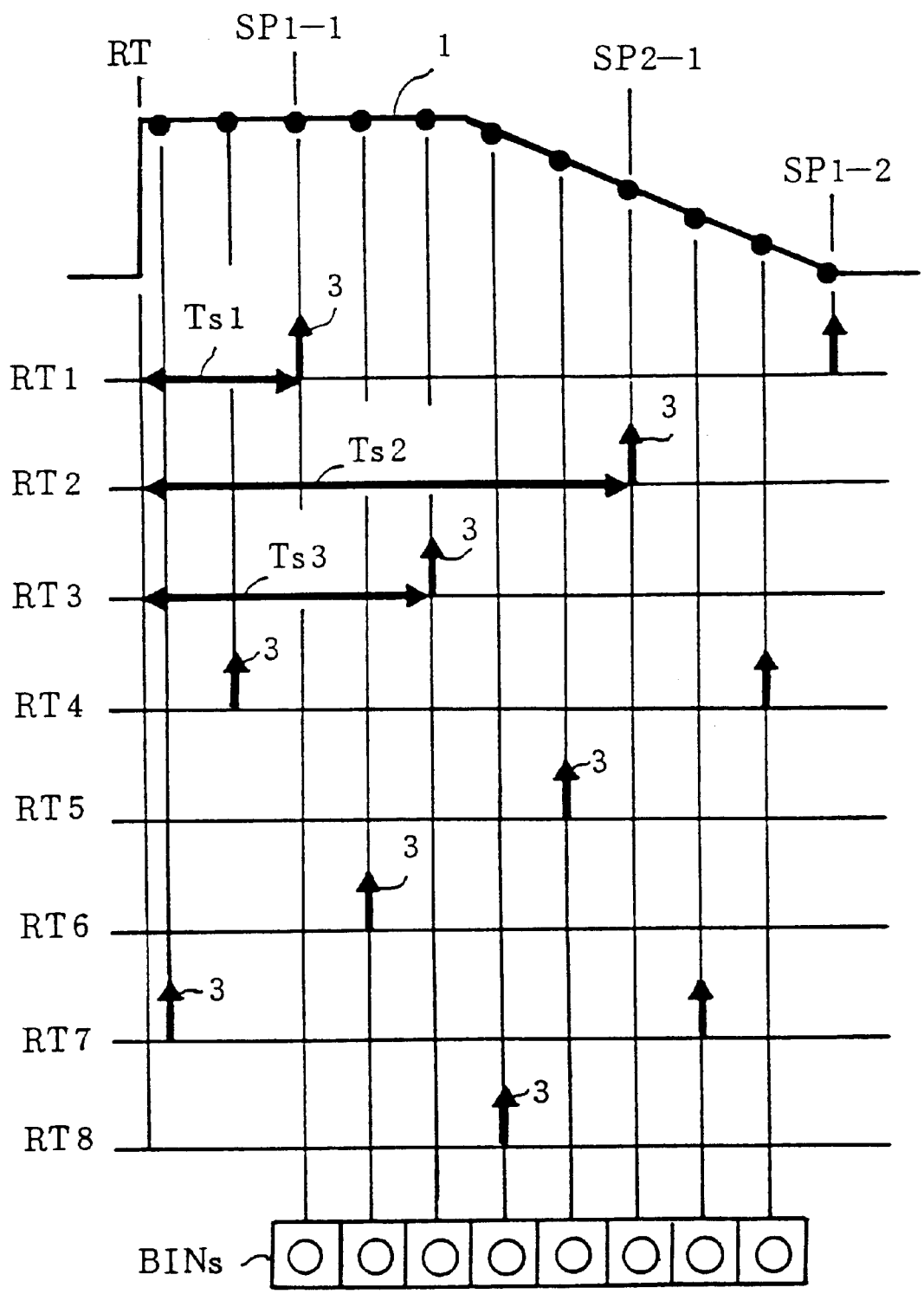
FIG. 21 is a time chart showing an operational principle seeking a clock cycle time of a coherent sampling of FIG. 14 in combination with FIG. 20 in according to the present invention.

In FIGS. 20 and 21, there is shown on operational principle seeking the clock cycle time Tc. FIGS. 20 and 21 correspond respectively with FIGS. 12 and 13.

Figure 12:
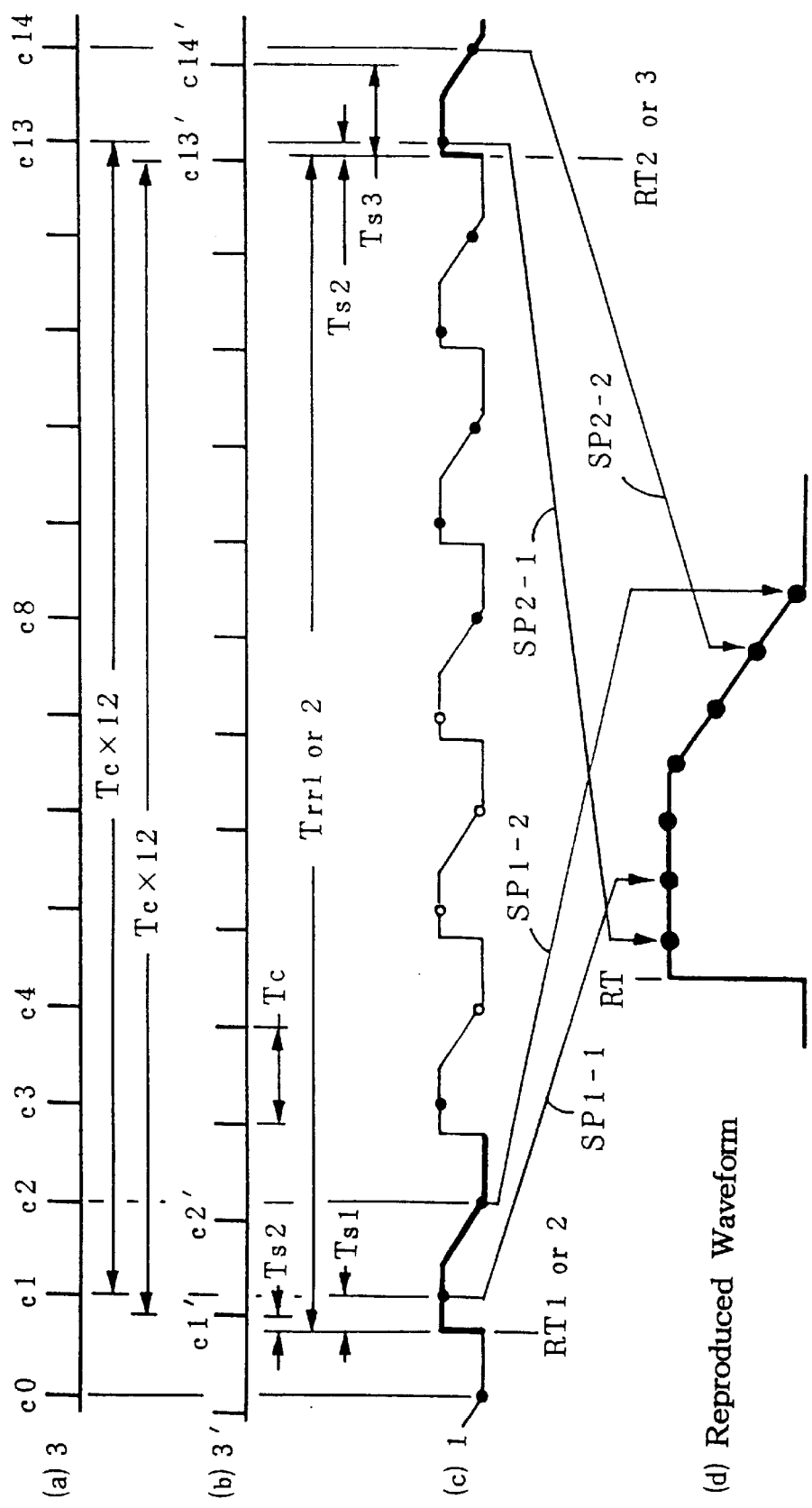
FIG. 12 is a time chart to obtain a waveform reproduced by an equivalent time sampling of the prior art.
Figure 13:
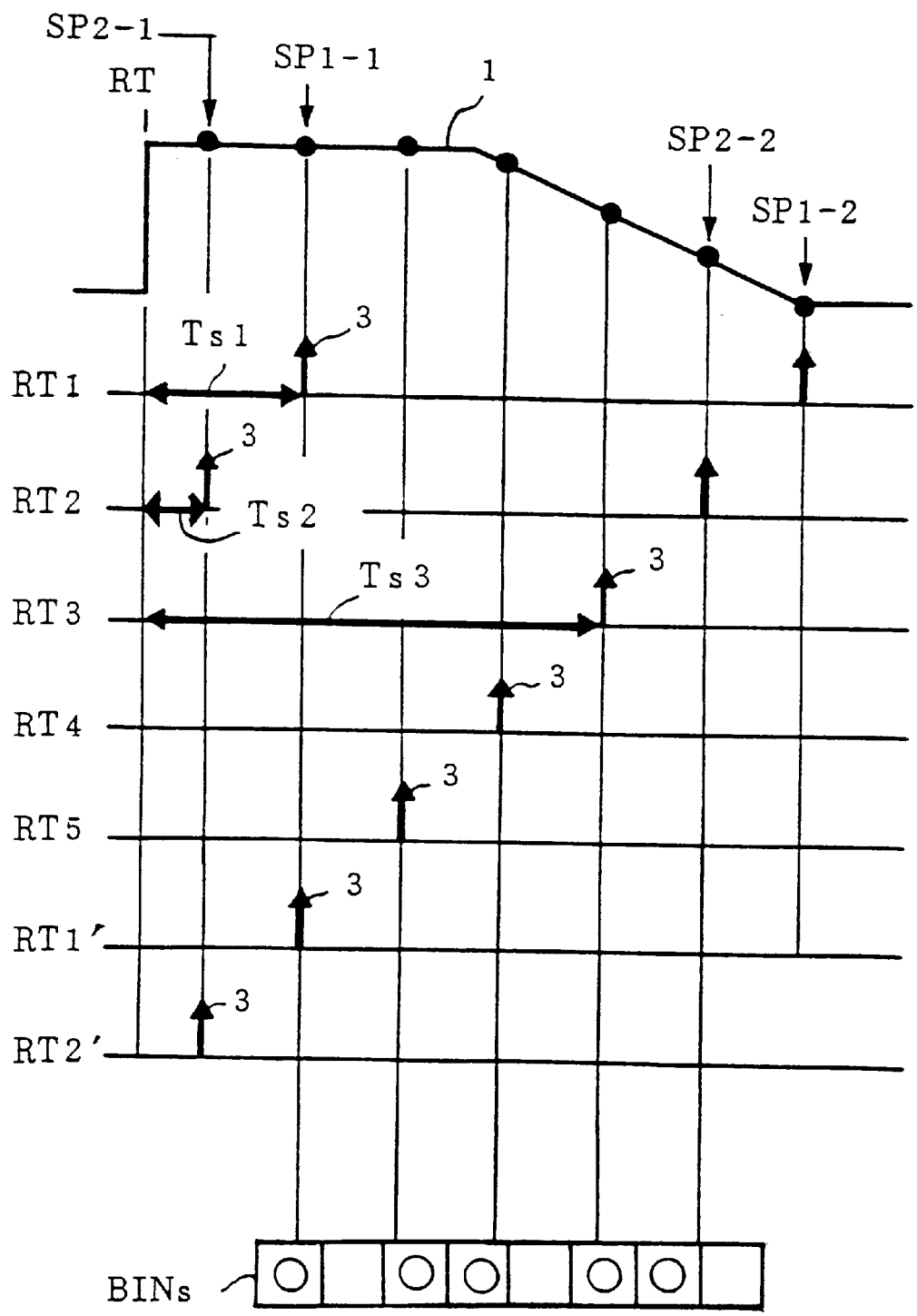
FIG. 13 is a time chart showing waveform missing phenomena of FIG. 12 of the prior art.

The cycle time of the signal 1 of FIG. 20 (c) is equal to that of FIG. 12. The clock cycle time Tc of FIG. 20 (a) and (b) is set by the scale of 0.986 of that of FIG. 12. The clock cycle time Tc scaled down of FIG. 20 are obtained after the seeking clock cycle time operation.

In FIG. 20, there are shown time charts of the equivalent time sampling according to the invention for displaying a reproduced waveform. In (a), the sampling clock 3 is shown. In (b), the sampling clock 3' following the clock 3 of (a) is shown. A signal 1 to be measured is shown in (c). The reference triggers RTs are generated at the rising edges of waveforms displayed with thick lines. The reference triggers RTs are used as synchronizing signal 52 not shown.

The sample point SP1-1 on the signal 1 of (c) is sampled by the clock 3 of (a) at the clock timing c1 just after the reference trigger RT1 of the signal 1 of (c). The data of the sample point SP1-1 is acquired and displayed as one instantaneous value of the reproduced waveform of (d) which is the replica of the signal 1. In like manner, the sample point SP1-2 is sampled at c2. The sampled data is acquired and displayed as (d)

The clock timing c13 of (a) corresponds to c1' of (b). The data of the sample point SP2-1 is sampled by the clock 3 at the clock timing c14 (or c2') just after the reference trigger RT2. The data of the sample point SP2-1 is acquired and displayed as another instantaneous value of the reproduced waveform (replica) of (d). Three data of SP1-1, -2 and SP2-1 are acquired from two waveforms of (c). Nevertheless, the reproduced waveform of (d) is equivalent to data acquired from a single waveform.

The rising edge of the reproduced waveform (replica) of (d) corresponds to the reference trigger RT1 or RT2. Ts1 is the time difference between the reference trigger RT1 and the clock timing c1 just after RT1, and Ts2 is the time difference between RT2 and c14 (or c2') just after RT2.

The reference trigger time period Trr1 between RT1 and RT2 is described by $$Trr1=12Tc+Ts1+Tc-Ts2=12Tc-\delta Ts1+Tc$$

in which $$\delta Ts1=Ts2-Ts1$$

In the same manner, the reference trigger time period Trr2 between RT2 and RT3 is described by $$Trr2=12Tc+Ts2-Ts3=12Tc-\delta Ts2$$

in which $$\delta Ts2=Ts3-Ts2$$

$\delta Ts1$ and $\delta Ts2$ are respectively given by $$\delta Ts1=Ts2-Ts1=(5/8)Tc$$

$$\delta Ts2=Ts3-Ts2=-(3/8)Tc$$

wherein as if $\delta Ts1$ and $\delta Ts2$ are unequal. However, $\delta Ts2+Tc=(5/8)Tc$, then, if $\delta Ts2+Tc$ is anew replaced to $\delta Ts2$, the new $\delta Ts2$ is equal to $\delta Ts1$. This is easily understandable from the fact of Trr1=Trr2 in FIG. 20.

In FIG. 21, there are shown relationships between the reproduced waveform (replica) of FIG. 20 (d) and many time bins which store data of sample points SPs referring the reference trigger RT. The cycle time of the signal 1 and the clock cycle time of the clock 3 are, therefore, set so as to obtain the relation of $$\delta Ts=-(3/8)Tc$$

Upward arrows indicate clock timings cs of the clock 3 (or 3'). Horizontal arrows show time differences Tss. Eight time bins are provided for a clock cycle time Tc. Namely, the time resolution is Tc/8. When all of the eight time bins are occupied with waveform data, no waveform missing phenomena occurs.

With the lapse of time, reference triggers RT1 to RT8 are continuously generated. Reference triggers RT4 to 8 of FIG. 21 are not shown in FIG. 20. They are continuously generated after the RT3.

The eleven black dots on the signal 1 are sampled points representing instantaneous amplitudes of the signal 1. The sampling are executed by the clock 3 generated during a period of about 1.5 Tc after each of the eight reference triggers RTs. The eleven black dots obtained by the equivalent time sampling reproduce the replica as a waveform of the input signal 1.

In FIG. 21, all of eight time bins are occupied with waveform data marked with circles.

Each of time bins does not correspond with a plurality of pulses of the clock 3. There are, namely, no waveform missing phenomena and no duplex acquisitions, different from the case of FIG. 13 causing the missing phenomena and duplex acquisitions. The coherent sampling of the invention is an equivalent time sampling. Therein, the clock cycle time Tc is controlled as shown in FIGS. 20 and 21 so as to obtain the relationship between the clock cycle time Tc and the reference trigger time period Trr which is a multiple of Tt. By eight occurrences of the reference triggers RT1 to RT8, eight time bins corresponding to the clock cycle time Tc are occupied neither more nor less to obtain a waveform of the signal 1.

Under the condition that the time resolution is Tc/8, the coherent samplings can be executed by employing other clocks with different clock cycle times from FIGS. 20 and 21, which make the time difference variations $\delta Tss$ be the following three values.

1. $\delta Ts=-(1/8)Tc$ (being equivalent to $(7/8)Tc$)
2. $\delta Ts=-(5/8)Tc$ (being equivalent to $(3/8)Tc$)
3. $\delta Ts=-(7/8)Tc$ (being equivalent to $(1/8)Tc$)

In each of the coefficients of Tcs of the three cases, the denominator is 8, and the denominator and each of their numerators are relatively prime. In those case, the coherent sampling of the invention can be executed.

In the case 1, in which $\delta Ts=-(1/8)Tc$ or $(7/8)Tc$, eight black points corresponding with eight time bins of FIGS. 20 and 21 are sampled sequentially from right to left.

In the case 3, in which $\delta Ts=-(7/8)Tc$ or $(1/8)Tc$, eight black points are, in like manner, sampled sequentially from left to right in the reverse direction to the case 1.

Examples shown in FIGS. 20 and 21 are generalized as follows. The clock cycle time Tc for the coherent sampling of the invention is given by $$Tc=Trr/(Y+X/M) \qquad (8)$$

in which M is the number of data to be displayed during Tc. Trr is the reference trigger time period, Y is the number of pulses of the clock 3 during Trr, X<M and, X and M are relatively prime. Supposing $M=2^n$, X is an odd number, and there exist $2^{n-1}$ candidates for X. To settle the X, the reference clock cycle time Tcr has to be introduced. The clock cycle time Tc is set as close to Tcr as possible.

Figure 22:
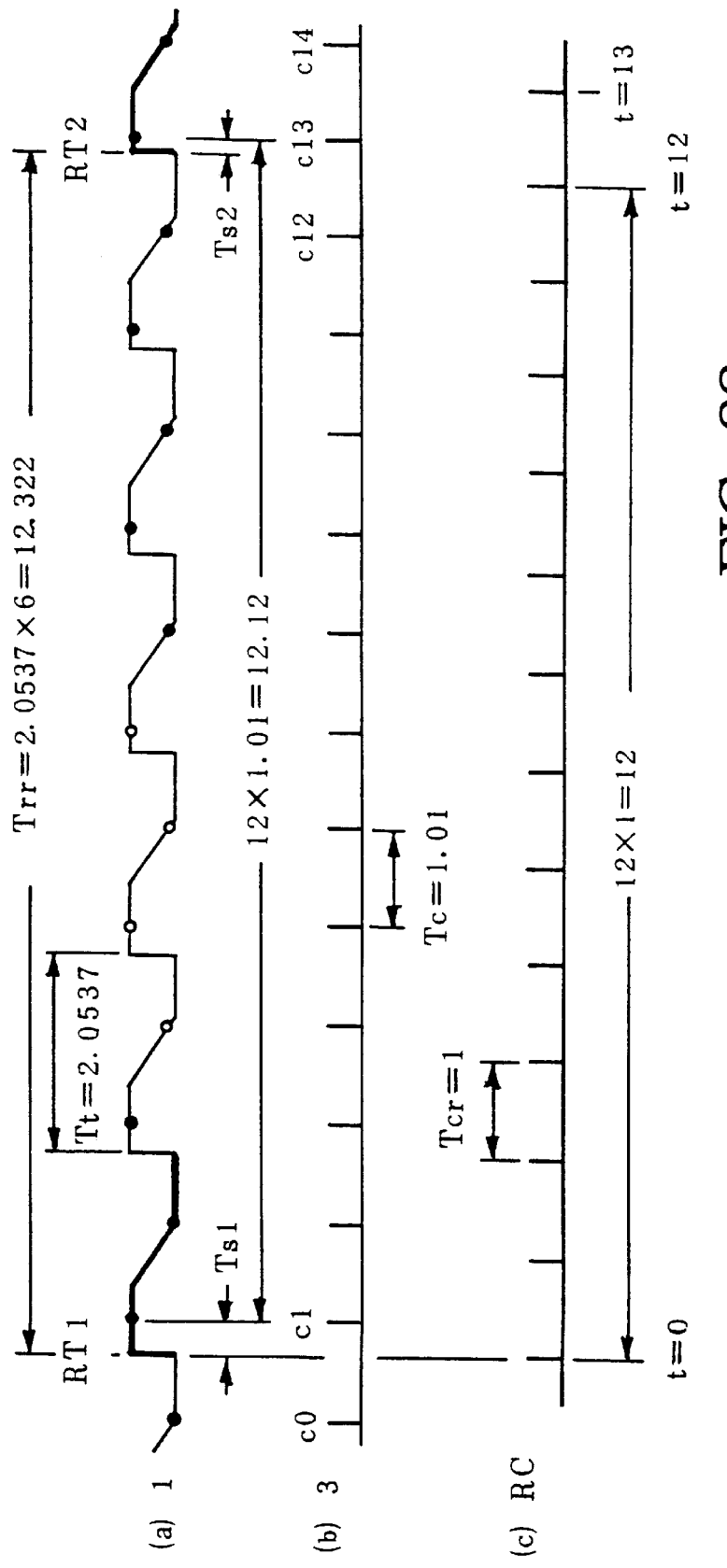
FIG. 22 is a time chart showing an operation for obtaining a suitable clock cycle time of a coherent sampling of FIG. 14 according to the present invention.

In FIG. 22, there are shown processes to set the clock cycle time Tc. The signal 1 of (a) and the clock 3 of (b) are the same as those of FIG. 12. In FIG. 22, the reference clock cycle time Tcr is 1, the trigger time period Tt, which is the cycle time of the signal 1, is 2.0537, and the clock cycle time Tc of the clock 3 is 1.01. It is supposed that the accurate Trr=12.322 is obtained by counting the number of pulses of the clock 3 during Trr and measuring the time difference Ts1 and Ts2.

In FIG. 22, there are six cycles of the signal 1 between RT1 and RT2, so that reference trigger time period Trr is six times Tt, namely, Trr=12.322. The reference trigger time period Trr is measured by using the clock 3 of (b). Next, the reference clock RC of (c) is introduced. The reference clock RC is a virtual clock with normalized time period Tcr of 1 and is generated at RT1 (t=0) and thereafter.

The number Y of pulses of the reference clock RC during the reference trigger time period Trr from RT1 to RT2 is given by $Y=\text{Floor}[Trr/Tcr]=\text{Floor}[12.322/1]=12$ in which Floor[x] is the greatest integer less than or equal to x.

In general, the number Y of the equation (8) is expressed by using suffix n attached to Trr as $$Y=\text{Floor}[Trrn/Tcr] \qquad (9)$$

Figure 23:
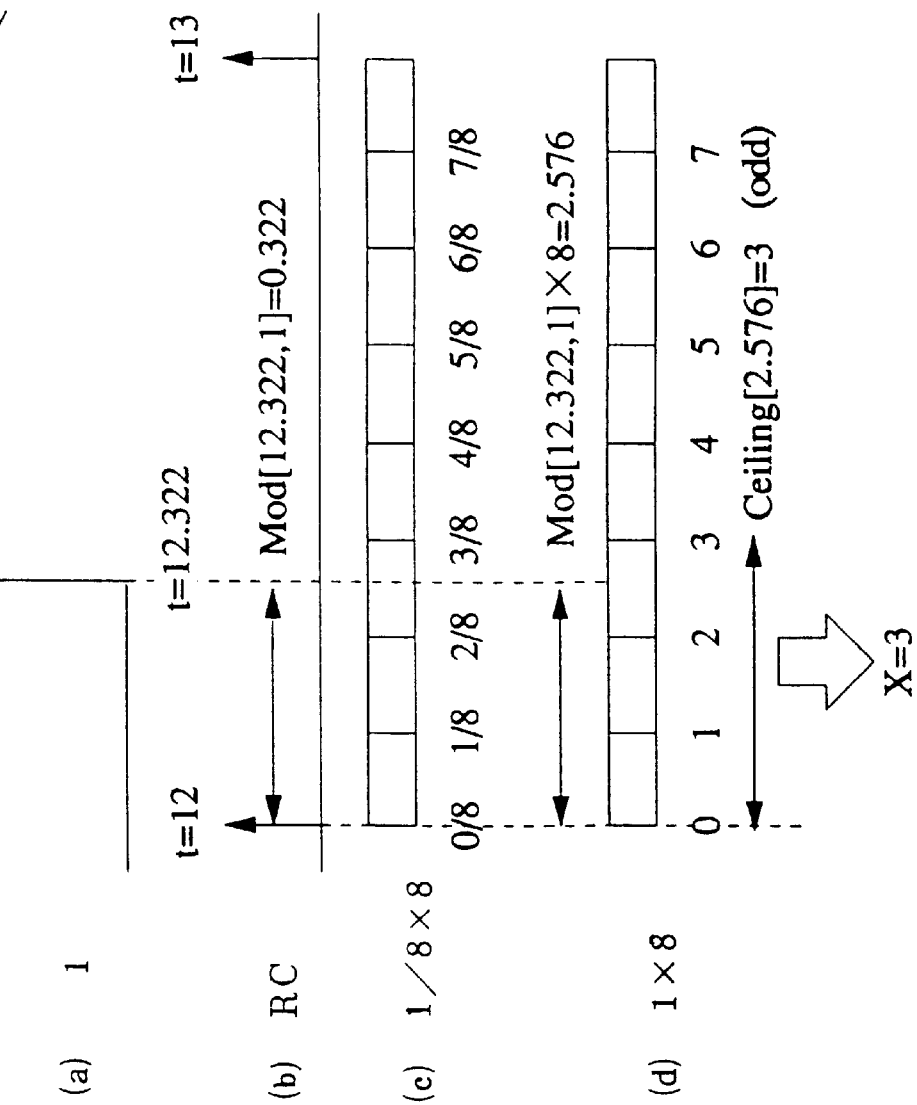
FIG. 23 is a time chart showing an aspect for storing waveform data into eight time bins in combination with FIG. 22 according to the present invention.

In FIG. 23, there are shown figures by the expanded time scale at and around t=12 to 13 in FIG. 22.

The signal 1 of FIG. 23 (a) is that of FIG. 22 (a) at and around t12 to 13. The reference clock RC of FIG. 23 (b) is that of FIG. 22 (c) at and around t12 to 13. In FIG. 23 (c), there are eight time bins of (⅛)Tcr. The reference clock cycle time Tcr(=1) of the reference clock RC is divided into eight time bins widths. In FIG. 23 (d), there are shown other eight bins having a value of eight times (⅛)8 of (c).

The reference clock RC occurs at the same time t=0 as the reference trigger RT1. If RT2 occurred at the borderline of the time bins of "u/8" in FIG. 23 (c), in which u were an odd (uneven) number, the time difference δTs(=Tsn−Ts(n-1)) would be given by "u/8". By using this reference clock RC, the coherent sampling of the signal 1 would be executed. However, the reference trigger RT occurs at t=12.322, thereby δTs is 0.322(=Mod[12.322, 1]) for Tcr=1, namely, δTs u/8 in FIG. 23.

In this case, the coherent sampling is not executable. Therein, Mod[m, n] is the remainder on m/n.

When the timing t=12.322 can be coincident with the border of time bins of "u/8" of (c) by the clock cycle time of the clock 3 changed a little bit from Tcr=1, the coherent sampling is executable. It is obvious in FIG. 23 that the coincidental border of (c) closest to 0.322 is ⅜. Therefore, if the borderline is shifted a little bit to the left, namely, if the clock cycle time of the clock 3 becomes shorter than Tcr=1, the optimum clock cycle time is obtained and the coherent sampling is executed.

In FIG. 23(d), there shows how to obtain the optimum clock cycle time. δTs, which is 0.322(=Mod[12.322, 1]), is increased by eight times to get 8δTs=2.576. Then 8δTs is converted to Ceiling [8δTs] to get the odd (uneven) number nearest to 8δTs, which is 3 (=X) in this case.

The odd number X=3 and the number Y given by the equation (9) are substituted to the equation (8) to obtain the optimum clock cycle time Tc as follows.

$Tc=12.322/(12+⅜)=0.995717$

By using the optimum Tc, the coherent sampling of the invention is realized. There is neither waveform missing phenomena nor doubling acquisitions. Therefore, the eight time bins of FIG. 21 can be optimumly occupied with the waveform data.

Figure 24:
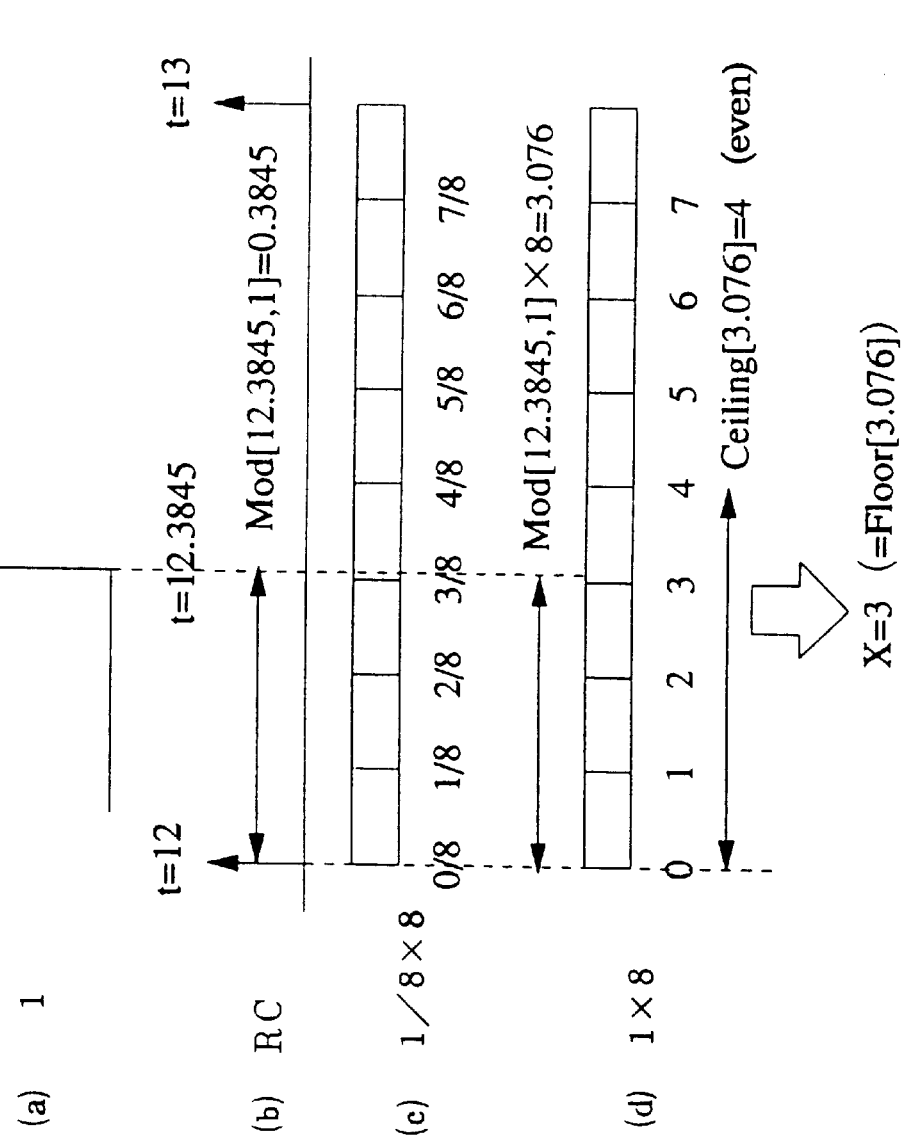
FIG. 24 is a time chart showing an aspect for storing waveform data into eight time bins in case of different timing relation between a clock and an input signal from that of FIG. 23 according to the present invention.

In FIG. 24, there is shown another example that the new trigger time period Tt, which is equal to the cycle time of the signal 1, is 2.0642 and the optimum clock cycle time becomes longer than Tcr=1. The signal 1 of FIG. 24 (a) is that of FIG. 22 (a) at and around t12 to 13. The reference clock RC of FIG. 24 (b) is that of FIG. 22 (c) at and around t12 to 13. In FIG. 24 (c), there are eight time bins of (⅛)Tcr. The reference clock cycle time Tcr(=1) of the reference clock RC is divided into eight time bins. In FIG. 24 (d), there are shown other eight bins having a value of eight times (⅛)8 of (c).

The timing t of the reference trigger RT2 is 6Tt=12.3845. Therefore, δTs=0.3845(=Mod[12.3845, 1] and 8δTs=3.076 are yielded. Provided that the timing t=12.3845 is coincident with the borderline of the time bin of "⅜" (X=3) in FIG. 24 (c), the coherent sampling of the signal 1 is executed. In this case, if the borderline of "⅜" is shifted a little bit to the right, namely, if the clock cycle time of the clock 3 becomes longer than Tcr=1, the optimum clock cycle time is obtained and the coherent sampling is executed. The optimum clock cycle time is given by the equation (8) as follows.

$Tc=12.3845/(12+⅜)=1.00076768$

It depends on Ceiling[8δTs] that Tc to be searched becomes longer or shorter than Tcr=1. Hereafter the following relation is used.

$\text{Ceiling}[M\delta Ts]=\text{Ceiling}[Mod[Trr, 1]M]$ in which M is the number of time bins.

In the example of FIG. 23 using Tt=2.0537 of FIG. 22, odd number 3 is obtained as X.

$\text{Ceiling}[Mod[12.322, 1]8]=3$

As 3 and 8 are relatively prime, these numbers satisfy the equation (8).

On the other hand, in the example of FIG. 24 using Tt=2.0641, Ceiling function gives even number 4 as follows.

$\text{Ceiling}[Mod[12.3845, 1]8]=4$

As 4 and 8 are not relatively prime, these numbers do not satisfy the equation (6). In this case, as the odd number X, $\text{Floor}[Mod[12.3845, 1]8]=3$ is used as shown in FIG. 24 (d).

The processes to obtain the odd number X are generalized as the following equations.

If Ceiling [A] is an odd (uneven) number, then $$X=\text{Ceiling}[A] \qquad (10)$$

in which $A=Mod[Trrn, Tcr](M/Tcr)$

If Ceiling[A] is an even number, then $$X=\text{Floor}[A] \qquad (11)$$

By the equation (7), where the suffix n=1, the reference trigger time period Trrn is obtained. And by the equations (9), (10) and/or (11), X and Y are derived. The optimum clock cycle time Tc can be calculated from the equation (8) by substituting Trr, X and Y. The coherent sampling can be executed by using the optimum Tc.

As has been described hereinbefore, the time difference between accumulated Tcr and the accumulated optimum clock cycle time during the reference trigger time period Trr is within Tcr/M. Therefore, δTc, which is the difference between Tcr and the optimum clock cycle time, satisfies the following formula.

$\delta Tc=Tcr-Tc$ and $\delta Tc \leq (Tcr/M)/Trr < (1/M)(Tcr/Tmh)$ in which Tmh is the hold time duration as shown in the equation (5) or FIG. 19.

Assuming that M=1024 and Tmh/Tcr=10, it is understandable that the range of the deviation of Tc is 0.0001 or less.

Figure 25:
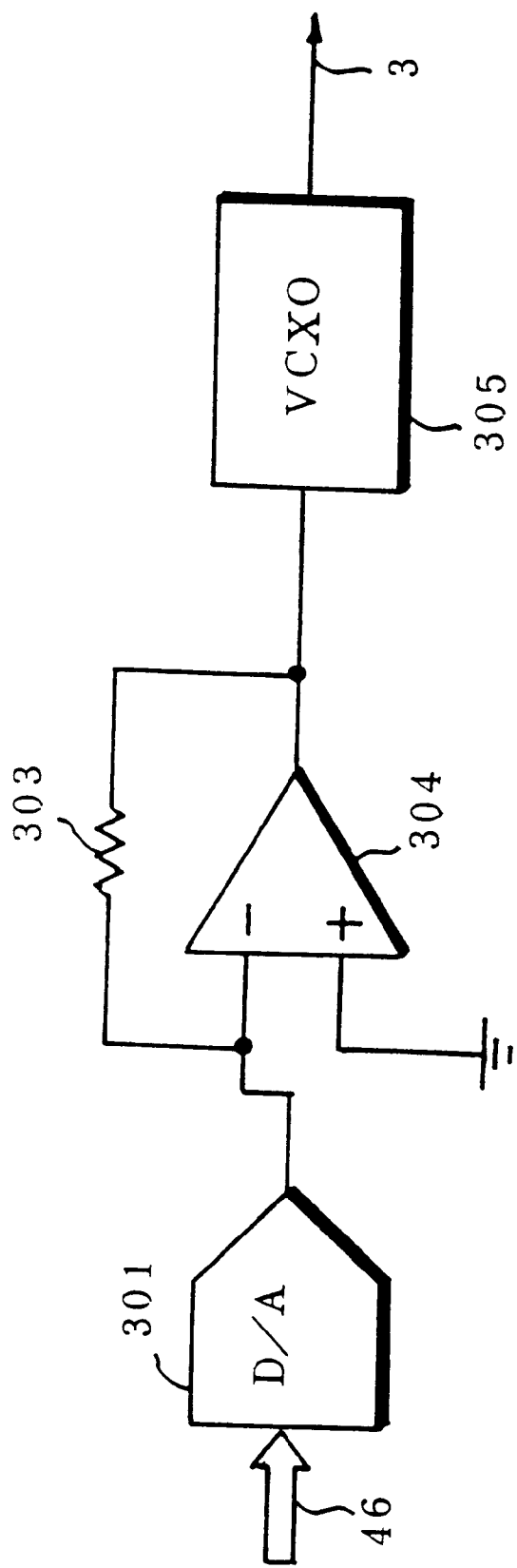
FIG. 25 is a circuit diagram showing an embodiment of a clock generator which is an element in FIG. 14 according to the present invention.
Figure 26:
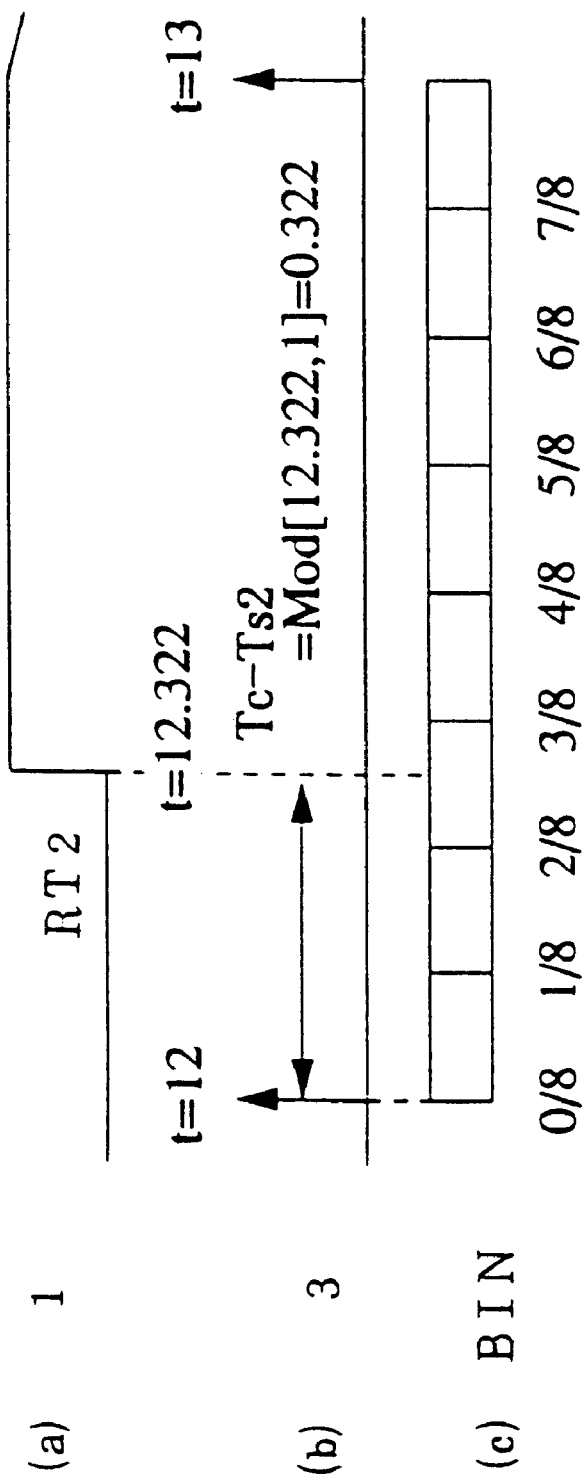
FIG. 26 is a time chart showing a principle to obtain a fine time resolution in FIG. 14 according to the present invention.

In FIG. 25, there is shown a circuit diagram of the clock generator 300 to generate the clock 3 of the optimum clock cycle time Tc by changing its cycle time. A D/A converter 301 receives data to set a new clock cycle time Tc from the microprocessor 40 via the data bus 46. When receiving the new data, the D/A converter 301 varies the output current in accordance with the new data.

The current variations are converted to voltage variations with an operational amplifier 304 and a resistor 303. The voltage variations are applied to a voltage controlled crystal oscillator (VCXO) 305. The VCXO 305 includes a varactor which capacitance changes in accordance with the voltage variations. The output frequency of the VCXO 305 is changed to obtain the clock 3 of the optimum clock cycle time Tc.

For the VCXO 305 of the output frequency of 10 to 100 MHz, for example, Model-7130A is usable and for 600 MHz band, Model-7164A is usable. Both models are made by NIPPON DENPA KOGYO of Japan, and their output frequencies can be varied by ±0.0001 or more per the voltage variations of ±2.5 V.

The time resolution of the invention will be described. The operation has been described by using FIGS. 22 to 24 on the assumed premise that the reference trigger time period Trr is measured without error. If the time resolution of the time difference Ts is infinitely small, the assumed premise can be satisfied. The measurable time resolution of the time difference Ts is not, however, infinitely small. In the digital data acquisition, the time scale has generally a time resolution of Tc/M. The measured reference trigger time period Trr has, thereby, the maximum quantizing error of Tc/M.

The odd number X satisfying the equation (8) causes no waveform missing phenomena. However, even integers (X−1) and (X+1) cause the waveform missing phenomena. In the case of X=8 or X=32, $$Tc=10(1+8/M) \text{ or } Tc=10(1+32/M)$$

has been shown in FIGS. 7 to 10. The even number X causes the waveform missing phenomena. For setting X to nearby an odd number, the time error ETrr of the measured Trr has to be satisfied by $$ETrr \ll Tc/M$$

It is well known as a method to get the satisfied measuring resolution of Trr that the mean Trr measured plural (m) times has a high accuracy of $m^{1/2}$ times. It is, however, difficult to execute the method. Because, the higher the target resolution is, the longer the time for measuring is. The method of the invention to effectively obtain high resolution of Trr will be described. In the method of the invention, Trrs are measured successively m times to obtain the reduced error by 1/m.

Let's suppose that the trigger time period Tt, which is the cycle time of the signal 1, is 2.0537, the clock cycle time Tc of the clock 3 is 1 and the time resolution Tres is ⅛ (M=8).

In FIGS. 26 to 29, the method to effectively obtain high resolution is shown. Those FIGS. 26 to 29 correspond to FIGS. 23 and 24. In each of FIGS. 26 (a) to 29 (a), the waveform of the signal 1 of FIG. 22 (a) is shown by the expanded time scale at and around t=12 to 13. In each of FIGS. 26 (b) to 29 (b), the clock 3 is shown. In each of FIGS. 26 (c) to 29 (c), there are eight time bins of (⅛)Tc. The time resolution is ⅛.

By the equation (7), $$Trrn=NTc-((Tsn+1)-Tsn)$$

is given. The quantizing error happens when the time difference Tsn is measured. It is assumed hereafter that measured time differences are not Tsns but (Tc−Tsn)s for a simple explanation. The reference trigger RT2 of FIG. 26 occurs at t=12.322. The time resolution Tres is ⅛. The time difference $$Tsc=(Tc-Ts2)=⅔$$

is measured. The true time difference Tsc is the time period between RT2 and t=12 and is larger than ⅔. The reference trigger RT1 occurred at t=0, so that the time difference Ts1 was zero. Then, Trr1=12+⅔ is obtained. As the true Trr is 12.322, the error of Trr is given by ⅔−0.322=−0.072

Figure 27:
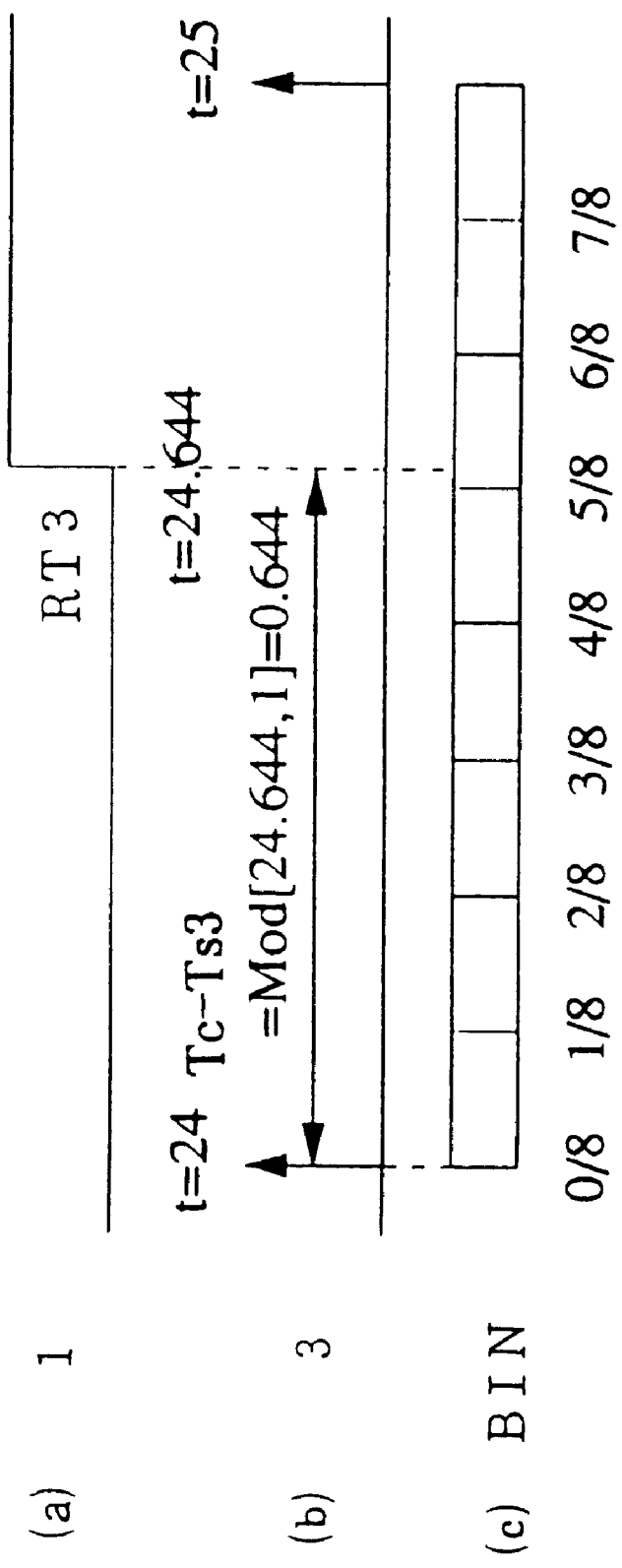
FIG. 27 is a time chart showing a principle in case of different timing relation between a clock and an input signal from that of FIG. 26 according to the present invention.

In FIG. 27, the reference trigger RT3 occurs at t=24.644 between the timings of t=24 and t=25 of the clock 3. In spite of the true time difference Tsc=Tc−Ts3=0.644, the measured Tsc is ⅝, so that $$Trr2=12+(⅝-0.644)-(⅔-0.322)$$

is obtained. The error of Trr2 is given by ⅝−⅔−0.322=0.053

Figure 28:
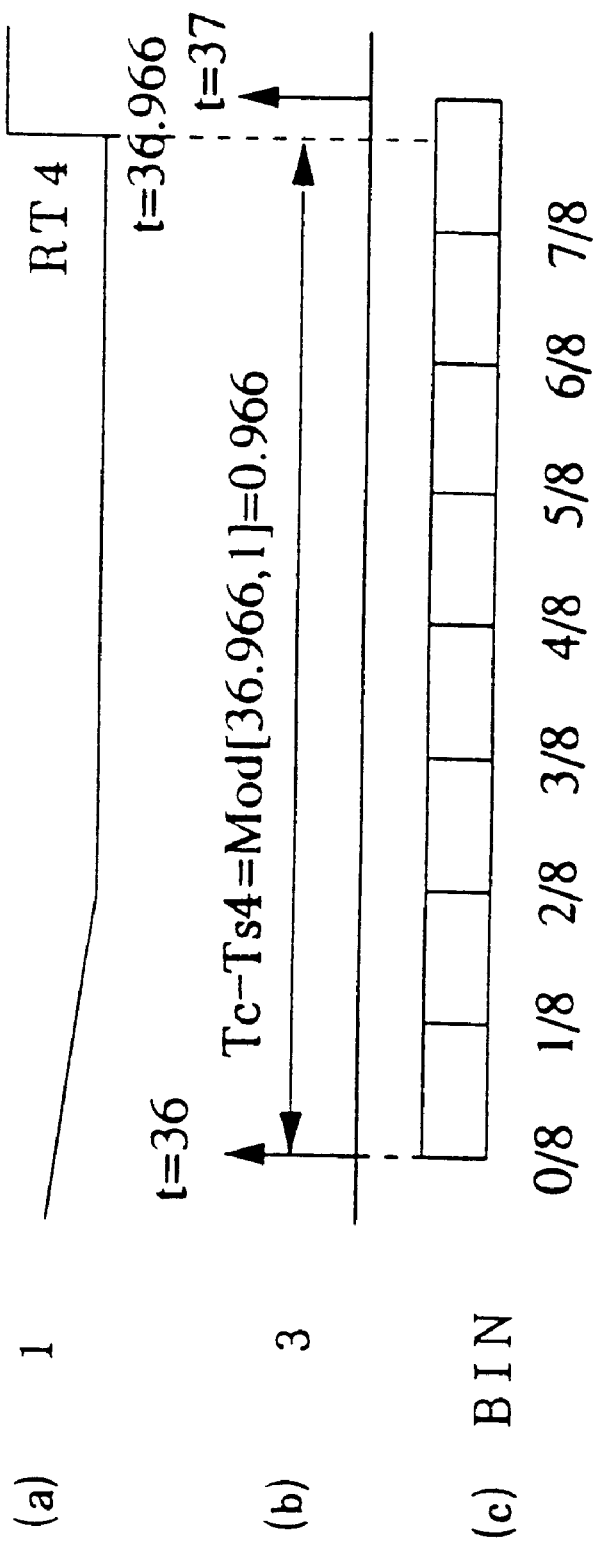
FIG. 28 is a time chart showing a principle in case of different timing relation between a clock and an input signal from those of FIGS. 26 and 27 according to the present invention.
Figure 29:
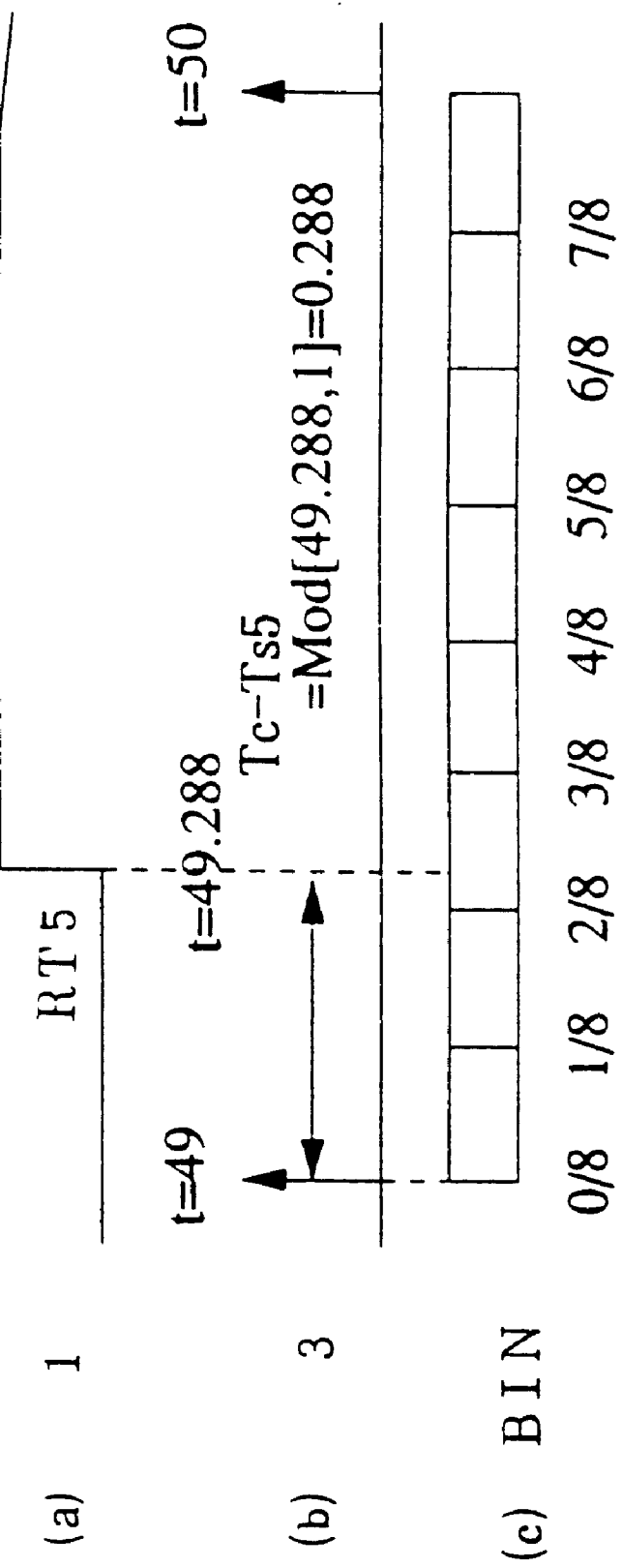
FIG. 29 is a time chart showing a principle in case of different timing relation between a clock and an input signal from those of FIGS. 26, 27 and 28 according to the present invention.

In FIGS. 28 and 29, the reference triggers RT4 and RT5 occur respectively at the timings t=36.966 and t=49.288 of the clock 3. The error of Trr3 of FIG. 28 is given by $$(⅞-0.966)-(⅝-0.644)=-0.072$$

The error of Trr4 of FIG. 29 is given by $$(⅔-0.288)-(⅞-0.966)=0.053$$

Figure 30:
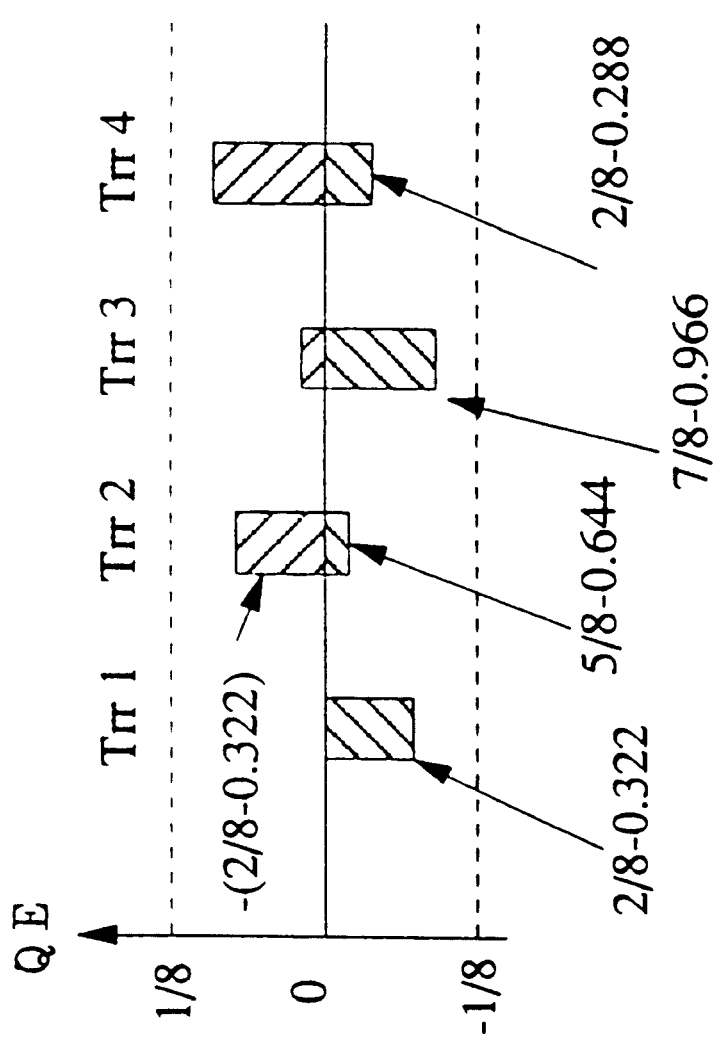
FIG. 30 is a time chart showing an aspect to occur quantizing errors in FIGS. 26 to 29.

In FIG. 30, there are shown the errors of Trr1 to Trr4 of FIGS. 26 to 29. The negative error of Trr1 is a quantizing error QE in the measuring of Ts2. The negative error of Trr2 is a quantizing error QE in the measuring of Ts3. The negative quantizing error QE of Trr1, which occurs in the measuring of Ts2, is reversed from negative to positive in order to obtain the reversed error of Ts2. In Trr2 calculating process, the reversed positive error of Ts2 is added up to the negative error of Trr2 and a difference of the positive and negative errors is obtained as the quantizing error QE of Trr2. In like manner, the quantizing errors QEs of Trr3 and Trr4 are obtained.

Figure 31:
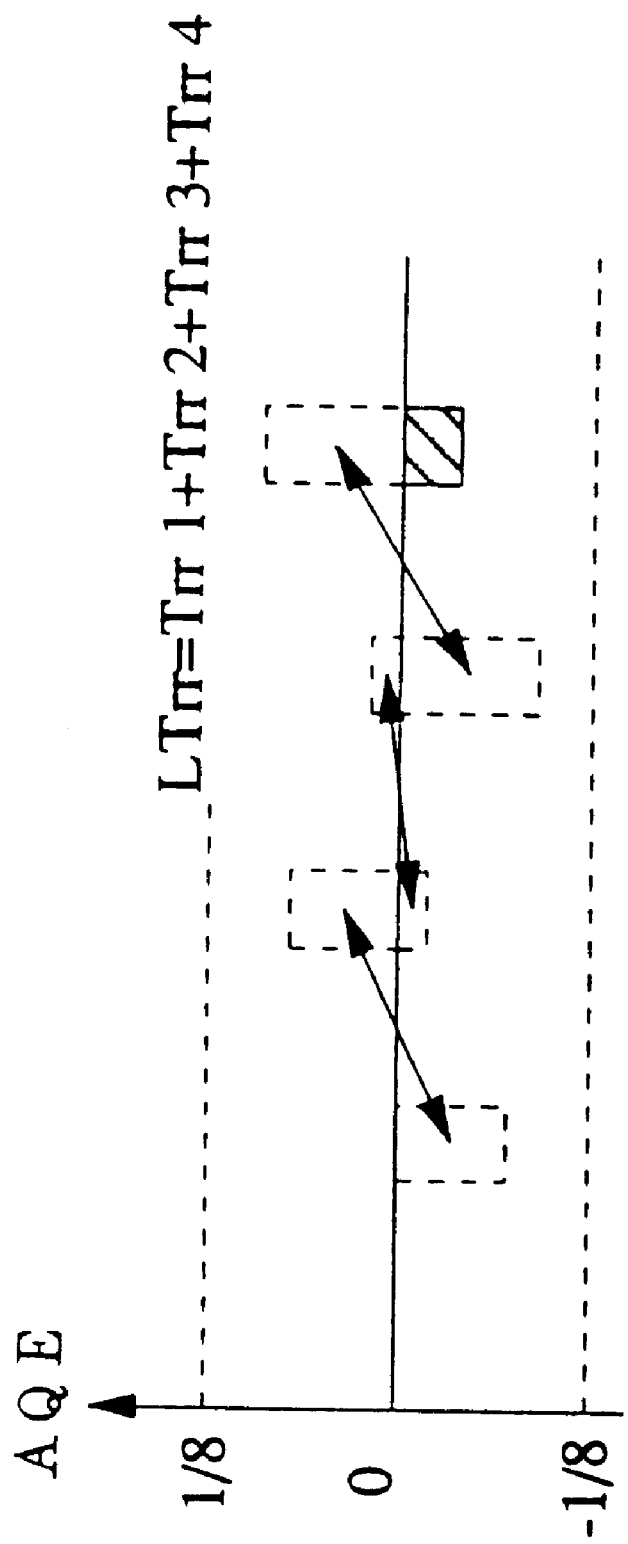
FIG. 31 is a time chart showing an aspect to cancel each other of quantizing errors in FIG. 30 according to the present invention.

In FIG. 31, there is shown the accumulated quantizing error AQE which is the accumulation of the quantizing error of Trr1 to Trr4. The negative errors of Trr1 to Trr3 and the positive errors of Trr2 to Trr4 cancel out each other and the quantizing error (⅔−0.288) is remained as AQE of LTrr in which the error occurred in measuring Ts5. The reference trigger time period Trr is obtained by $$Trr=LTrr/m=12.322+(⅔-0.288)/m$$

in which m=4 is the number of measuring times of FIGS. 30 and 31. The quantizing error QE is finally reduced to ¼.

The coherent sampling is executed by using the clock cycle time Tc=Trrn/(Y+X/M). If the clock cycle time Tc=Trrn/(Y+X/M'), in which M'<M, is used, M' time bins are occupied with M' data. (M−M') time bins can not, however, be occupied with data to be vacant in spite of the continuation of the sampling. The occurrences of the waveform missing phenomena are unavoidable.

The nearest M' to M is M−1, and the following relation is derived.

$$Abs[(1/M)-(1/(M-1))]=1/(M(M-1))>1/M^2$$

Wherein Abs[x] is the absolute value of x. This means that if the setting error of Tc is smaller than $1/M^2$, no waveform missing phenomena happens. Lets' assume that m=M in which m is the number of measuring times and M is the number of time bins. The accumulated quantizing error is given by multiplying (1/M) by (1/M). The first (1/M) is the accuracy of Trr is a measuring cycle of Trr. The second (1/M) is the reduction of the quantizing error by the accumulation of Trrs. The accumulated quantizing error is finally shown by $1/M^2$. Accordingly, $m \geq M$ is required.

It has been assumed in the above-description that the trigger time period Tt, which is the cycle time of the signal 1, is constant. It is, however, obvious from the above that the measurement of the time difference Tsn is on the basis of the trigger 2 picked off from the signal 1.

Accordingly, even if the trigger time period Tt picked off from the signal 1 fluctuates, the reference trigger time period Trr or the accumulated reference trigger time period LTrr can be measured by the time resolution of Tc/M. When the trigger time period Tt is drifting, the measured LTrr is usable as m times of the mean Trr, which is the mean value of m reference trigger time periods.

By using the accumulated reference trigger time period LTrr, which is m times accumulation of successive reference trigger time periods Trrs, equations (8) to (11) are respectively modified as follows.

$$Tc = (LTrr/m)/(Y + X/M) \qquad (8')$$

$$Y = \text{Floor}[(LTrr/m)/Tcr] \qquad (9')$$

When Ceiling [A'] is an odd (uneven) number, $$X = \text{Ceiling }[A'] \qquad (10')$$

in which $$A' = \text{Mod }[LTrr/m, Tcr](M/Tcr)$$

When Ceiling [A'] is an even number, $$X = \text{Floor}[(A')] \qquad (11')$$

In the time chart of FIG. 15, the following operations of the microprocessor 40 have been described.

1. Transmission of data
2. Measurement and Accumulation of the reference trigger time periods Trrs
3. Judgment of the clock cycle time Tc to be changed or not
4. Generation of the acquisition start signal 55 and Calculation of the delay time Td(=Tc−Tsn)

The microprocessor 40 judges whether the clock cycle time Tc of the clock 3 satisfies the requirements of the coherent sampling on the basis of the accumulated reference trigger time period LTrr or not. When not, the microprocessor 40 searches the new Tc, which satisfies the requirements of the coherent sampling, and sets the new Tc.

In FIGS. 32 to 39, there is shown a series of time charts of the processes setting Tc capable of the coherent sampling. Therefore, the accumulation times of Trrs to obtain the LTrr are set 4 (m=4).

In FIGS. 32 to 39, (a) shows the trigger 2, (b) the synchronizing signal 52 synchronizing with the trigger 2, (c) the operation time periods of the pretrigger (PreTrg) corresponding to the period of (TM3+Td) in FIG. 19, (d) the operation time periods of the posttrigger (PstTrg), (e) the timings to get LTrrs and values of LTrrs, (f) the timings of data transmission (DTR), (g) the timings to get Trr by calculation and addition, (h) the timings to set Tc (TcSet), and (i) and (j) the timings of Flag 1 and 2 used in the microprocessor 40.

The Flag 1 of (i) shows that the clock cycle time Tc has been set before the occurrence of the acquisition start signal 55. The Flag 2 of (j) shows that the microprocessor 40 has received the flag 56 from the timebase 200 via the data bus 46. Upward arrows of (f), (g) and (h) indicate the timings of the acquisition start signal 55.

Figure 11:
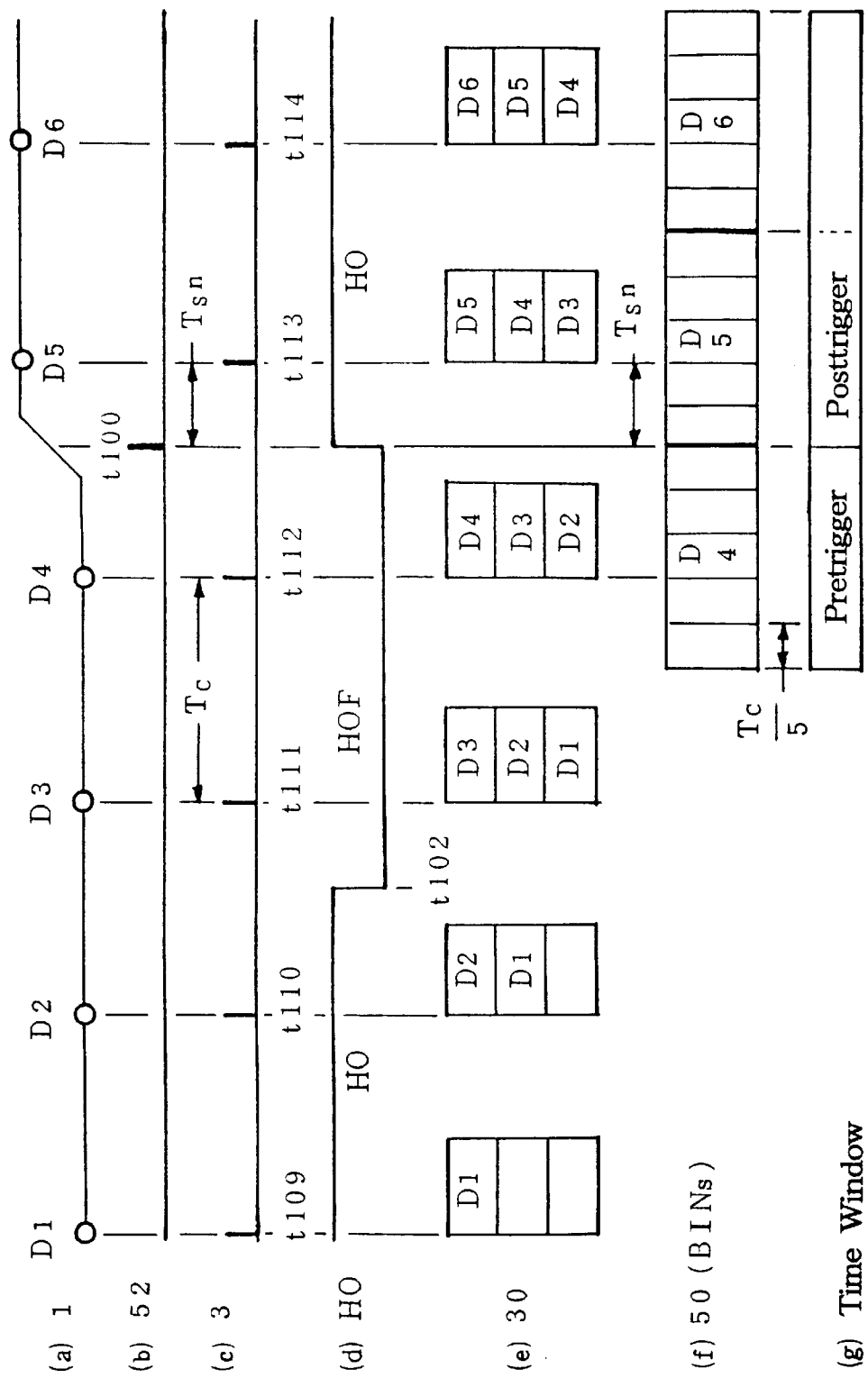
FIG. 11 is a time chart showing a pretrigger and a posttrigger acquisition processes in an equivalent time sampling of the prior art.

Starting the data acquisition process, the microprocessor 40 sets the clock cycle time Tc0 of (h) as the initial cycle time of the clock 3. The microprocessor 40 calculates the pretrigger value (Npre) and the posttrigger value (Npst) corresponding with Tc0 according to both of the data acquisition time window and the time position to be displayed of the input timing of the trigger 2. Then the microprocessor 40 presets Npre to the pretrigger counter 206 and Npst to the posttrigger counter 204. The calculation method of Npre and Mpst has been shown in FIG. 11.

At the beginning of the operation, each of two internal memories MLTrr−a and MLTrr−b (not shown) for storing Trrs and two internal memories MTs−a and MTs−b (not shown) for storing Tss is preset to "0" in the microprocessor 40. Each of presetting operations is finished by the timing t1 of FIG. 32. The clock 3 has to become stable by t1.

The microprocessor 40 generates the acquisition start signal 55 at t1 as shown by the upward arrow of (h) and sets Flag 1 to "1". The Flag 1 set to "1" shows that the clock cycle time Tc has been set before the occurrence of the acquisition start signal 55.

The operation of the data acquisition is continued during the time periods shown by horizontal arrows of (c), At the end of the operation of the data acquisition, the hold signal 51 (not shown) is turned to "0" to become the unhold state. The PreTrg period Tpre1 from t1 to the time just before t2 shown by the horizontal arrow of (c) is numerically expressed with the preset pretrigger value Npre and the data DMTs (=0) of the internal memory MTs−a as follows.

$$Tpre1 = Tc0Npre + Tc0 - DMTs$$

After the PreTrg period Tpre1, the synchronizing signal 52 of (b) occurs at t2 of the first input of the trigger 2 of which time period is Tt1.

The data acquisition and the time difference measurement of Ts1−1 are executed during the PstTrg period form t2 to t3 as shown by the horizontal arrow of (d). The Ts1−1 is the time difference (not shown) between t2 and the first input of the clock 3 after t2. The first posttrigger PstTrg period Tpst1 of t2 to t3 depends on the preset posttrigger value Npst and Ts1−1. When the period of the data acquisition is longer than Ts1−1, the first PstTrg period Tpst1 is given by $$Tpst1 = NpstTc0 + (Ts1-1)$$

When the period of the data acquisition is shorter than Ts1−1, PstTrg period Tpst1 is given by $$Tpst1 = NpstTc0 + (Ts1-1)$$

in which Ns(=5) is the time difference measuring clocks number shown in FIG. 15.

The PstTrg period Tpst1 is finished at t3 of (d). The microprocessor 40 transmits the data and the data's timing information to the waveform memory 50 of FIG. 14 during the time period of the data transmission DTR of t3 to t4 of (f). The transmitted data has been acquired during the time period between the start of PreTrg and the end of PstTrg (t1 and t3). At the same time, the data (Ts1−0=0) of the time difference Ts, which is stored in the internal memory MTs−a, is moved to the internal memory Mts−b. The measured data of Ts1−1 is stored in the memory MTs−a. The second PreTrg started from t4 of (c) is, therefore, finished according to Ts1−1.

The data transmission DTR of (f) is finished at t4. The microprocessor 40 generates the second acquisition start signal 55 as shown by the upward arrow at t4 of (f). Then the operation of the data acquisition is executed again during the time period shown by the horizontal arrows from t4. The microprocessor 40 calculates the reference trigger time period Trr1–0. In the equation (7), $$Trr1-0 = NmTc0 - \delta Ts1$$

in which $$Nm = Npre + Npst + Nd + Nc$$

$$\delta Ts1 = (Ts1-1) - Ts1-0$$

The pretrigger value Npre and the posttrigger value Npst are preset and known values. The data transmission clock's number Nd is known, too. The clock time period value Nc is the number of occurrence of the clock 3 during the time period between the end of PreTrg and the start of PstTrg at t2. Nc is measured by the period counter 207 of FIG. 16. The time difference Ts1–0 is stored in the internal memory MTs–b of which initial data value is zero and Ts1–1 is stored in Mts–a.

The calculation of Trr1–0 finishes at t5. The microprocessor 40 checks Flag 1 of (i). When Flag 1=1, Trr1–0 =0 is added on the data stored in the internal memory MLTrr–a. When Flag 1=0, the calculated value of Trr1–0 is added on the data stored in MLTrr–a. As Flag 1=1 at t5, Trr1-0=0 is added on the data value 0 stored in MLTrr–a to obtain the accumulated reference trigger time period LTrr1–0=0. Then Flag 1 is reset to 0 and the adding number is set to 0. The operation to calculate LTrr1–0 must be finished before t6. The next data transmission DTR of (f) starts at t6.

The operation of the data acquisition between t1 and t3, and the operation of the data transmission between t3 and t4 are repeated between t4 and t7. At t7, the microprocessor 40 calculates Trr1–1 as follows.

$$Trr1-1 = (Nm1)Tc0 - \delta Ts2$$

in which $$Nm1 = Npre + Npst + Nd + Nc \text{ and}$$

$$\delta Ts2 = (Ts1-2) - (Ts1-1)$$

As Flag 1=0 at t7 of (i), Trr1 is added on the data value in the internal memory MLTrr–a to produce the accumulated reference trigger time period LTrr1–1. The adding number is increased from 0 to 1.

The operations of the data acquisition and of the data transmission are repeated between t7 and t8. At t8 the microprocessor 40 calculates Trr1–2 as follows.

$$Trr1-2 = (Nm2)Tc0 - \delta Ts3$$

in which $$Nm2 = Npre + Npst + Nd + Nc \text{ and}$$

$$\delta Ts3 = (Ts1-3) - (Ts1-2)$$

As Flag 1=0 at t8 of (i), Trr1–2 is added on the data value in the internal memory MLTrr–a to produce the accumulated reference trigger time period LTrr1–2 as follows.

$$Ltrr1-2 = (Trr1-1) + (Trr1-2)$$

The adding number is increased from 1 to 2.

Figure 33:
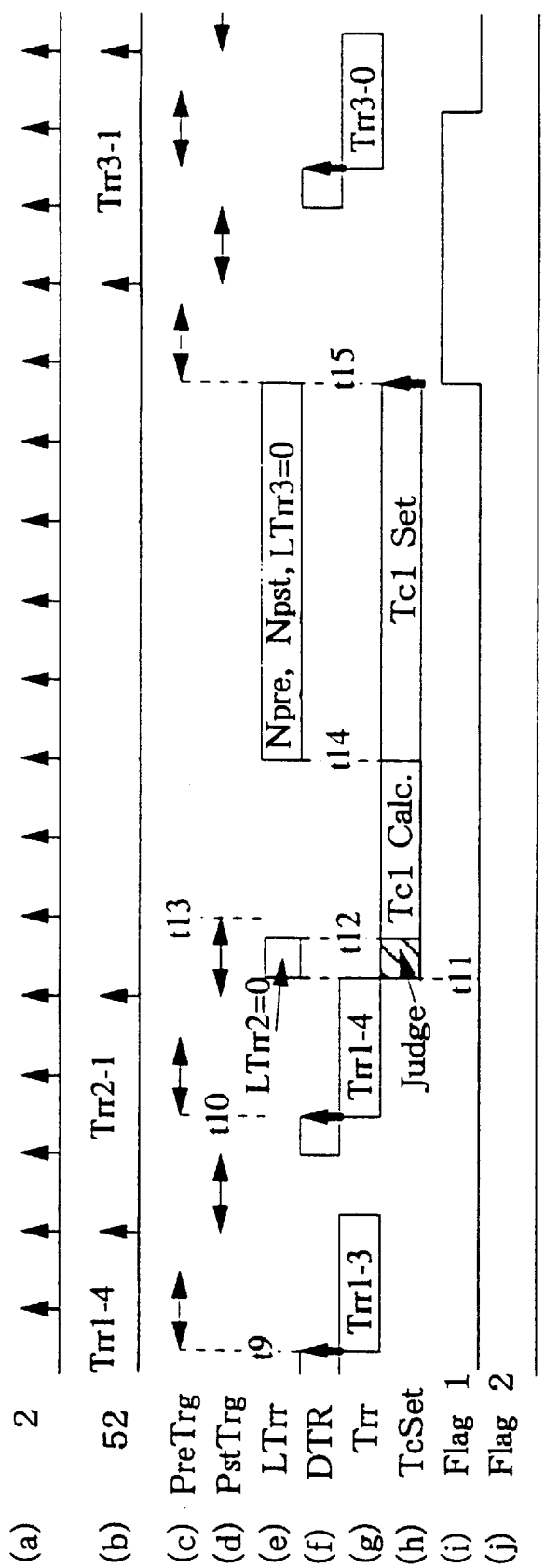
FIG. 33 is a time chart showing an example of a process seeking a clock cycle time of FIG. 14 in combination with FIG. 32 according to the present invention.

In like manner, during the time periods of t8 to t9 and t9 to t10 of FIG. 33, the adding numbers are respectively increased from 2 to 3 and from 3 to 4. The accumulated reference trigger time periods LTrr1–3 and LTrr1–4 are respectively given by $$LTrr1-3 = (Trr1-1) + (Trr1-2) + (Trr1-3) \text{ and}$$

$$LTrr1-4 = (Trr1+1) + (Trr1-2) + (Trr1-3) + (Trr1-4)$$

The addition of Trr1–4 to MLTrr–a is finished at t11. As the adding number is 4, the microprocessor 40 judges that the clock cycle time Tc0 of the clock 3 is to be changed or not. Then, the accumulated reference trigger time period difference δ LTrr is calculated as follows.

$$\delta LTrr1 = (DMLTrr-a) - (DMLTrr-b)$$

in which DMLTrr–a is the data value in the memory MLTrr–a, and DMLTrr–a is that in MLTrr–b. At t11, $$DMLTrr-a = (Trr1-1) + (Trr1-2) + (Trr1-3) + (Trr1-4) \text{ and}$$

$$DMLTrr-b = 0$$

Therefore, $$\delta LTrr1 = (Trr1-1) + (Trr1-2) + (Trr1-3)(Trr1-4)$$

is obtained. When δ LTrr is smaller than, for example, Tc0/4, the operation of the data acquisition continues. When δ LTrr is not smaller than Tc0/4, the microprocessor 40 judges that Tc0 is to be changed during t11 to t12 shown by oblique lines of FIG. 33 (h).

In this case δ LTrr is obviously larger than Tc0/4, the microprocessor 40 judges that the clock cycle time Tc0 is to be changed. The data of the internal memory MLtrr–a is moved to MLTrr–b, so that MLTrr–a is reset to 0 (LTrr2=0) and the adding number is reset to 0, too. The microprocessor 40 calculates the optimum Tc1, by which the coherent sampling is executed, from the data value in MLTrr–b during the time period of t12 to t14 shown as "Tc1 Calc.".

The data, which are acquired during the time period of PreTrg and PstTrg between t10 and t13 shown by horizontal arrows of FIG. 33 (c) and (d), are transmittable while the microprocessor 40 is calculating the clock cycle time Tc1 from t12 to t14. If the operation speed of the microprocessor 40 is not sufficient to judge that the clock cycle time Tc0 is to be changed or not during t11 to t12, the execution time period of the data acquisition is extendible to t14 to acquire more data. As Flag 1 is 0 and the adding number is 0 (LTrr2=0) at t13, the timing t13 corresponds to t6 of FIG. 32.

The calculation of the new clock cycle time Tc1 to be set is finished at t14. The microprocessor 40 provides the new value for Tc1 generation to the clock generator 300 and starts to count for the predetermined time period of t14 to t15 to set the stable Tc1 of the clock 3. The new pretrigger value Npre and the post-trigger value Npst corresponding with the new Tc1 value are produced to be respectively preset to the pretrigger counter 206 and the posttrigger counter 204 of FIG. 16. The internal memory MLTrr–a and the adding number are reset to 0s (LTrr3=0).

During the time period of the Tc1 setting time of t14 to t15, the hold signal 51 remains "1", because the acquisition start signal 55 is not provided. So, the synchronizing signal 52 of (b) is not generatable. When the Tc1 setting time period finishes at t15, the microprocessor 40 provides the acquisition start signal 55 to restart the new data acquisition operation by using the renewed Tc1 of the clock 3.

Figure 34:
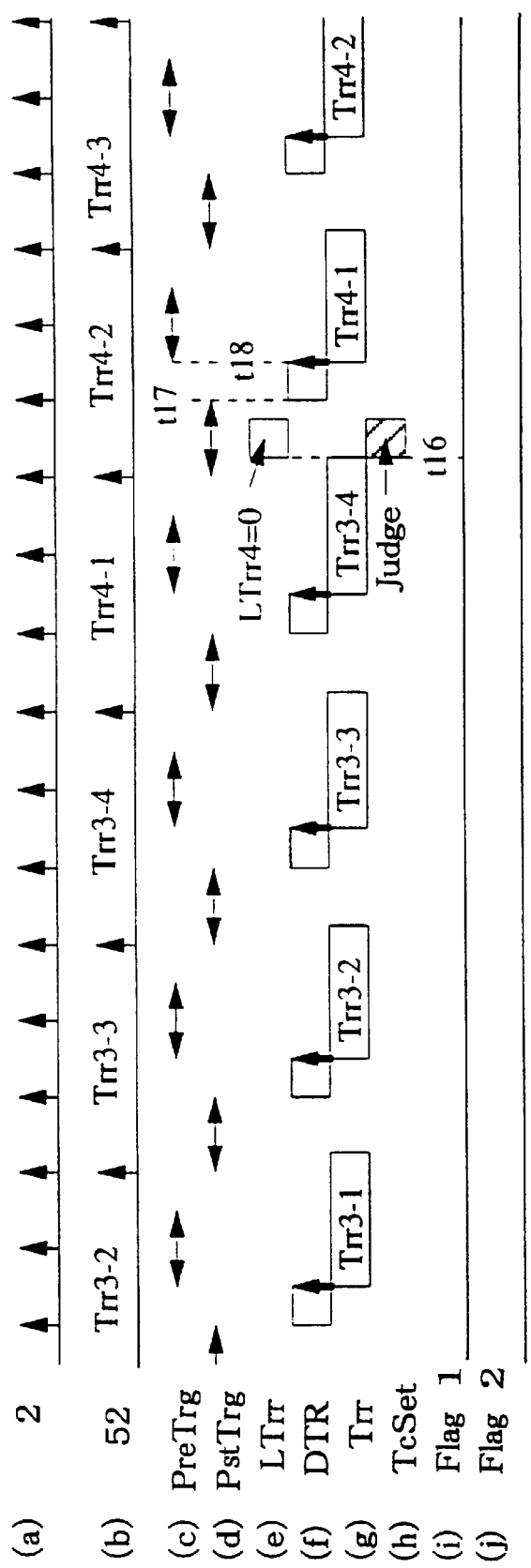
FIG. 34 is a time chart showing an example of a process seeking a clock cycle time of FIG. 14 in combination with FIGS. 32 and 33 according to the present invention.

In like manner, the above-mentioned operation from t1 to t10 are repeated from t15 to t16 of FIG. 34. The internal memory MLTrr-a stores the accumulated reference trigger time period LTrr3-4 and the adding number becomes 4. The internal memory MLTrr-b stores LTrr1-4. The accumulated reference trigger time periods LTrr3-4 and LTrr1-4 are respectively given by $$LTrr3-4=(Trr3-1)+(Trr3-2)+(Trr3-3)+(Trr3-4) \text{ and}$$

$$LTrr1-4=(Trr1-1)+(Trr1-2)+(Trr1-3)+(Trr1-4)$$

The addition of Trr3-4 to MLTrr-a is finished at t16 of FIG. 34. As the adding number 4, the microprocessor 40 judges again that the clock cycle time Tc1 of the clock 3 is to be changed or not and sets the renewed Tc1 if needed as shown by oblique lines of (h).

At first, the accumulated reference trigger time period difference $\delta$ LTrr3 is calculated as follows.

$\delta$ LTrr3=(DMLTrr-a)-(DMLTrr-b) in which DMLTrr-a is data value in the internal memory MLTrr-a, and DMLTrr-b is that in MLTrr-b.

DMLTrr-a and DMLTrr-b are respectively given by $$DMLTrr-a=(Trr3-1)+(Trr3-2)+(Trr3-3)+(Trr3-4) \text{ and}$$

$$DMLTrr-b=(Trr1-1)+(Trr1-2)+(Trr1-3)+(Trr1-4)$$

Next, $\delta$ LTrr3 is calculated. As the trigger time period Tt1 of the trigger 2 of FIG. 34 (a) is still constant at t16, $$DMLTrr-a=DMLTrr-b$$

$\delta$ LTrr3=0$\leq$Tc0/4 are obtained. The clock cycle time Tc1 is approximately equal to Tc0, however, not completely equal to Tc0. In order to obtain the severe judgment, it is required to evaluate the value of $$\text{Round } [\delta LTrr/(Tc0/4)](Tc0/4)$$

in which Round [x] shows the integer closet to x.

As $\delta$ LTrr$\leq$Tc0/4 is confirmed, it is judged at t16 that the data acquisition operation is to be continued. The data DMLTrr-a of the internal memory MLTrr-a is moved to MLTrr-b, so that MLTRR-a is reset to 0 (LTrr4=0) and the adding number is reset to 0, too. The new data of MLTrr-b is shown by $$DMLTrr-b=(Trr3-1)+(Trr3-2)+(Trr3-3)+(Trr3-4)$$

After the judgment at t16, the microprocessor 40 starts the operation of the data transmission DTR of (f) and t17 when PstTrg of (d) is finished. The data transmission DTR is finished at t18. The microprocessor 40 calculates Trr4-1 of (g) as follows.

$$Trr4-1=(Nm3)Tc1-\delta\ Ts4$$

in which $$Nm3=Npre+Npst+Nd+Nc \text{ and}$$

$$\delta\ Ts4=(Ts4-2)-(Ts4-1)$$

As Flag 1=0 at t18, Trr4-1 is added on the data value in the internal memory MLTrr-a to produce the accumulated reference trigger time period LTrr4-1. The adding number is increased from 0 to 1.

Figure 32:
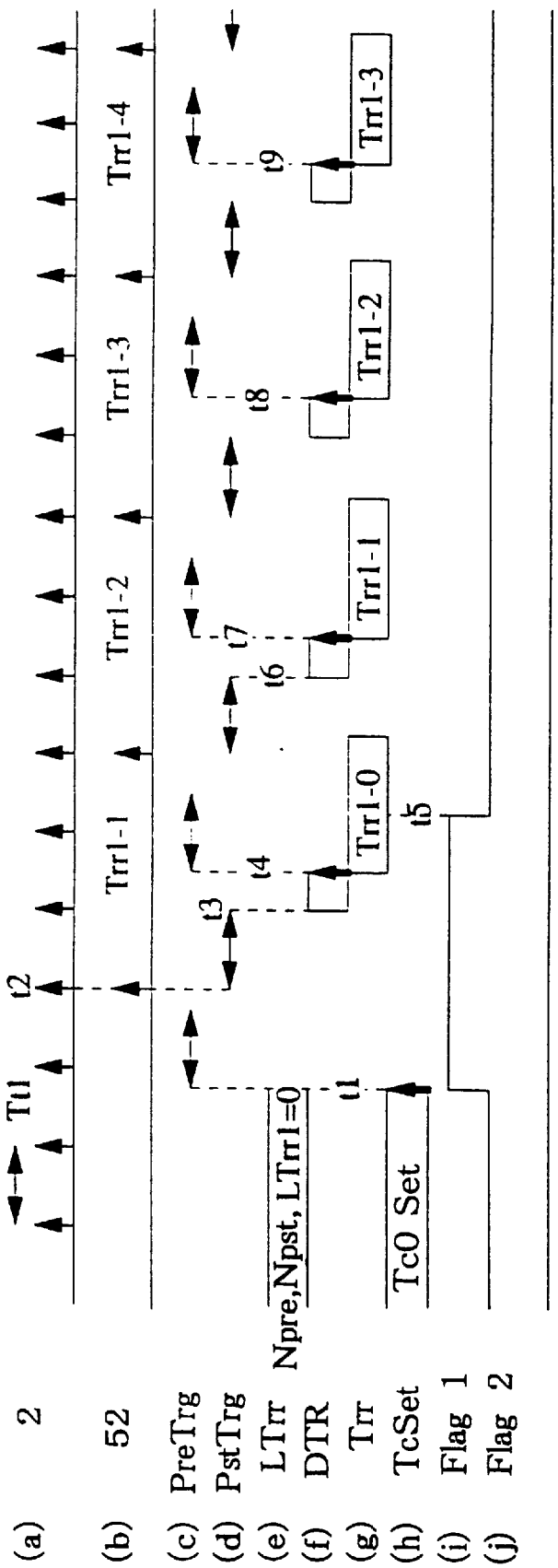
FIG. 32 is a time chart showing an example of a process seeking a clock cycle time in FIG. 14 according to the present invention.

The timing t18 of FIG. 34 corresponds to t7 of FIG. 32. The same operations as those of t7 to t11 are repeated during t18 to t19 of FIG. 35. The internal memory MLTrr-a stores the accumulated reference trigger time period LTrr4-4 and the adding number becomes 4. The internal memory MLTrr-b stores LTrr3-4. The accumulated reference trigger time periods LTrr4-4 and LTrr3-4 are respectively given by $$LTrr4-4=(Trr4-1)+(Trr4-2)+(Trr4-3)+(Trr4-4)$$

$$LTrr3-4=(Trr3-1)+(Trr3-2)+(T3-3)+(Trr3-4)$$

Figure 35:
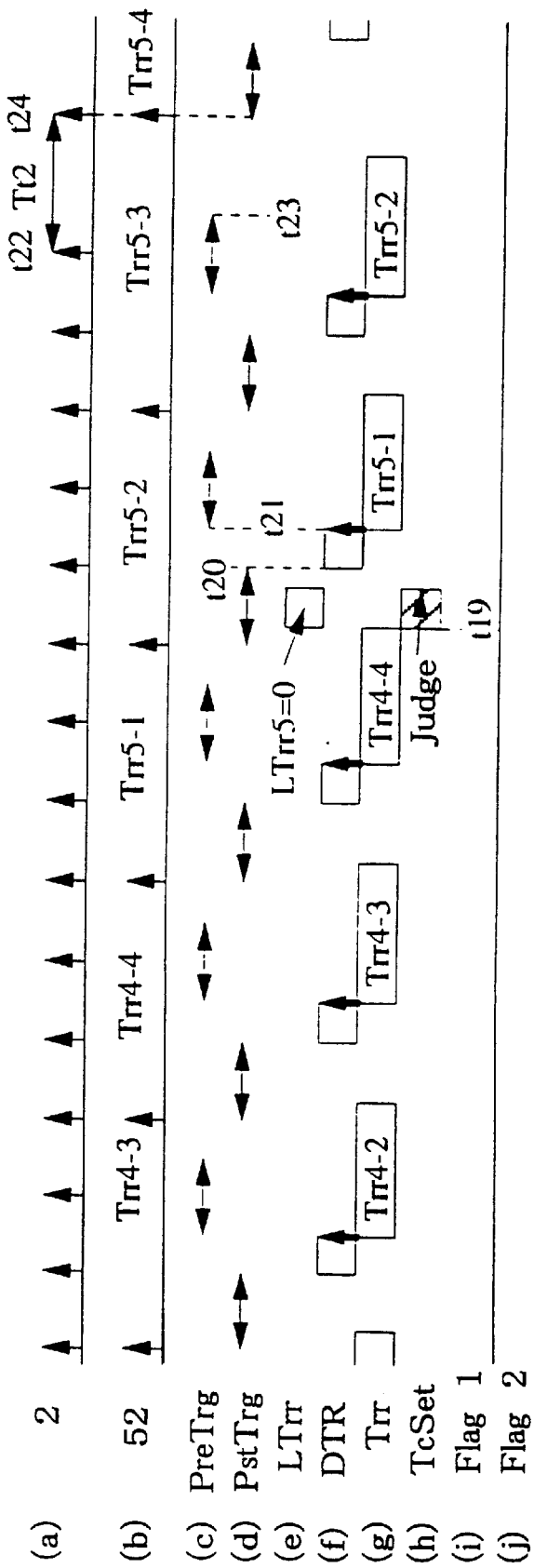
FIG. 35 is a time chart showing an example of a process seeking a clock cycle time of FIG. 14 in combination with FIGS. 32 to 34 according to the present invention.

Finishing the addition of Trr4-4 to MLTrr-a at t19 of FIG. 35, as the adding number is 4, the microprocessor 40 judges again that the clock cycle time Tc1 of the clock 3 is to be changed or not sets the renewed Tc if needed as shown by oblique lines of (h).

At first, the accumulated reference trigger time period difference $\delta$ LTrr4 is calculated as follows.

$\delta$ Ltrr4=(DMLTrr-a)-(DMLTrr-b) in which DMLTrr-a is the data value in the internal memory MLTrr-a, and DMLTrr-b is that in MLTrr-b. So DMLTrr-a and DMLTrr-b are respectively given by $$DMLTrr-a=(Trr4-1)+(Trr4-2)+(Trr4-3)+(Trr4-4)$$

$$DMLTrr-b=(Trr3-1)+(Trr3-2)+(Trr3-3)+(Trr3-4)$$

Next, $\delta$ Ltrr4 is calculated. As the trigger time period Tt1 of the trigger 2 of FIG. 35 (a) is still constant at t19, $$DMLTrr-a=DMLTrr-b \text{ and}$$

$$\delta\ LTrr4 \leq Tc0/4$$

are obtained.

As $\delta$ LTrr4$\leq$Tc0/4 is confirmed, it is judged at t19 that the data acquisition operation is to be continued as shown by oblique lines of FIG. 35 (h). The data DMLTrr-a of the internal memory MLTrr-a is moved to MLTrr-b, so that MLTrr-a is reset to 0 (LTrr5=0) and the adding number is reset to 0, too. The new data of MLTrr-b is shown by $$DMLTrr-b=(Trr4-1)+(Trr4-2)+(Trr4-3)+(Trr4-4)$$

It is assumed that the trigger time period Tt of the trigger 2 is constant during t1 to t9, so the clock cycle time Tc1 is not renewed, and the data acquisition operation is, therefore, executed by using the clock cycle time Tc1 in the state of the coherent sampling.

Let's suppose that the accumulation of the reference trigger time periods Trrs is continued after t19, and the trigger time period of the trigger 2 of FIG. 35 (a) changes form Tt1 to Tt2 at t22. In this case, the setting processes of the clock cycle time Tc of the clock 3 will be different from one mentioned above.

There is shown the timing t22 in FIG. 35 when the trigger time period changes from Tt1 to Tt2. Each of the reference trigger time periods Trr5-1 and Trr5-2 is 3Tt1, which is the same time period as Trr4-4 or Trrs before it, as the trigger time period is still Tt1.

By the change of the trigger time period Tt1 to Tt2 at t22, the time difference between the end timing t23 of PreTrg of (c) and the first input of the trigger 2 of t24 after t23, is changed.

The reference trigger time period Trr5-3, which is different from those before t22, changes to $$Trr5-3=2Tt1+Tt2$$

As the trigger time period of the trigger 2 becomes Tt2 being constant after t24, the reference trigger time period Trr5-4 or the later time period (Trr6-1 of FIG. 36) becomes 2Tt2 being constant.

After the judgment at t19 of FIG. 35 that the data acquisition operation is to be continued, the microprocessor 40 starts the operation of the data transmission DTR of (f) at t20 when PstTrg of (d) is finished.

The data transmission DTR is finished at t21. The microprocessor 40 calculates Trr5-1 of (b) as follows.

$$Trr5-1=(Nm4)Tc1+\delta Ts5$$

in which $$Nm4=Npre+Npst+Nd+Nc \text{ and}$$

$$\delta Ts5=(Ts5-2)-(Ts5-1)$$

The adding number is increased from 0 to 1. The timing t21 corresponds to t7 of FIG. 32.

Figure 36:
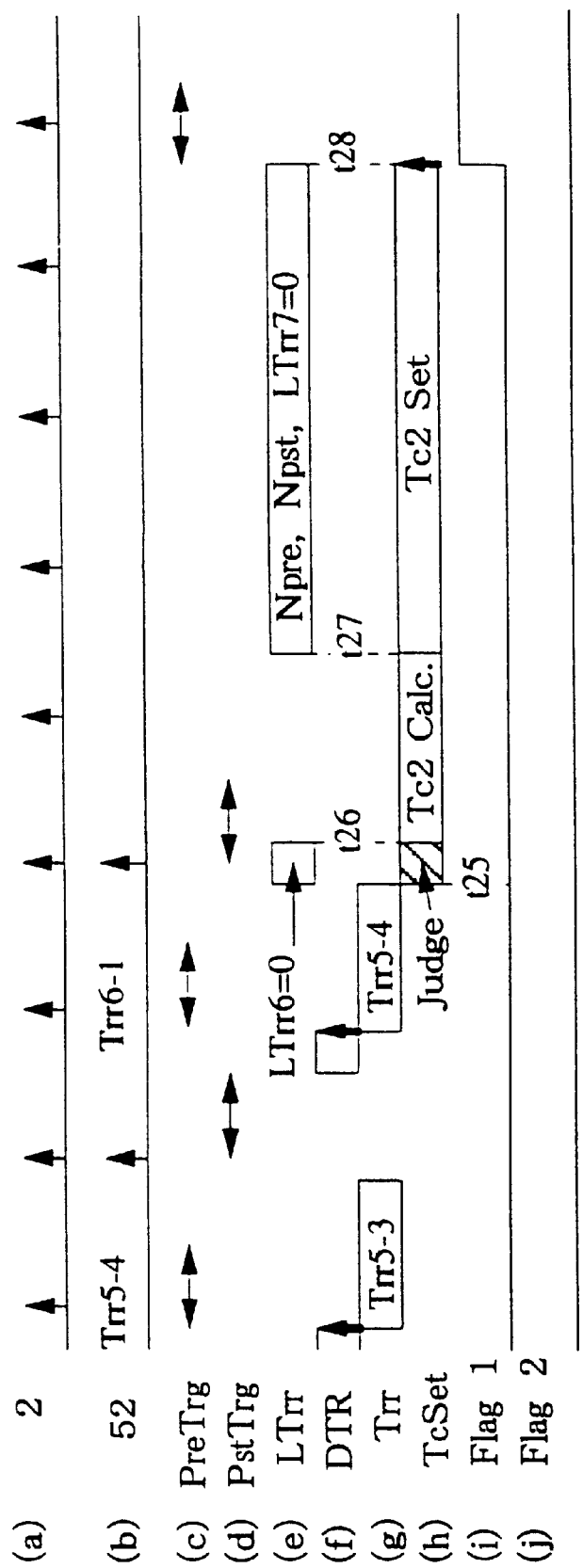
FIG. 36 is a time chart showing an example of a process seeking a clock cycle time of FIG. 14 in combination with FIGS. 32 to 35 according to the present invention.
Figure 37:
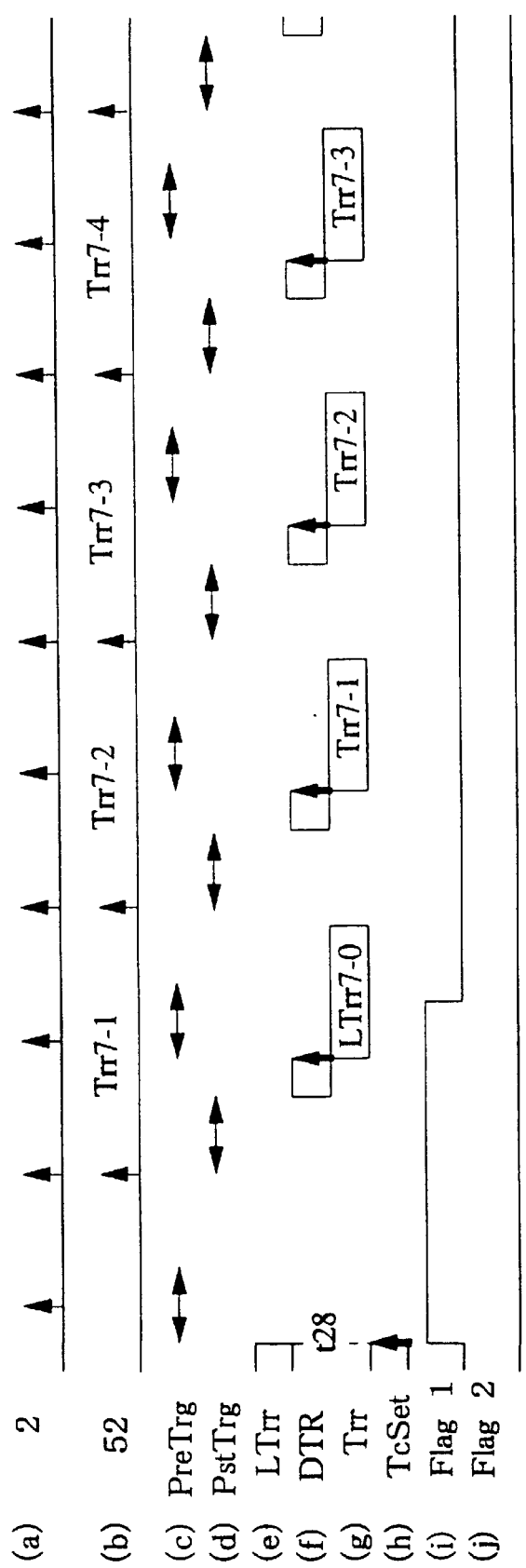
FIG. 37 is a time chart showing an example of a process seeking a clock cycle time of FIG. 14 in combination with FIGS. 32 to 36 according to the present invention.

The same operations as those of t7 to t10 are repeated during t21 to t25 of FIG. 36. The internal memory MLTrr-a stores the accumulated reference trigger time period LTrr5-4 and the adding number becomes 4.

The microprocessor 40 judges that the clock cycle time Tc1 of the clock 3 is to be changed or not and sets the renewed Tc if needed as shown by oblique lines of FIG. 36 (h). Here, the accumulated reference trigger time period difference δ LTrr5 is calculated as follows.

δ Ltrr5=(DMLTrr-a)-(DMLTrr-b) in which DMLTrr-a is the data value in the internal memory MLTrr-a, and DMLTrr-b is that in MLTrr-b.

So, DMLTrr-a, DMLTrr-b and δ LTrr5 are respectively given by $$DMLTrr-a=(Trr5-1)+(Trr5-2)+(Trr5-3)+(Trr5-4)=8Tt1+3Tt2$$

$$DMLTrr-b=(Trr4-1)+(Trr4-2)+(Trr4-3)+(Trr4-4)=12Tt1 \text{ and}$$

$$\delta Ltrr5=Abs [3Tt2-4Tt1]$$

in which Abs [x] means the absolute value of x.

As δ LTrr5>Tc0/4, it is judged after t25 as shown by oblique lines of (h) that the clock cycle time Tc1 is to be changed. The judgment is executed in like manner with that of t11 of FIG. 33. Even if the trigger time period Tt of the trigger 2 changes form Tt1 to Tt2 as shown by t22 to t24 of FIG. 35, the clock cycle time Tc1 is not changed when δ LTrr5≦Tc0/4 is confirmed. After the judgment of Tc1, the data of MLTrr-a is moved to MLTrr-b and MLTrr-a is reset to 0 and the adding number is reset to 0 (LTrr6=0), too.

When δ LTrr5 is obviously larger than Tc0/4, the microprocessor 40 calculates the new Tc2 during t26 to t27 for satisfying the coherent sampling conditions in accordance with the equations (8') to (11').

The calculation of the new clock cycle time Tc2 to be set is finished at t27. The microprocessor 40 provides the new value for the generation of Tc2 to the clock generator 300 and starts to count for the predetermined time period of t27 to t28 to set the stable Tc2 of the clock 3.

The new pretrigger value Npre and the posttrigger value Npst corresponding with the new Tc2 are produced to be respectively preset to the pretrigger counter 206 and the posttrigger counter 204 of FIG. 16. The internal memory MLTrr-a and the adding number are reset to 0s (LTrr7=0).

During the period of the Tc2 setting time t27 to t28, the acquisition start signal 55 is not provided, so that the synchronizing signal 52 of (b) is not generated.

When the new Tc2 setting time period finishes at t28, the microprocessor 40 provides the acquisition start signal 55 and sets up Flag 1 to 1 of (i) showing that the new Tc2 has been set. So, the microprocessor 40 restarts the new data acquisition operation by using the renewed Tc2 of the clock 3. The timing t28 corresponds to t1 of FIG. 32 when the trigger time period of the trigger 2 was Tt1. The timing t28 of FIG. 37 does not, however, correspond to t15 of FIG. 33, because the data values LTrrs of the memory MLTrr-b at t15 and t28 don't correspond each other.

The new data acquisition operation by using the new Tc2 of the clock 3 continues during t28 to t29. As the adding number is 4 at t29 of FIG. 38, the microprocessor 40 judges that the clock cycle time Tc2 of the clock 3 is to be changed or not and sets the renewed Tc3 if needed as shown by oblique lines of (h). Then, the accumulate reference trigger time period difference δ LTrr7 is calculated as follows.

$$LTrr7=(DMLTrr-a)-(DMLTrr-b)$$

in which DMLTrr-a is the data value in the internal memory MLTrr-a, and DMLTrr-b is that in MLTrr-b. So, DMLTrr-a and DMLTrr-b are respectively given by $$DMLTrr-a=(Trr7-1)+(Trr7-2)+(Trr7-3)+(Trr7-4)=8Tt2$$

$$DMLTrr-b=(Trr5-1)+(Trr5-2)+(Trr5-3)+(Trr5-4)=8Tt1+3Tt2$$

Figure 38:
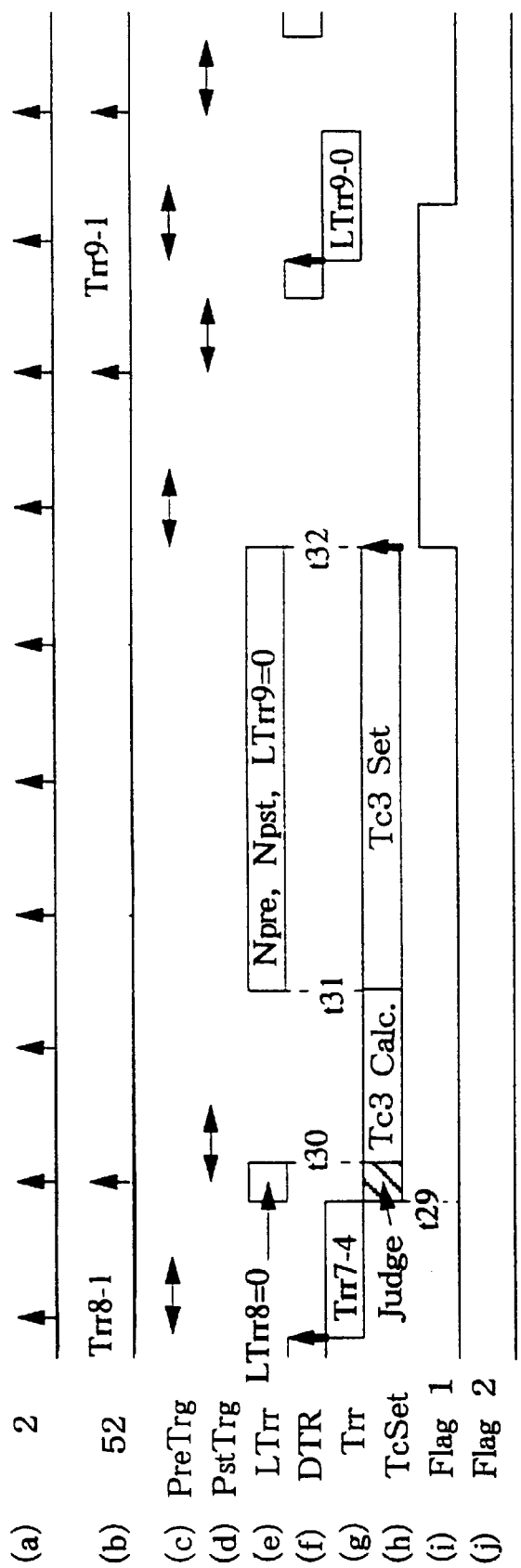
FIG. 38 is a time chart showing an example of a process seeking a clock cycle time of FIG. 14 in combination with FIGS. 32 to 37 according to the present invention.

Therefore, $$\delta LTrr7=Abs[5Tt2-8Tt1]$$

is obtained at t29 of FIG. 38.

As δ LTrr7>Tc0/4, it is judged at t29 as shown by oblique lines of (h) that the clock cycle time Tc2 is to be changed. After the judgment of Tc2, the data of MLTrr-a is moved to MLTrr-b and MLTr-a is reset to 0 and the adding number is reset to 0.

By the judgment of Tc2 to be changed, the microprocessor 40 calculates the new Tc3 during t30 to t31 for satisfying the coherent sampling conditions with the synchronizing signal 52 of (b) in accordance with the equations (8') to (11').

The calculation of the new clock cycle time Tc3 to be set is finished at t31. The microprocessor 40 provides the new value for the generation of Tc3 to the clock generator 300 and starts to count for the predetermined time period of t31 to t32 to set the stable Tc3 of the clock 3. The new pretrigger value Npre and the posttrigger value Npst corresponding with the new Tc3 are produced to be respectively preset to the pretrigger counter 206 and the posttrigger counter 204.

The internal memory MLTrr-a and the adding number are reset to 0s (LTrr9=0) at t32. During the period of the Tc3 setting time of t30 to t32, the acquisition start signal 55 is not provided, so that the synchronizing signal 52 of (b) is not generated.

At t32 when the predetermined time period of setting the new Tc3 finishes, the microprocessor 40 provides the acquisition start signal 55 and sets up Flag 1 to 1 of (i) showing that the new Tc3 has been set. So, the microprocessor 40 restarts the new data acquisition operation by using the new Tc3 of the clock 3. The timing t32 corresponds to t15 of FIG. 33 when the trigger time period of the trigger 2 is Tt1.

The stored data in the internal memory MLTrr-b is the value of 8Tt2, and the stored data is still kept, after t32. The data acquisition operation continues in the coherent sampling conditions until the trigger time period Tt2 of the trigger 2 changes to the other rate.

The data acquisition operation and the operation measuring the time differences start at t32. The reference trigger time period Trr9-1 is calculated at t35 of FIG. 39 on the basis of the measured Ts9-1, Ts9-2 and the clock count value Nc. The Trr9-1 is given by $$Trr9-1=(Nm5)Tc3-\delta Ts9$$

in which

Nm5=Npre+Npst+Nd+Nc and

δTs9=(Ts9-2)–(Ts9-1)

The calculated Trr9–1 is added on the stored data value in MLTrr-a.

Let's suppose that the trigger time period Tt2 of the trigger 2 changes to Tt3 at t33 of FIG. 39(a). The time period of PreTrg of (c) finishes at t34. The trigger 2 does not, thereafter, occur till t37. The period counter 207 counts the clock count value Nc. The value Nc is the number of occurred pulses of the clock 3 during the time period between the end timing t34 of PreTrg of (c) and the start timing of PstTrg of (d) at t37.

The maximum countable value of the period counter 207 is limited. In the case of the trigger time period Tt3 of the trigger 2 being very long, the counter 207 generates a carry at t36 when the counting value arrives to the maximum value. By receiving the next clock 3, the counter 207 returns its counting value to 0. Then, the counter 207 continues to count up the number of occurrences of the clock 3.

The microprocessor 40, therefore, receives the smaller value than the true Nc at t37 from the counter 207. The microprocessor 40 sets up Flag 2 of (j) to 1 by receiving the flag 56 at t36.

When finished the operation adding Trr9-4 (not shown) to MLTrr-a, the microprocessor 40 judges that the clock cycle time Tc3 has to be changed or not. However, if Flag2=1 of (j) as shown at and after t36, regardless of the value of δLTrr9, the microprocessor 40 judges that the data acquisition operation is to be continued and does not change the clock cycle time Tc3. This is the same judgment as that at t16 of FIG. 34 or at t19 of FIG. 35.

Figure 39:
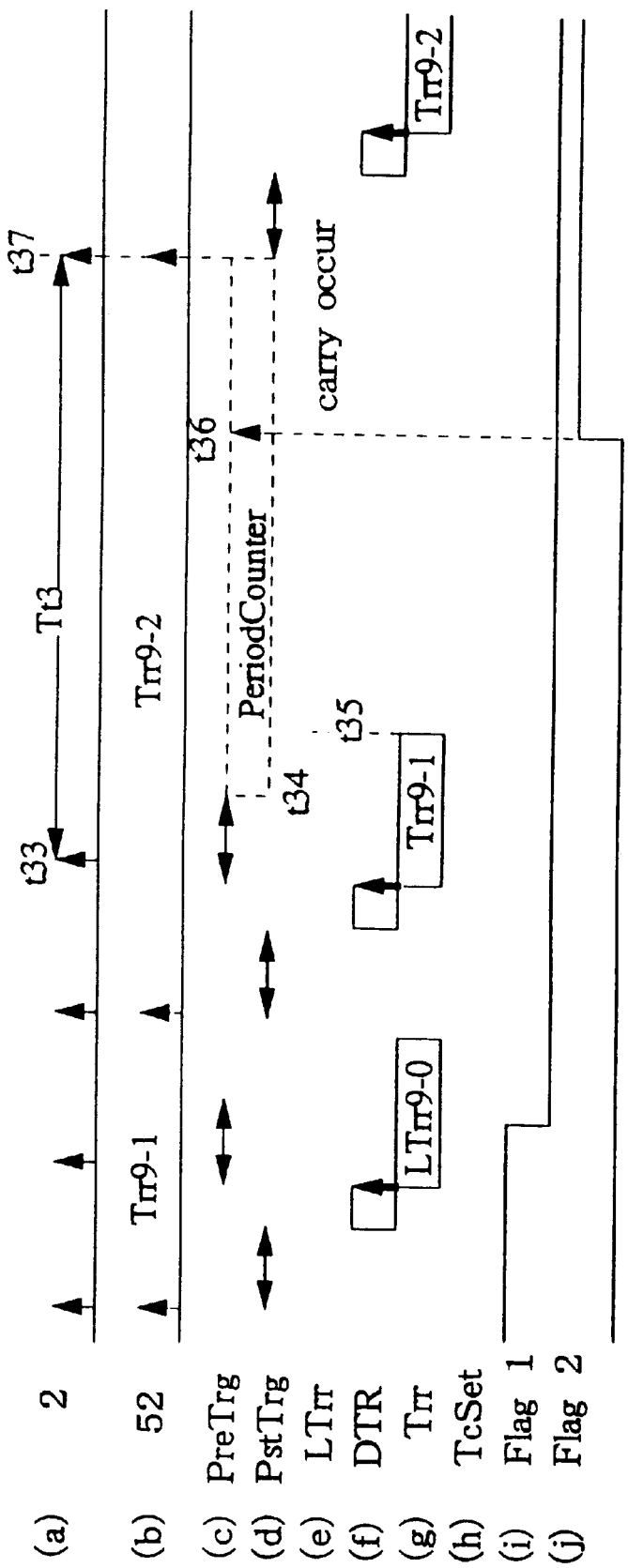
FIG. 39 is a time chart showing an example of a process seeking a clock cycle time of FIG. 14 in combination with FIGS. 32 to 38 according to the present invention.

The maximum value of the counter 207 counting during t34 to t37 of FIG. 39 will be explained in the following by using an example.

It is the object of measuring the reference trigger time periods Trrs to set the clock cycle time Tc to be optimum so as to obtain the coherent sampling state. After long period of time from the clock cycle time Tc setting, the accumulated fluctuations, namely random walk of Tc may excess one half of the averaged clock cycle time Tc. The coherent sampling state is, therefore, hard to be maintained. There is no necessity to continue the control of Tc with measuring the reference trigger time period Trr again.

The frequency stability of the voltage controlled crystal oscillator VCXO 305 of FIG. 25 is approximately ±30×10$^{-6}$ for example. Adopting this value as the standard deviation of the frequency fluctuation FL, the value is applied to rndm of the equation (4). The time t, by which the accumulated fluctuation amounts to Tc/2, is approximately given by $$2 \times 30 \times 10^{-6} Tc^{1/2} t^{1/2} = Tc/2$$

It is, therefrom, obtained that $$t/Tc = 10^8/1.44$$

The t/Tc is approximately equal to 64×10$^6$. Therefore, as the period counter 207 of FIG. 16, a 26-bit counter is usable. When the carry is generated in the counter 207, it is assumed that the accumulated fluctuations being in excess of Tc/2 occurs. If this case happens, the clock cycle time Tc of the clock 3 is not controlled.

The 26-bit counter is usable when no fluctuation of the signal or the trigger cycles is supposed. There are actually some fluctuations, so that the lower-bit counter than 26-bit can be used enough as the period counter 207 of FIG. 16.

Figure 1:
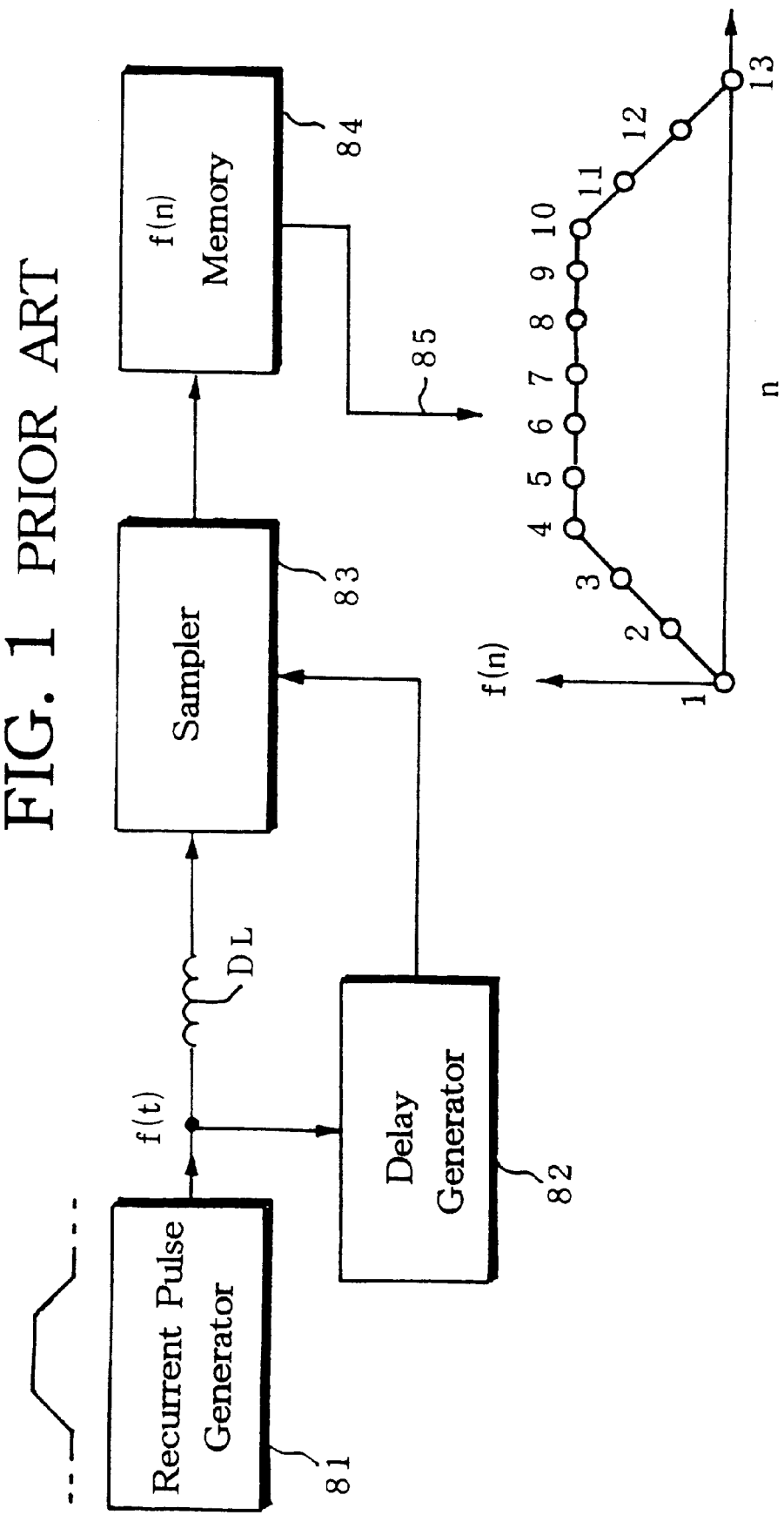
FIG. 1 is a circuit block diagram of a sequential sampling of the prior art.
Figure 2:
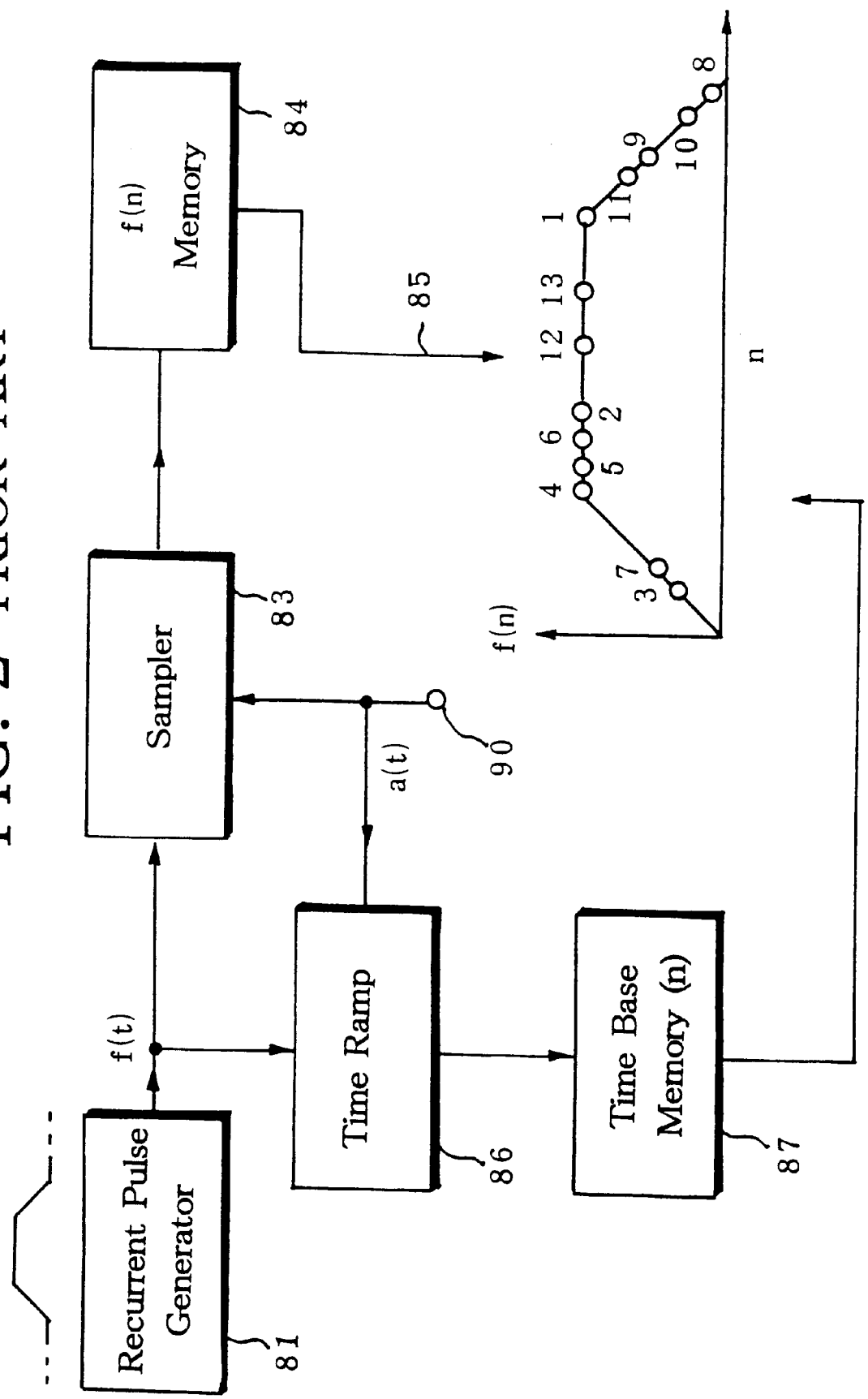
FIG. 2 is a circuit block diagram of a random sampling of the prior art.
Figure 3:
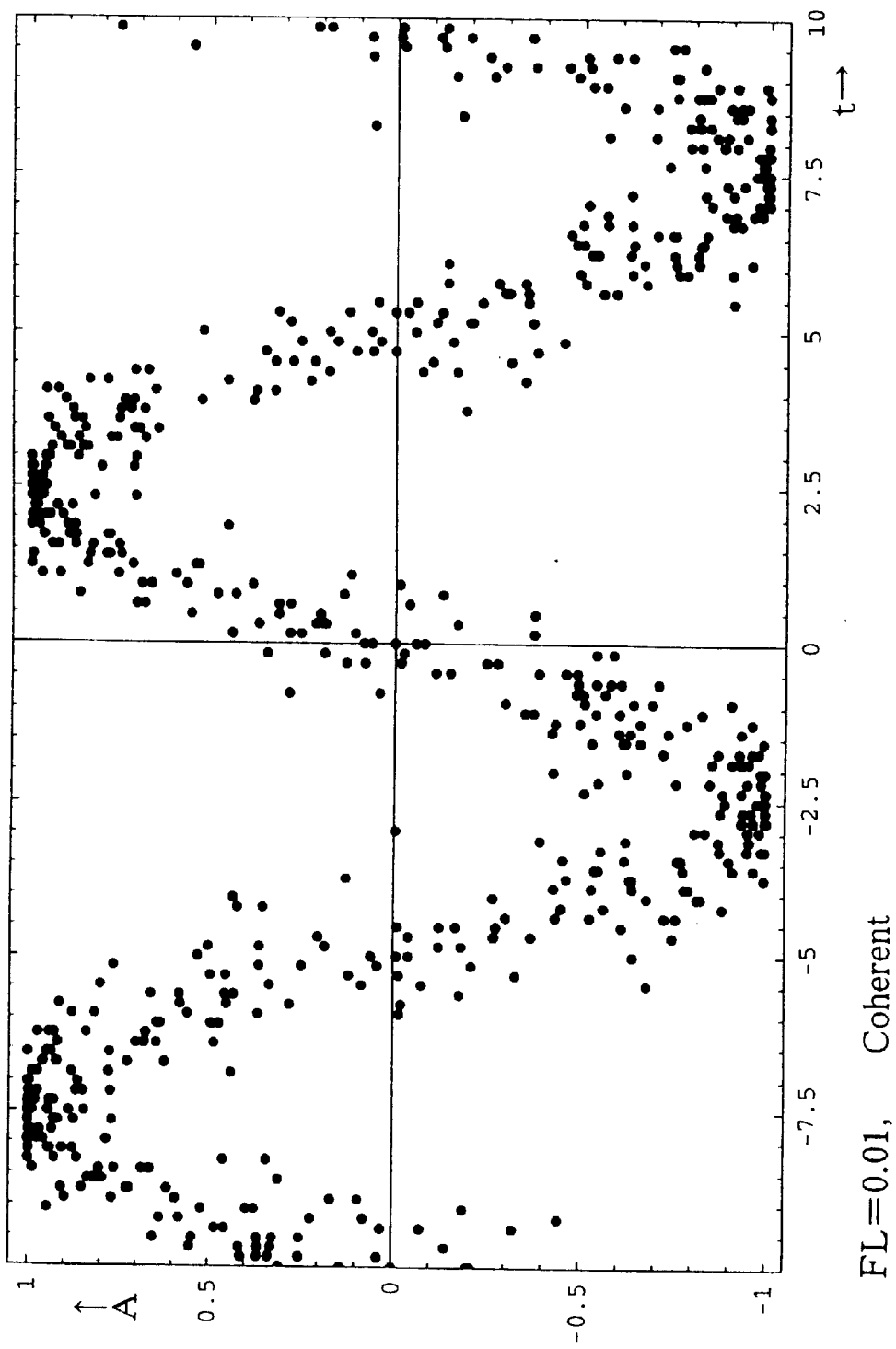
FIG. 3 is a waveform reproduced by simulation of an input signal with the standard deviation of the fluctuation FL=0.01 in a coherent sampling of the prior art.
Figure 40:
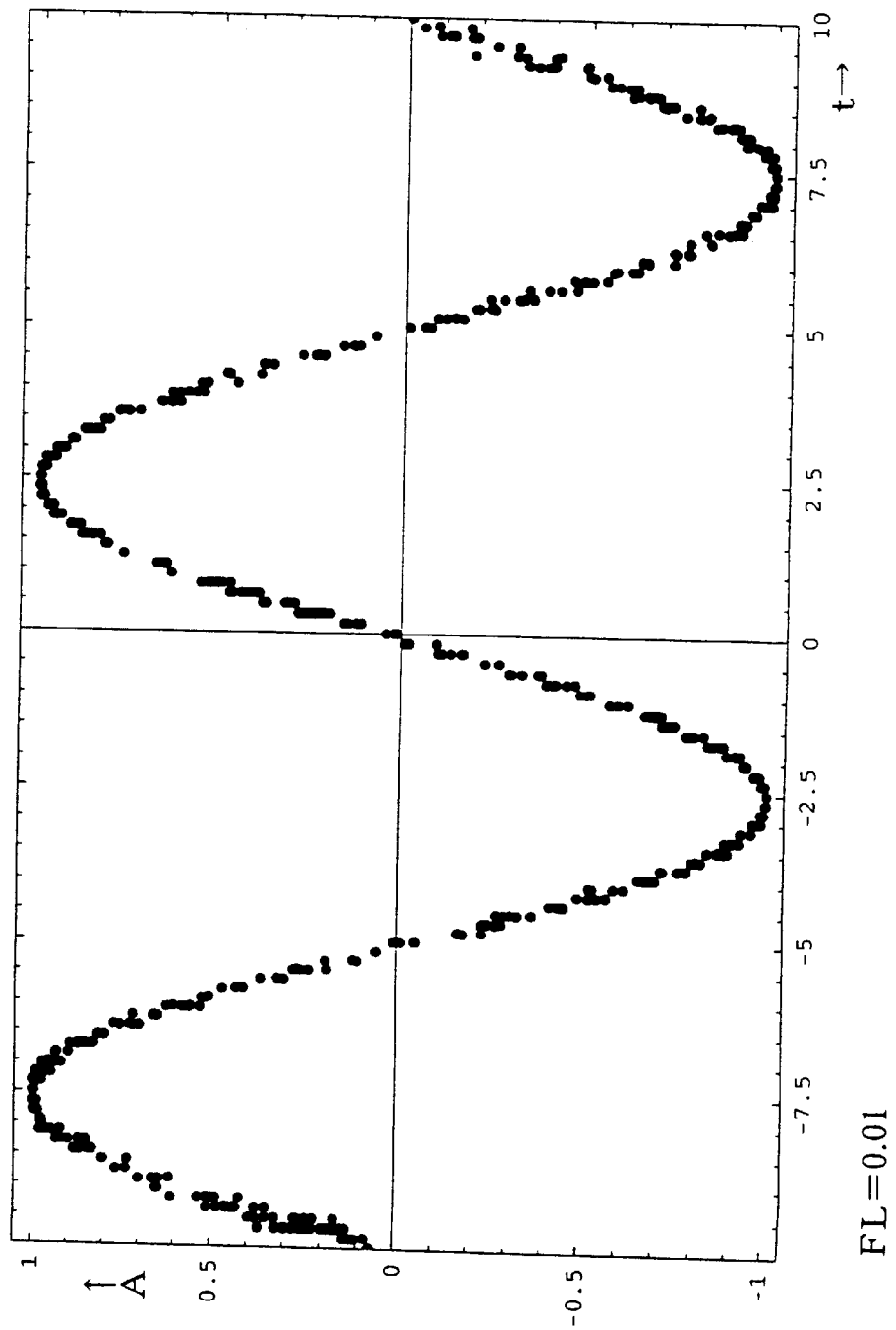
FIG. 40 is a waveform reproduced by simulation of an input signal with the standard deviation of the fluctuation FL=0.01 in a coherent sampling shown in FIG. 14 according to the present invention.
Figure 41:
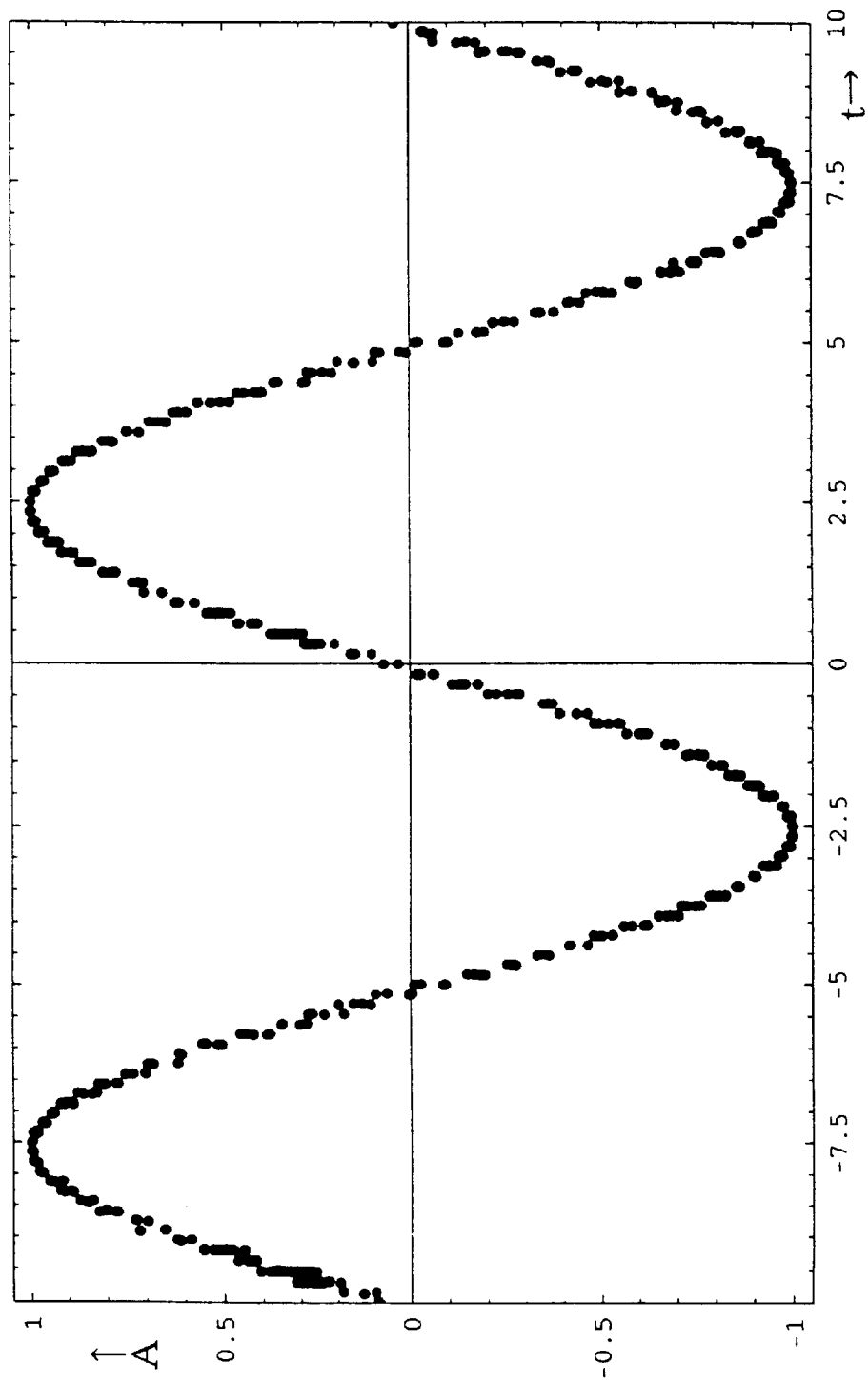
FIG. 41 is a waveform reproduced by simulation of an input signal with the standard deviation of the fluctuation FL=0.003 in a coherent sampling shown in FIG. 14 according to the present invention.
Figure 42:
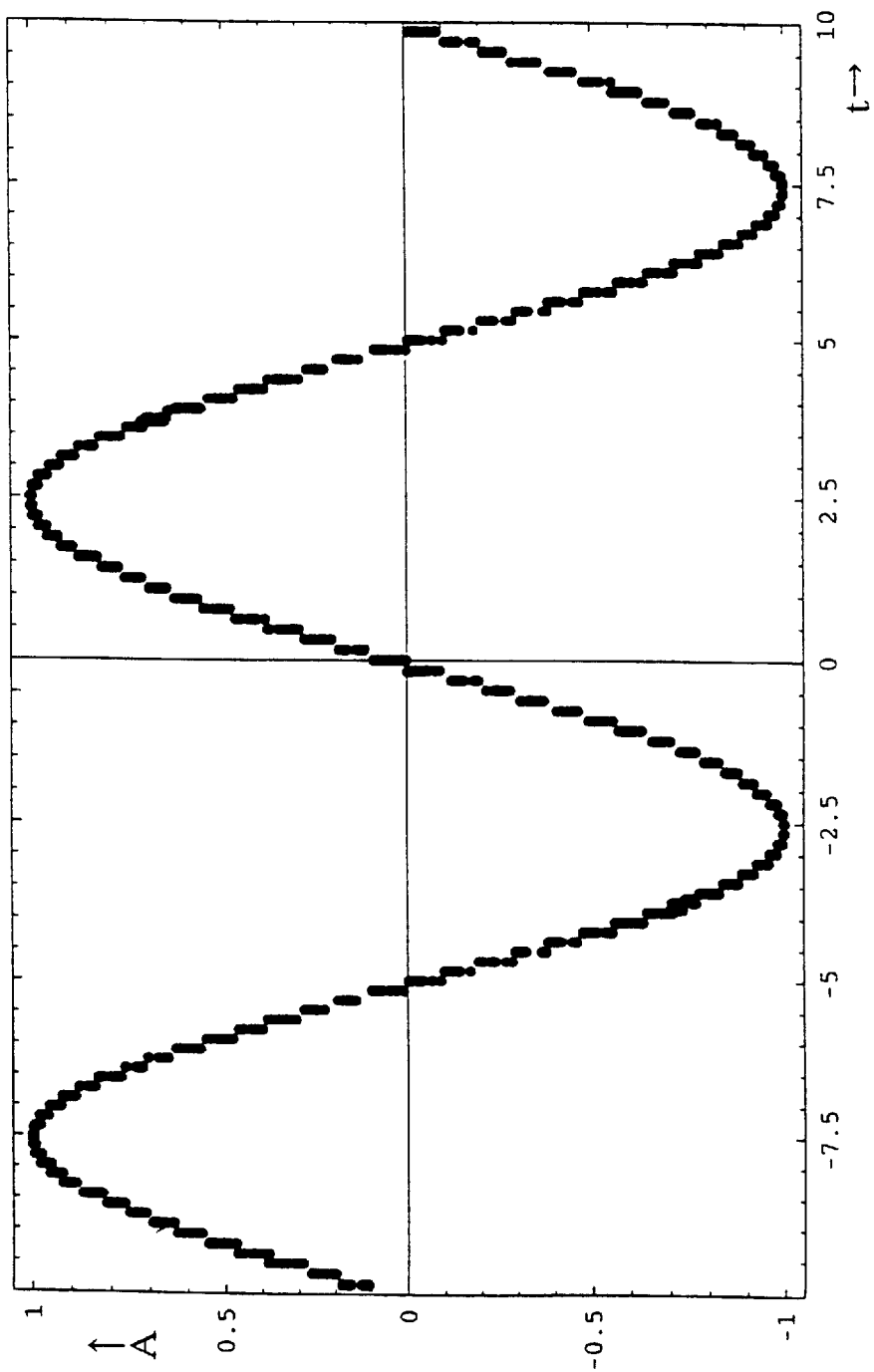
FIG. 42 is a waveform reproduced by simulation in the coherent sampling shown in FIG. 14 according to the present invention, in which a hold time duration Tmh=10.3Tc, a clock cycle time Tc=10(1+8/M), a number displayed data M=64, and an input signal with the standard deviation of the fluctuation FL=0.001.
Figure 43:
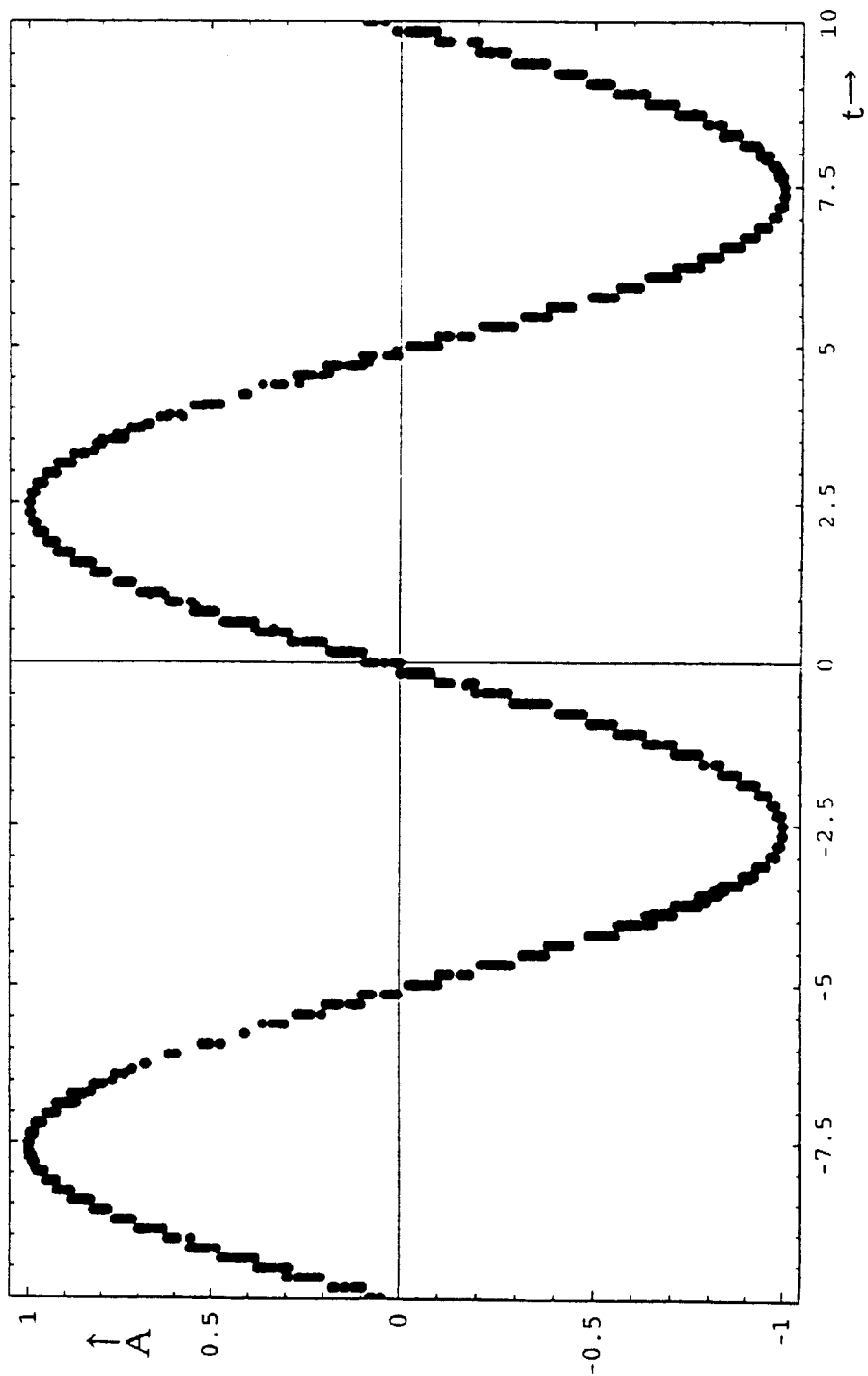
FIG. 43 is a waveform reproduced by simulation in the coherent sampling shown in FIG. 14 according to the present invention, in which a hold time duration Tmh=1000.3Tc, a clock cycle time Tc=10(1+8/M), a number of displayed data M=64, and an input signal with the standard deviation of the fluctuation FL=0.001.
Figure 44:
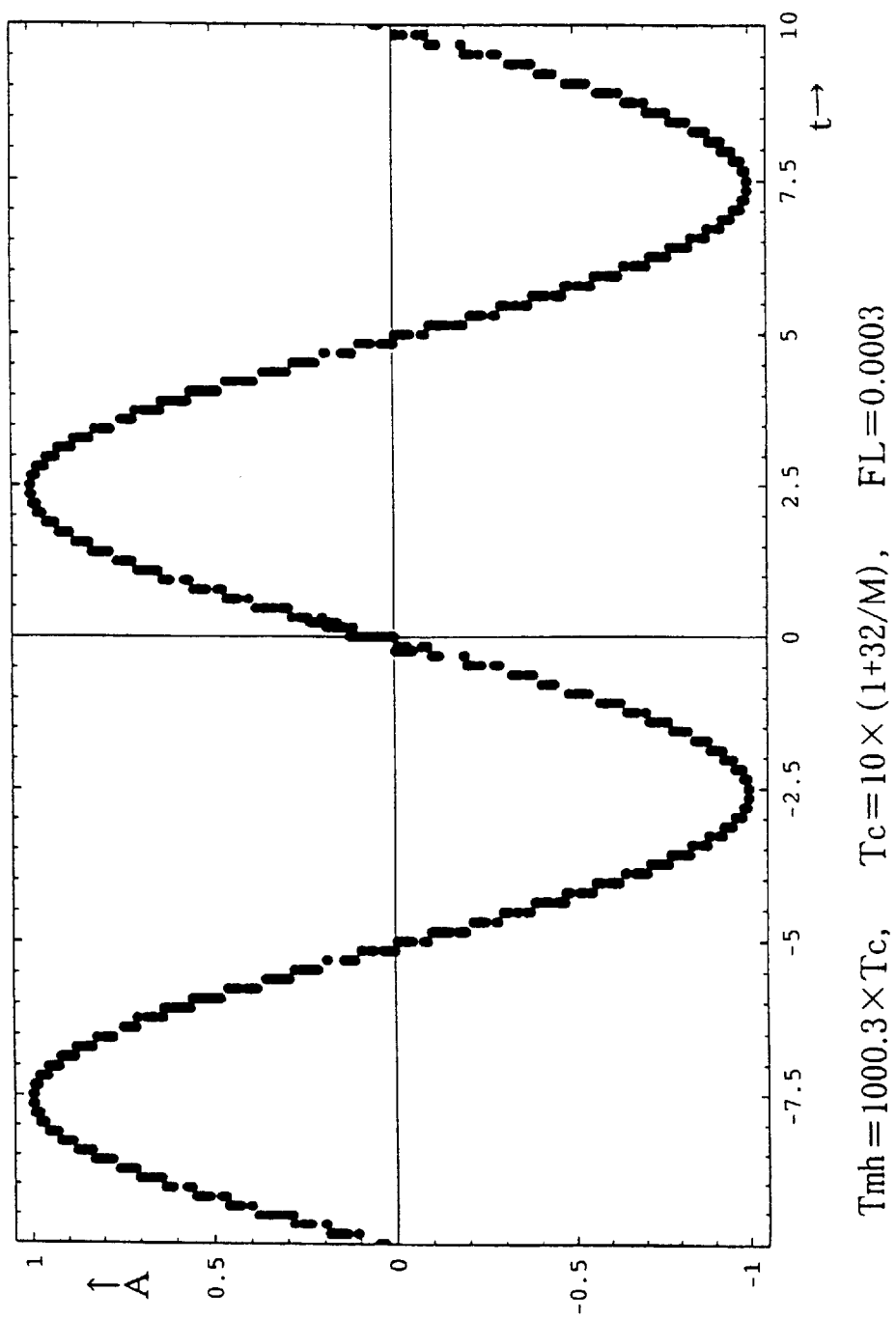
FIG. 44 is a waveform reproduced by simulation in the coherent sampling shown in FIG. 14 according to the present invention, in which a hold time duration Tmh=1000.3Tc, a clock cycle time Tc=10(1+32/M), a number of displayed data M=64, and an input signal with the standard deviation of the fluctuation FL=0.0003.
Figure 45:
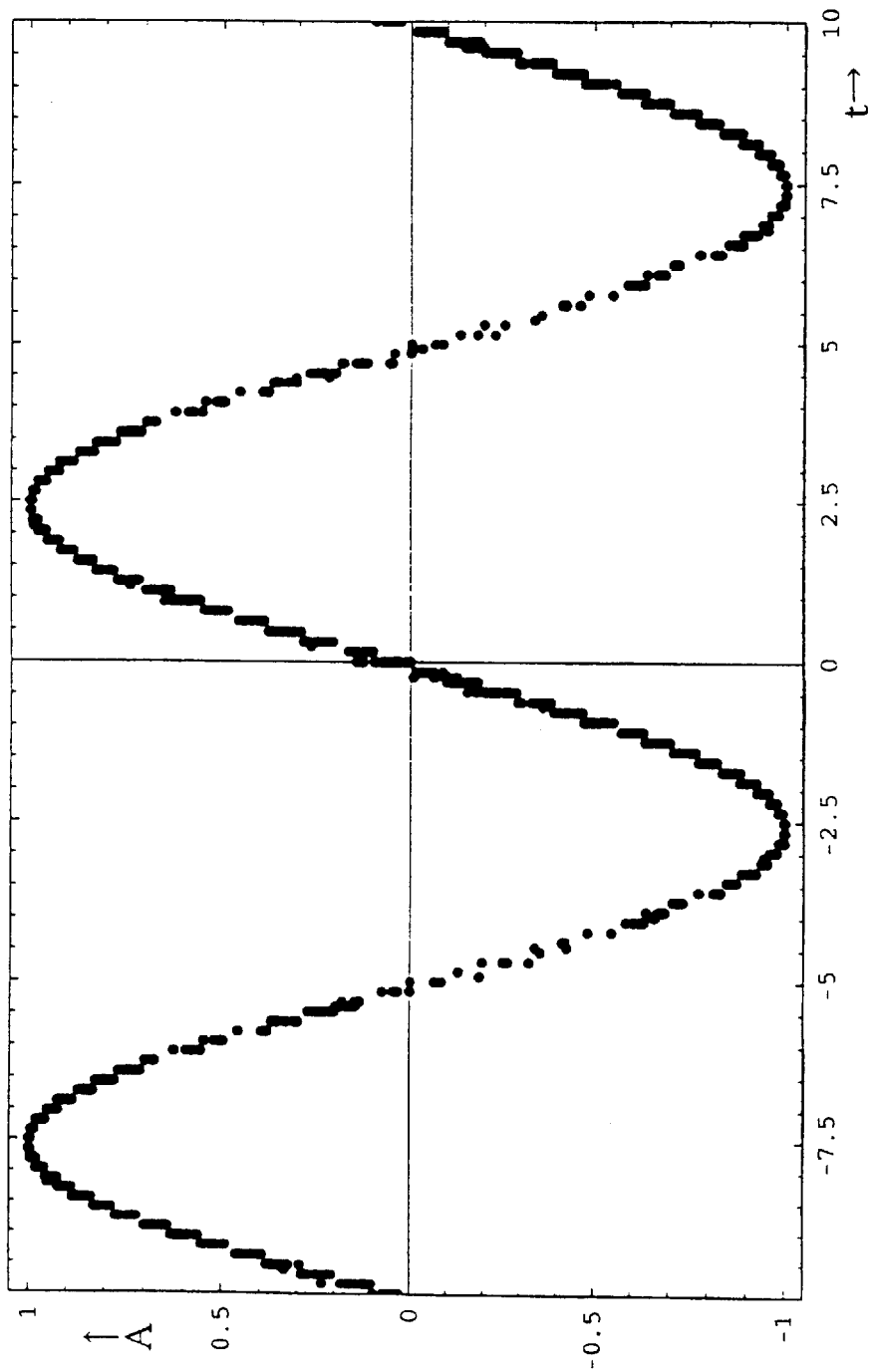
FIG. 45 is a waveform reproduced by simulation in the coherent sampling shown in FIG. 14 according to the present invention, in which a hold time duration Tmh=50000.3Tc, a clock cycle time Tc=10(1+32/M), a number of displayed data M=64, and an input signal with the standard deviation of the fluctuation FL=0.0003.

In FIGS. 40 and 41, there are shown waveforms reproduced by simulation of an input signal in the coherent sampling according to the present invention. FIG. 40 shows the reproduced waveform (replica) of the input signal with the standard deviation of the fluctuation FL=0.01 which is equal to that of FIG. 3 according to the prior art. The vertical axis shows the amplitude A and the horizontal axis shows the time t.

Figure 4:
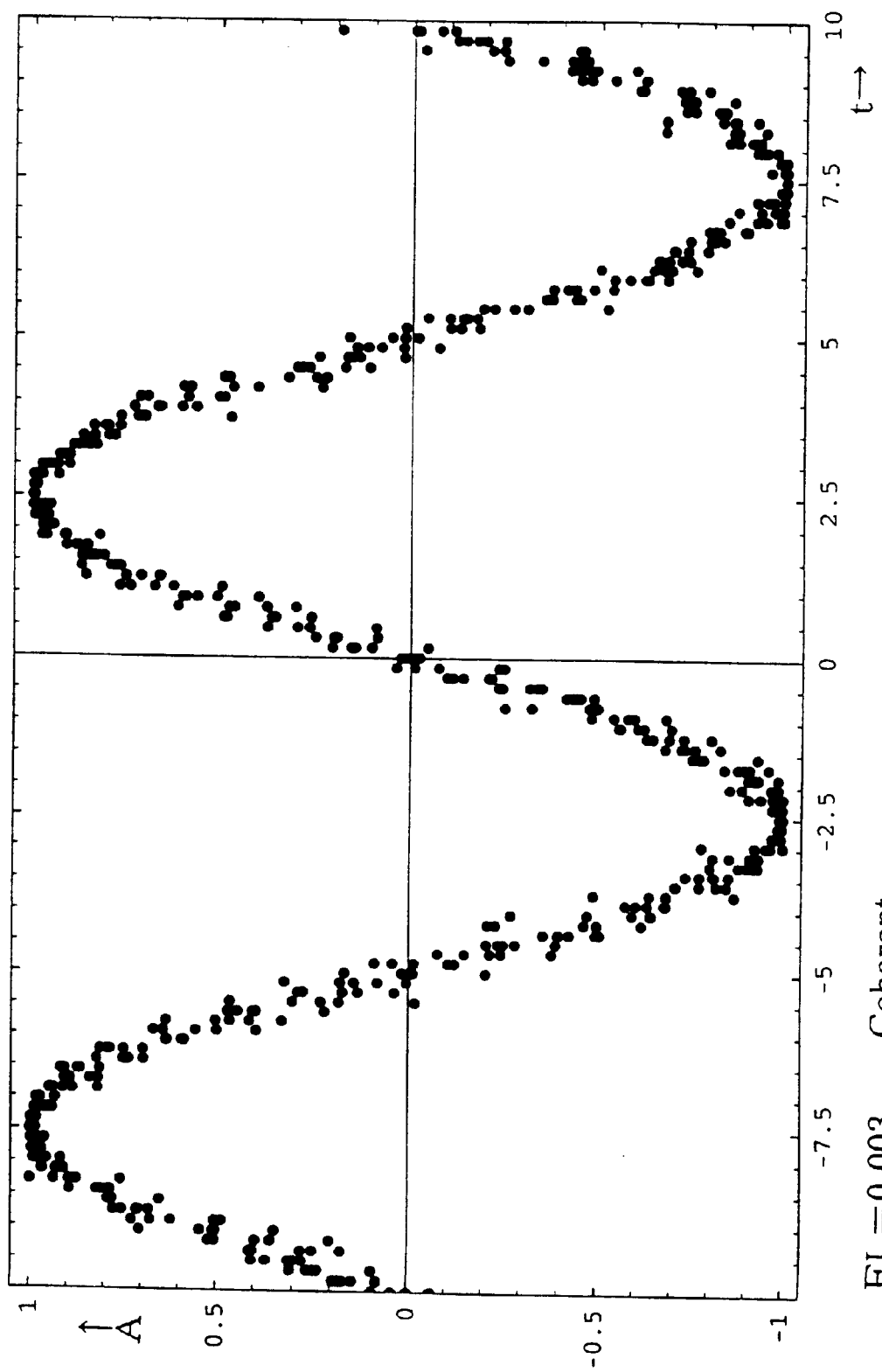
FIG. 4 is a waveform reproduced by simulation of an input signal with the standard deviation of the fluctuation FL=0.003 in a coherent sampling of the prior art.
Figure 5:
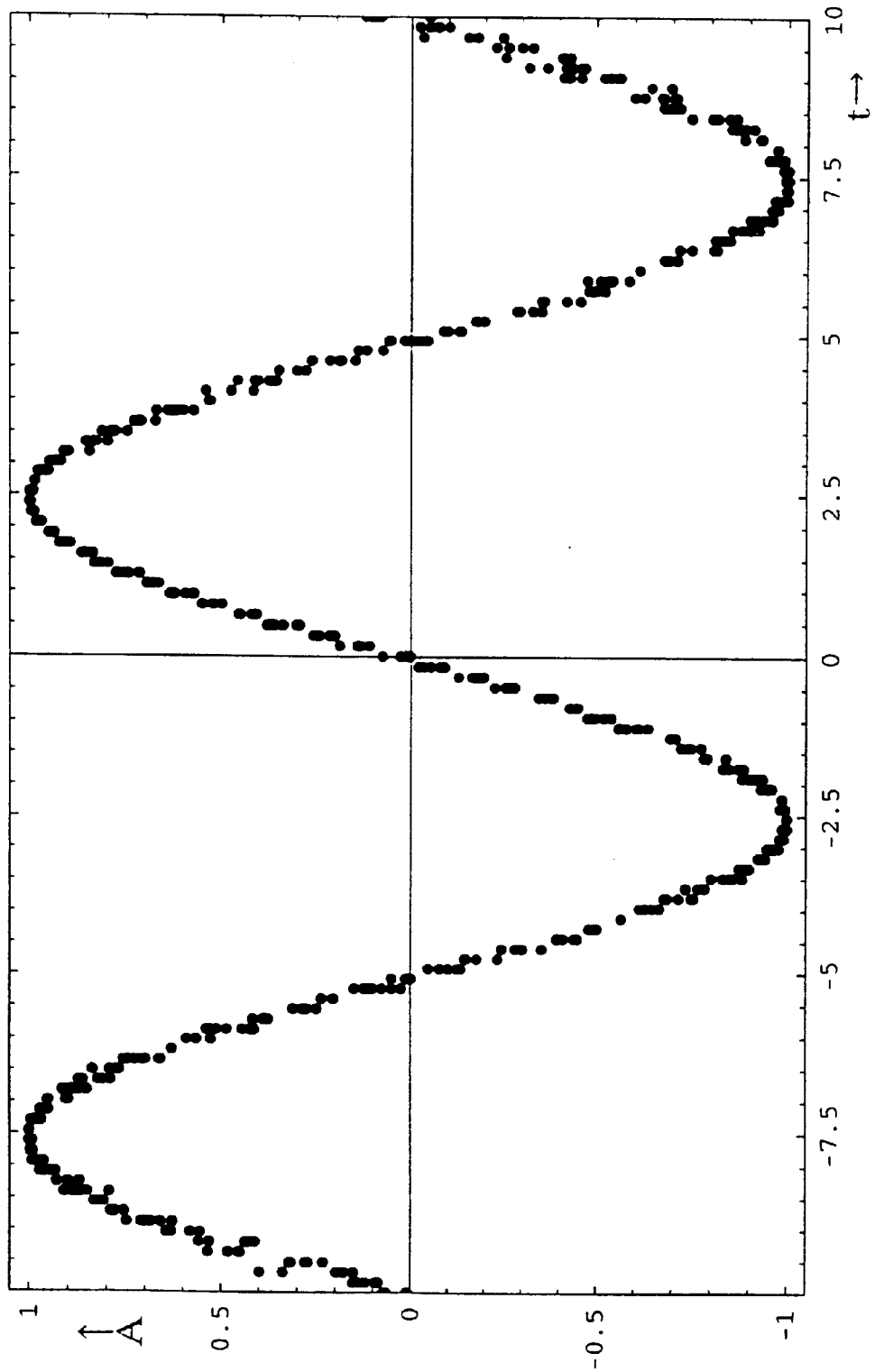
FIG. 5 is a waveform reproduced by simulation of an input signal with the standard deviation of the fluctuation FL=0.01 in a random sampling of the prior art.
Figure 6:
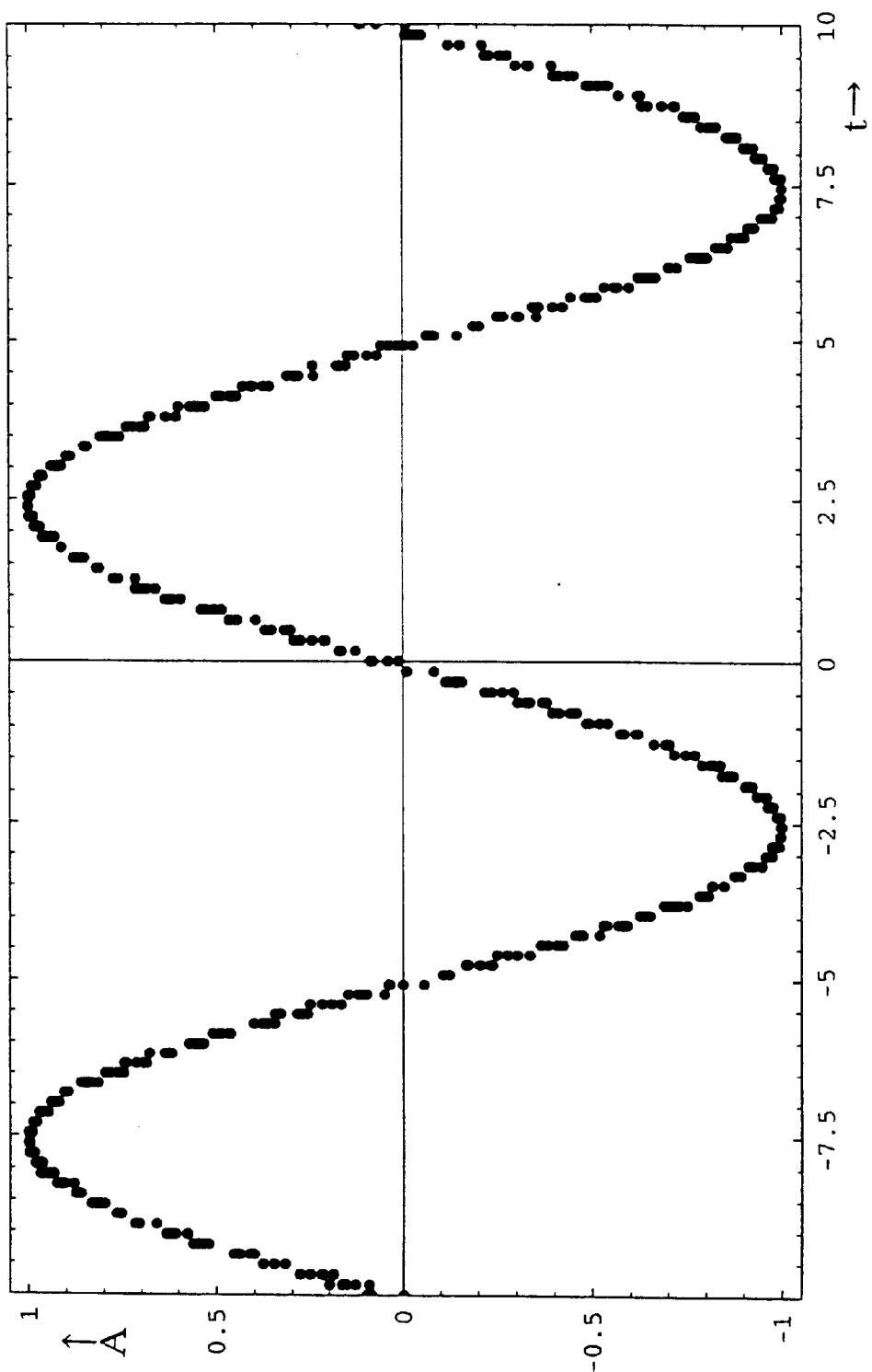
FIG. 6 is a waveform reproduced by simulation of an input signal with the standard deviation of the fluctuation FL=0.003 in a random sampling of the prior art.
Figure 7:
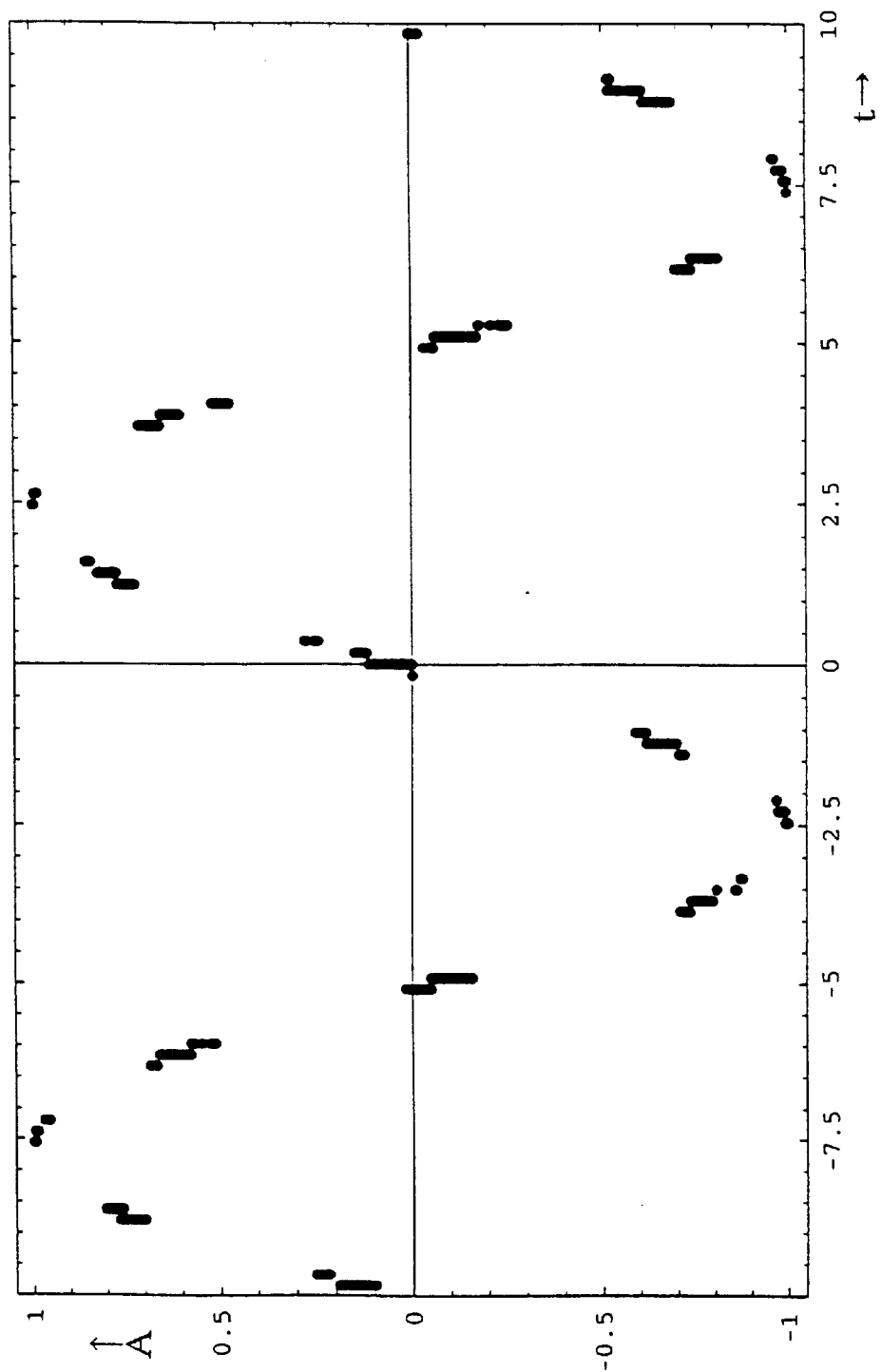
FIG. 7 is a waveform reproduced by simulation in a random sampling using a fixed clock of the prior art, in which a hold time duration Tmh=10.3Tc, a clock cycle time Tc=10(1+8/M), a number of displayed data M=64, and an input signal with the standard deviation of the fluctuation FL=0.001.
Figure 8:
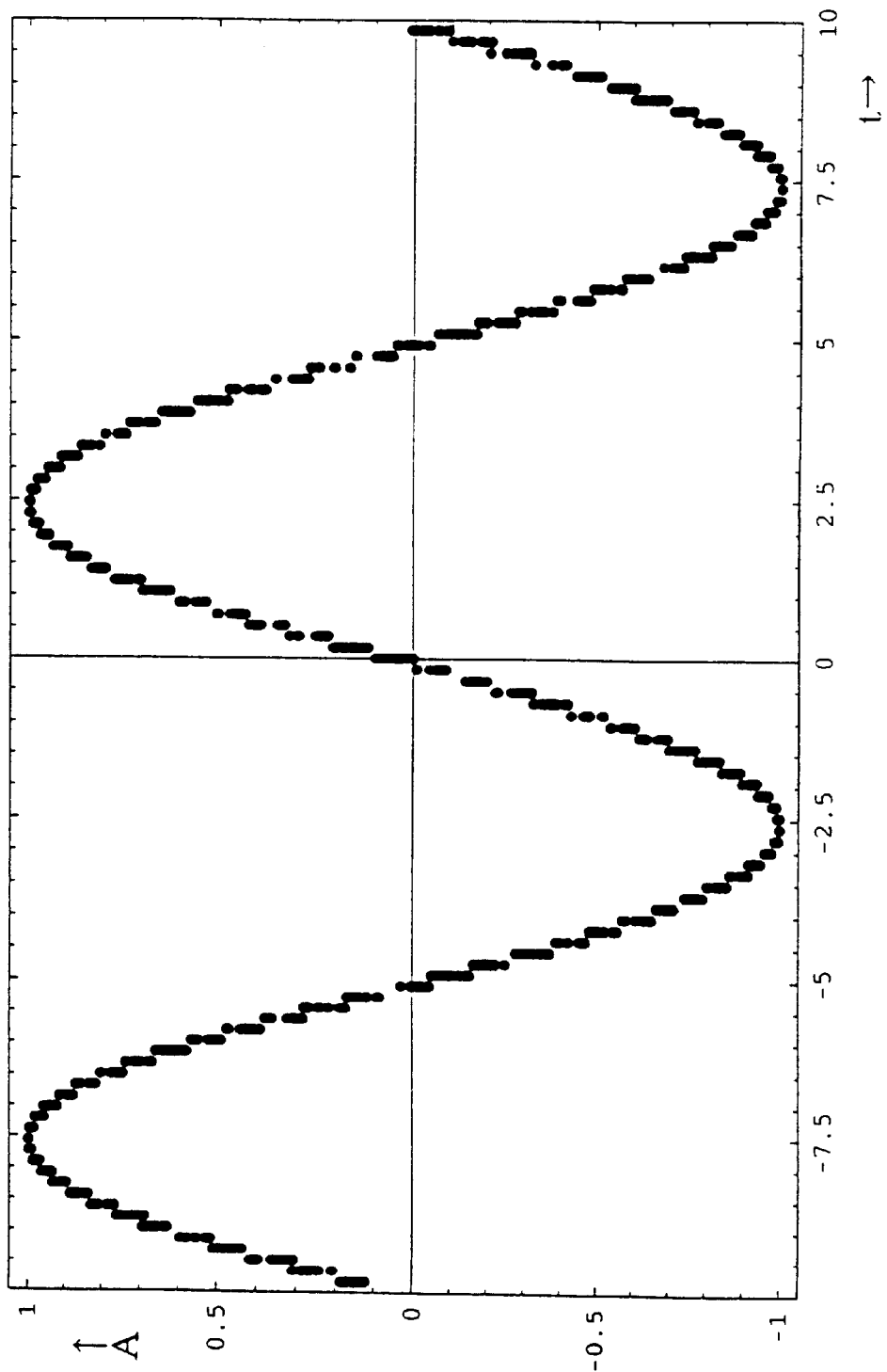
FIG. 8 is a waveform reproduced by simulation in a random sampling using a fixed clock of the prior art, in which a hold time duration Tmh=1000.3Tc, a clock cycle time Tc=10(1+8/M), a number of displayed data M=64, and an input signal with the standard deviation of the fluctuation FL=0.001.
Figure 9:
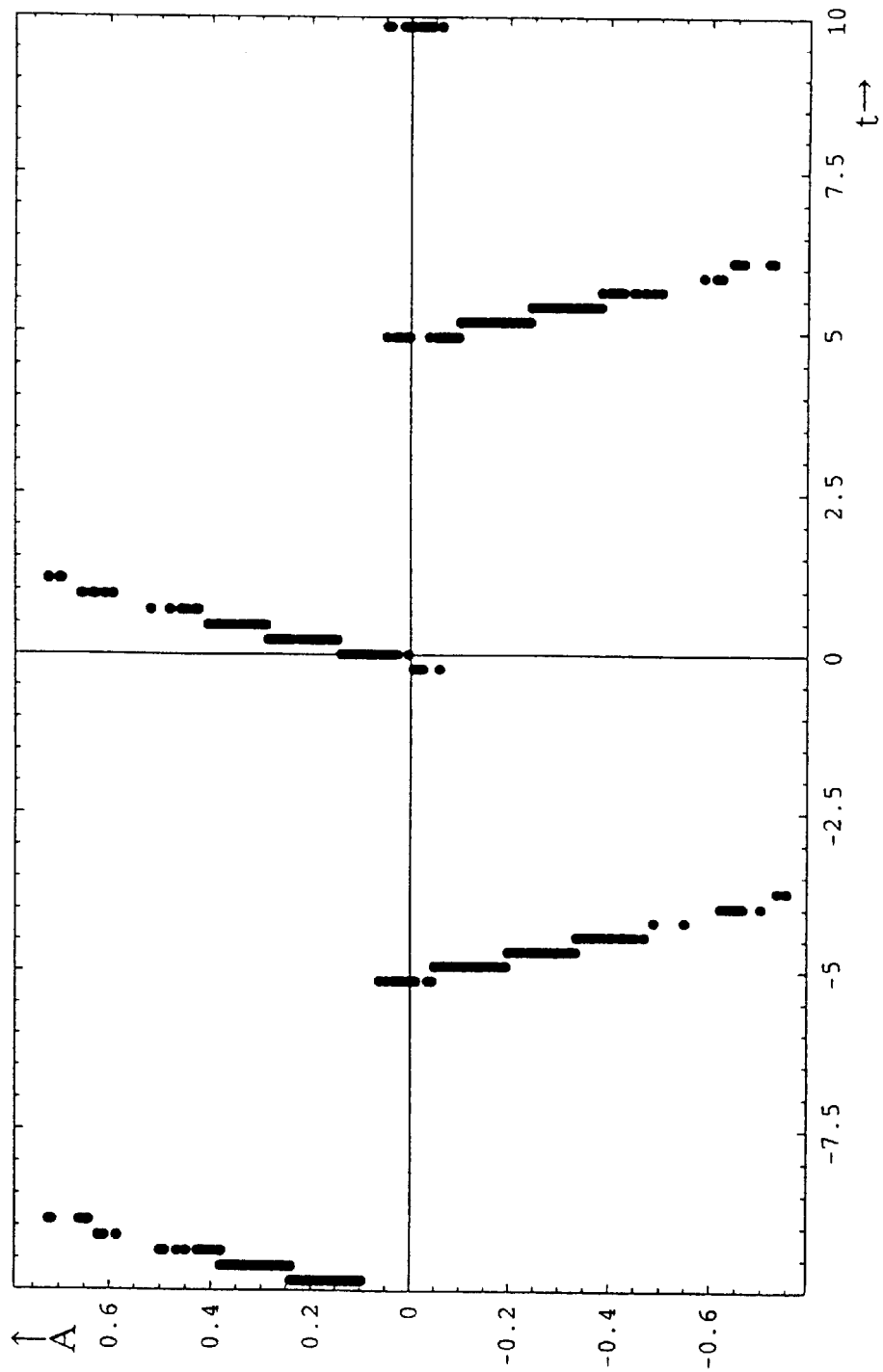
FIG. 9 is a waveform reproduced by simulation in a random sampling using a fixed clock of the prior art, in which a hold time duration Tmh=1000.3Tc, a clock cycle time Tc=10(1+32/M), a number of displayed data M=64, and an input signal with the standard deviation of the fluctuation FL=0.0003.
Figure 10:
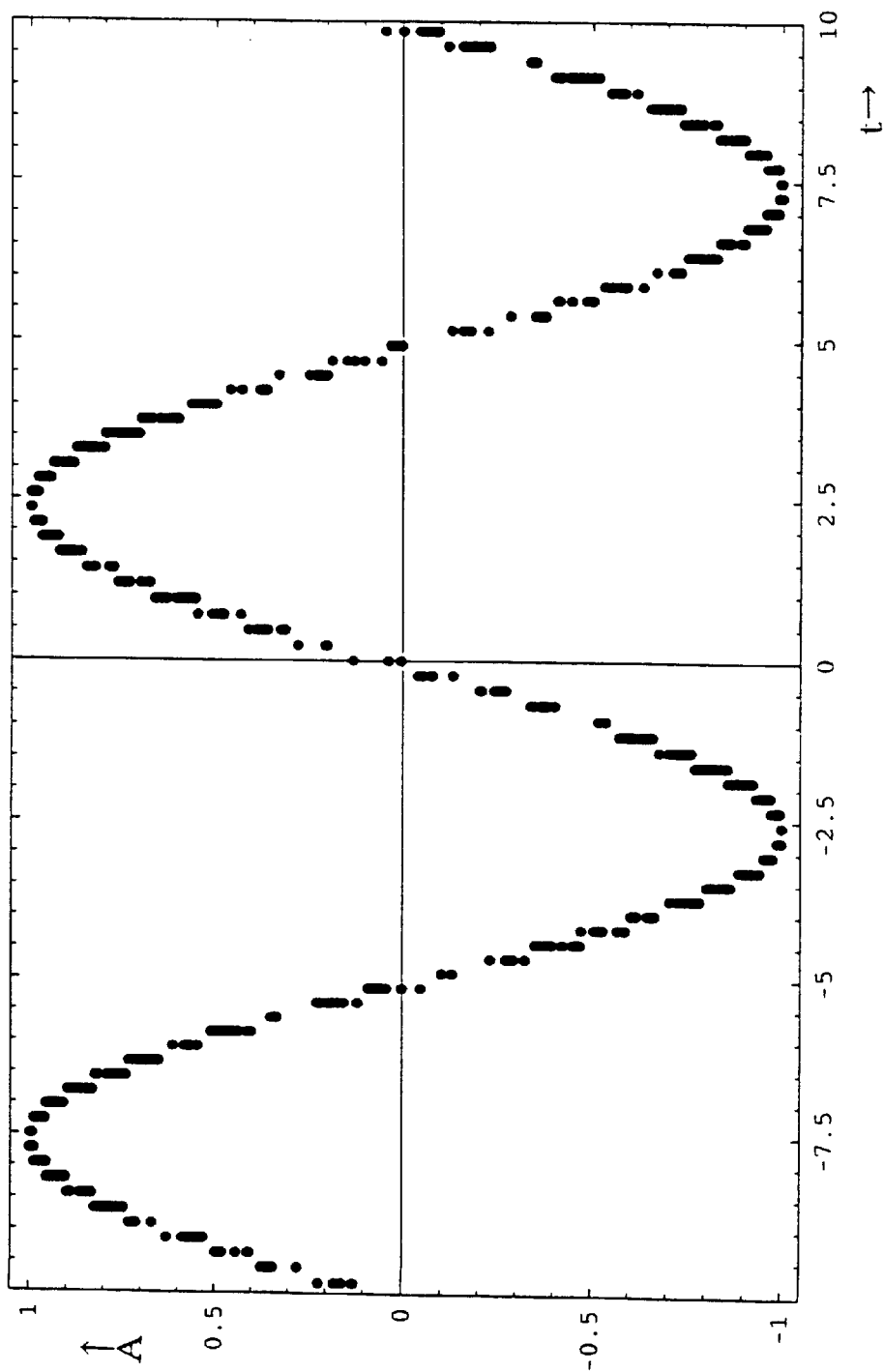
FIG. 10 is a waveform reproduced by simulation in a random sampling using a fixed clock of the prior art, in which a hold time duration Tmh=50000.3Tc, a clock cycle time Tc=10(1+32/M), a number of displayed data M=64, and an input signal with the standard deviation of the fluctuation FL=0.0003.

FIG. 41 shows the reproduced waveform (replica) of the input signal with the standard deviation of the fluctuation FL=0.003 which equals that of FIG. 4 according to the prior art. It is understandable that the effectiveness of the invention for the input signal fluctuation is very obvious. The coherent sampling of the invention exhibits the faculty of jitterless at and around the trigger point (t=0) in spite of the fluctuation of the signal 1. Such a faculty can not be realized by the prior art coherent sampling of FIGS. 3 and 4.

Each of FIGS. 42, 43, 44 and 45 shows the waveform reproduced by the simulation of the coherent sampling of the invention. In those FIGS., the hold time duration Tmh= 10.3Tc, 1000.3Tc, 1000.3Tc and 50000.3Tc, the clock cycle times Tc=10(1+8/M), 10(1+8/M), 10(1+32/M) and 10(1+32/M), and the signals with the standard deviations of fluctuations FL=0.001, 0.001, 0.0003 and 0.0003, are assumed.

Each of FIGS. 42, 43, 44 and 45 respectively corresponds with each of FIGS. 7, 8, 9 and 10 according to the prior arts.

It is understandable by comparing with FIGS. 42 to 45 that a little irregularity of data acquisition density may occur in accordance with the increase of FL or the extent of Tmh. However, the waveform missing phenomena, which are shown in FIGS. 7 to 10 of the prior art random sampling by using a fixed clock rate, can not be find.

The objects of the random sampling of the prior art, in which the clock phase is randomly shifted, are the pretrigger capability, the prevention of the jitter and the reduction of the waveform missing phenomena. The objects of the random sampling is the same as those of the coherent sampling of the invention. The random sampling has, however, the disadvantage that the data acquisition efficiency E in the fine time resolution, for example Tc/100 and/or Tc/1000, is very low. The data acquisition efficiency E will be explained by examples. Let's assume that the time resolution is Tc/M, namely, M-bins are used for Tc, and acquisitions are executed NM-times. Ideally the number of the interpolation data to be acquired for a bin is N.

Figure 46:
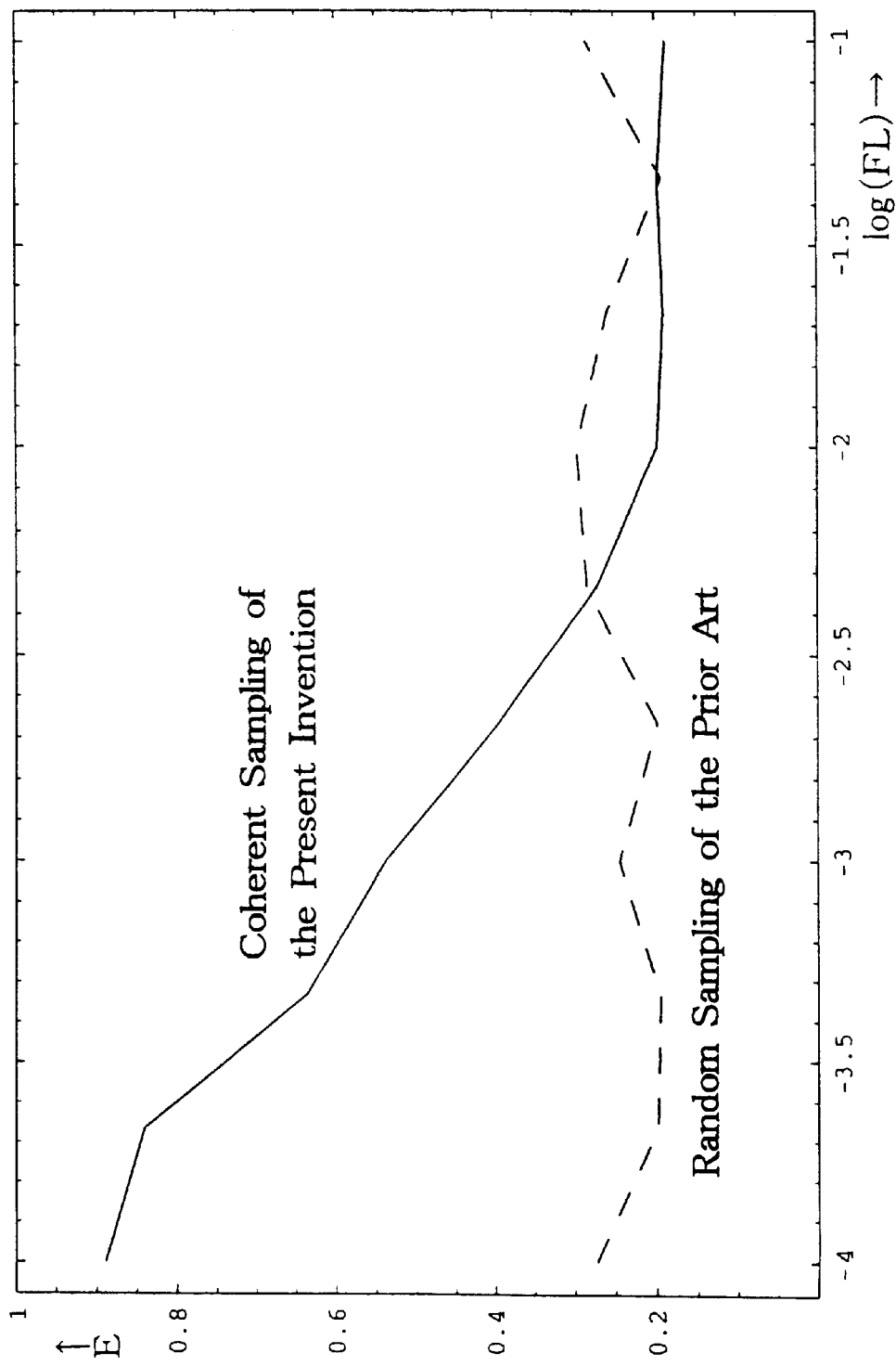
FIG. 46 is a graph showing variations of sampling data acquisition efficiencies to the standard deviations of the fluctuations FLs of input signals in a coherent sampling of FIG. 14 according to the present invention and a random sampling of the prior art.

In FIG. 46, a simulated result of the data acquisition efficiency E versus the standard deviation of the fluctuation FL of the signal 1 is shown, in which M=64 and N=10. The solid line shows the efficiency of the coherent sampling of the invention and the broken line shows that of the random sampling of the prior art. When each of all of 64-bins stores with 10-data through 640 acquisitions, the efficiency E is defined as 1.

When each of the 11-bins stores with 5-data and each of 53-bins stores with 6-data or more, the efficiency E is defined as (5+11/64)/10. It is assumed that the average time period of the signal 1 is 10Tc, the hold time duration Tmh of the hold signal 51 of the invention is 10.3Tc, and the Tmh of the random sampling of the prior art is 103Tc. Because the random sampling requires a long term to shift the phase of the clock 3. The vertical axis shows the data acquisition efficiency E and the horizontal axis shows the logarithm of the standard deviation of the fluctuation FL.

It is understandable in FIG. 46 that the efficiency E of the random sampling approximately equals 0.25 regardless of the variation of the signal fluctuation. The efficiency E being 0.25 is 1/k, which is shown in the equation (2). In the invention, when the standard deviation of the fluctuation FL is 0.0001 (log(FL)=−4) or less, the efficiency E is approximately equal to 1. When 0.01 (log(FL)=−2) or more, the efficiency E is approximately equal to 0.2, which is approximately equal to that of the random sampling.

Figure 47:
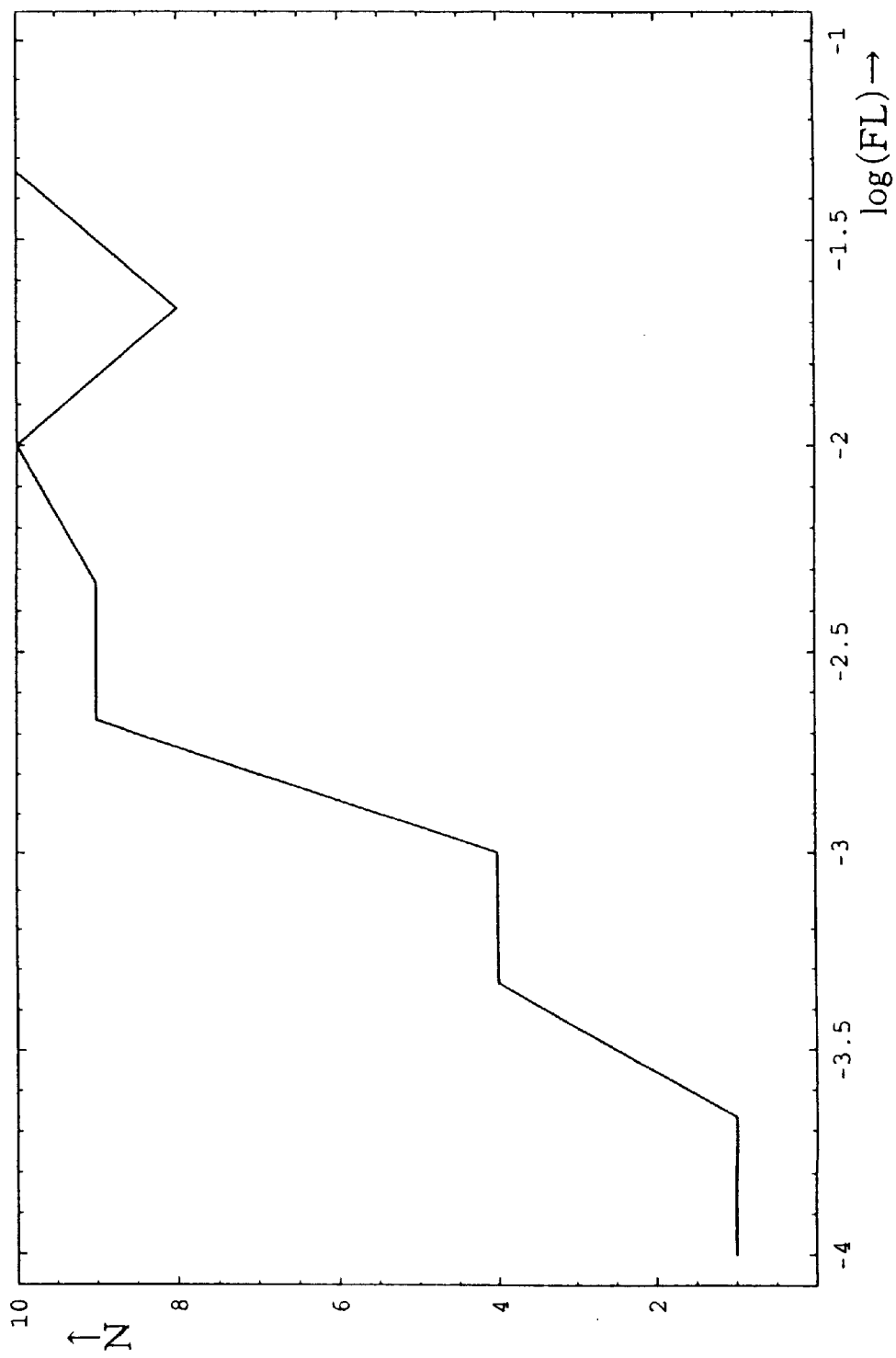
FIG. 47 is a graph showing variations of times to change a clock cycle time to the standard deviations of the fluctuations FLs of FIG. 46 according to the present invention.

In FIG. 47, there is shown the changing times N of Tc to obtain the data acquisition efficiency E of FIG. 46. When the standard deviation of the fluctuation FL of the signal is small, N is 1. When FL is large, N reaches to 10. When FL is large, Tc is changed every measurement of the accumulated reference trigger time period LTrr.

The average data acquisition time required for storing N-data into each of all time bins is as follows. In the prior art, the average data acquisition time Tran of the random sampling is approximately equal to MNTmh/E, in which the word of the "approximately" means the assumption that the trigger 2 occurs immediately after the release of holdoff as an assumed premise condition.

In the invention, the clock cycle time Tc is checked every measurement of the accumulated reference trigger time period LTrr. When Tc is not renewed, the checking of Tc requires no time. Assuming that Tset is the time required for the calculation and setting of Tc and Nset is the number of the setting times of Tc, the average data acquisition time Tcoh of the invention is approximately equals to MNTmh/E+TsetNset.

When the standard deviation of the fluctuation FL of the signal is large and each of the efficiencies Es of the invention and the random sampling of the prior art is approximately equal to 0.25, each of the average value of Tran and Tcoh will be as follows.

Assuming that Tmh=100Tc, Tran is approximately equal to 400MNTc.

Assuming that Nset=N, Tset=1000Tc, and Tmh=10Tc, Tcoh is approximately equal to 40NMTc(1+25/M).

In the fine resolution data acquisition, the number of bins of M≧100 (for example 1000) are employable, so that the term (25/M) is negligible small. The ratio of Tran/Tcoh is, therefore, approximately equal to 10. It is understandable that the acquisition speed of the invention is about 10 times faster than that of the random sampling of the prior art.

When the standard deviation of the fluctuation FL of the signal is small and the efficiency E is nearly equal to 1, the average data acquisition time Tcoh2 of the invention is given by Tcoh2=10MNTc(1+100/MN)

in which Nset=1, Tset=1000Tc and Tmh=10Tc are supposed. In this case, Tran is the above-mentioned value, so that the ratio Tran/Tcoh2 is approximately equal to 40. The acquisition speed of the invention is about 40-times faster than that of the random sampling of the prior art.

In the prior art random sampling randomly shifting the phase of the clock 3, the phase is randomly shifted by large amount. It is, therefore, difficult to obtain the hold time duration Tmh of the short time period. Even if the input signal 1 with no fluctuation is applied, the signal 1 is randomly sampled, which is the cause of low data acquisition efficiency. By the above-mentioned two reasons of the long hold time and the low efficiency, the data acquisition time Tran of the random sampling of the prior art is significantly increased.

In the coherent sampling of the present invention, the clock cycle time Tc is checked every measurement of the accumulated reference trigger time period LTrr. The input signal 1 is coherently sampled by Tc of the constant cycle time except the time period to set the new Tc. Therefore, the hold time duration Tmh is short, the data acquisition efficiency E for the signal 1 with no fluctuation is keepable to be nearly equal to 1, and the high speed data acquisition is realizable.

For the signal 1 with period fluctuation, the clock cycle time Tc is set according to the mean value of signal periods. Therefore, the clock samples the signal coherently-like without randomizing its phase which enables to realize the short hold time duration Tmh. At the same time, time interpolation data for the data acquisition timing are obtained referring to the trigger signal during the hold time duration. It is realizable to reproduce a jitterless waveform for a short period of time.

While the invention has been described in its preferred embodiments, it is to be understood that within the scope of the appended claims the invention can be practiced otherwise than as specifically described.

What is claimed is:

1. A coherent sampling method comprising the steps of;

digitizing (10) an input signal (1) sampled by a clock (3) to obtain a digital data (20);

acquisition storing (30) for storing the digital data (20);

synchronizing (100) with a trigger pulse as a reference trigger (RT1), which is applied after a first hold timing (h0) showing an end of a hold time duration (Tmh), among trigger pulses of a trigger (2) synchronizing the input signal (1) to recurrently obtain pulses as a synchronizing signal (52);

operating a timebase (200) recurrently
for measuring a first time difference (Ts1) between a first pulse of the synchronizing signal (52) synchronizing with the first reference trigger (RT1) and a clock of timing (c1) of the clock (3) applied thereafter,
for providing a second hold timing (h1), which shows an end of the hold time duration (Tmh), delayed by a delay time Td (=(Tc−Ts1) from a clock timing (c11) of the clock (3) applied just before the end of the hold time duration (Tmh), in which the delay time Td is a time difference between a clock cycle time (Tc) of the clock (3) and the first time difference (Ts1),
for receiving a second pulse of the synchronizing signal (52) synchronizing with a second reference trigger (RT2) of the trigger (2), and
for measuring a second time difference (Ts2) between the second pulse of the synchronizing signal (52) and a clock of timing (c13) of the clock (3) applied thereafter;

processing (40) recurrently,
for determining a number of time bins M(=Tc/Tres) by dividing the clock cycle time (Tc) by a predetermined time resolution (Tres),
for getting a time difference variation δTs(=Ts2−Ts1) between the first time difference (Ts1) and the second time difference (Ts2),
for obtaining a reference trigger time period (Trr) between the first reference trigger (RT1) and the second reference trigger (RT2),
for seeking coherent sampling conditions, by finding an integer Y that is a number (Floor[Trr/Tcr]) of pulses of the reference clock (RC) with a clock cycle time Trc for the reference trigger time period Trr, and by finding an integer X (Ceiling or Floor[Mod[Trr,Tcr]

(M/Tcr)]) that is prime to and is less than the number of time bins M, for calculating a new clock cycle time (Tc1) given by an equation of Tc, $$Tc=Trr/(Y+(X/M))$$

for deciding a time position of the stored digital data (20) to be displayed on a basis of the first and second reference triggers (RT1 and 2) and of each of time points (SP) sampled by the clock (3), and for instructing (48) to store waveform data to be displayed;

generating (300) recurrently the clock (3) of the new clock cycle time (Tc1) so as to satisfy the coherent sampling conditions; and storing (50) the waveform data to be displayed by the instruction (48) of the processing (40) step.

2. A coherent sampling method according to claim 1, wherein said processing (40) step comprises recurrently, determining a number of time bins M(=Tc/Tres) by dividing the clock cycle time (Tc) by a predetermined time resolution (Tres), getting a time difference variation δTs(=Ts2−Ts1) between the first time difference (Ts1) and the second time difference (Ts2) every time of a plurality of times of m, obtaining the reference trigger time period (Trr) between the first reference trigger (RT1) and the second reference trigger (RT2), accumulating the reference trigger time periods (Trrs) the m-times to get an accumulated reference trigger time period (LTrr), seeking the coherent sampling conditions by finding an integer Y that is a number (Floor[LTrr/m/Tcr]) of pulses of the reference clock (RC) with a clock cycle time Tcr for a mean reference trigger time period (LTrr/m), that is the accumulated reference trigger time period (LTrr) divided by the m, and by finding an integer X (Ceiling or Floor[Mod[LTrr/m,Tcr](M/Tcr)]) that is prime to and is less than the number of time bins M, calculating a new clock cycle time (Tc1) given by an equation of Tc, $$Tc=(LTrr/m)/(Y+(X/M))$$

deciding a time position of the stored digital data (20) to be displayed on a basis of the first and second reference triggers (RT1 and 2) and of each of time points (SP) sampled by the clock (3), and instructing (48) to store waveform data to be displayed.

3. A coherent sampling method according to any of claims 1 and 2, wherein the step of said operating a timebase (200) comprises recurrently, measuring (203) the first time difference (Ts1) between the first pulse of the synchronizing signal (52) synchronizing with the first reference trigger (RT1) and the clock of timing (c1) of the clock (3) applied thereafter to produce the first time difference (Ts1) as a time interpolation data, pretrigger-counting (206) a number of pulses (Npre) of the clock (3) occurring for a time period from a clock timing when the digital data (20) was obtained to another clock timing (c1) of the clock (3) immediately after the reference trigger (RT1), posttrigger-counting (204) a number of pulses (Npst) of the clock 3 occurring for a time period from the reference trigger (RT1) to a clock of timing when the digital data (20) was obtained, period-counting (207) a number of pulses of the clock 3 occurring for a time period except the hold time duration (Tmh).

4. A coherent sampling method according to any of claims 1, 2 and 3, wherein said generating step (300) comprises converting (301, 303, 304) a data of the new clock cycle time (Tc1) to an analog voltage, and oscillating (305) the clock 3 so as to have the new clock cycle time (Tc1) by being controlled with the analog voltage.

5. A coherent sampling method according to any of claims 1, 2 and 3, wherein said processing step (40) comprises, deciding a first number of pulses (Npst) of the clock (3) occurring for a time period from the reference trigger (RT1) to a clock of timing when the digital data (20) was obtained, a second number of pulses (Npre) of the clock (3) occurring after a clock timing when the digital data (20) was obtained, in which the first number of pulses (Npst) indicated a posttrigger acquisition time period (c1 to 3) and the second number of pulses (Npre; c8 to 10) is included in a pretrigger acquisition time period (c8 to 12), defining a measuring time period (Ts1+Tm1) including the posttrigger acquisition time period (c1 to 3), calculating the delay time (Td=Tc−Ts1) from the clock cycle time (Tc) and the first time difference (Ts1), transmitting the stored digital data of said acquisition storing (30) to said storing step (50) for a predetermined data processing time period (c5 to 8: Tm2), appointing a pretrigger time period (c8 to 11: Tm3, Npre) included in the pretrigger acquisition time period (c8 to 12), and providing the hold time period (Tmh=Ts1+Td+Tm1+Tm2+Tm3) by adding the measuring time period (Ts1+Tm1), the delay time (Td), the data processing time period (Tm2) and the pretrigger time period (Tm3).

6. A coherent sampling apparatus comprising;

digitizing means (10) for digitizing an input signal (1) sampled by a clock (3) to obtain a digital data (20);

acquisition storing means (30) for storing the digital data (20);

synchronizing means (100) for synchronizing with a trigger pulse as a reference trigger (RT1), which is applied after a first hold timing (h0) showing an end of a hold time duration (Tmh), among trigger pulses of a trigger (2) synchronizing the input signal (1) to recurrently obtain pulses as a synchronizing signal (52);

timebase means (200)

for recurrently measuring a first time difference (Ts1) between a first pulse of the synchronizing signal (52) synchronizing with the first reference trigger (RT1) and a clock of timing (c1) of the clock (3) applied thereafter, for recurrently providing a second hold timing (h1), which shows an end of the hold time duration (Tmh), delayed by a delay time Td (32 Tc−Ts1) from a clock timing (c11) of the clock (3) applied just before the end of the hold time duration (Tmh), in which the delay time Td is a time difference between a clock cycle time (Tc) of the clock (3) and the first time difference (Ts1), for recurrently receiving a second pulse of the synchronizing signal (52) synchronizing with a second reference trigger (RT2) of the trigger (2), and for recurrently measuring a second time difference (Ts2) between the second pulse of the synchronizing signal (52) and a clock of timing (c13) of the clock (3) applied thereafter;

processing means (40)

for recurrently determining a number of time bins M(=Tc/Tres) by dividing the clock cycle time (Tc) by a predetermined time resolution (Tres), for recurrently getting a time difference variation δTs (=Ts2−Ts1) between the first time difference (Ts1) and the second time difference (Ts2), for recurrently obtaining a reference trigger time period (Trr) between the first reference trigger (RT1) and the second reference trigger (RT2), for recurrently seeking coherent sampling conditions, by finding an integer Y that is a number (Floor[Trr/Tcr]) of pulses of the reference clock (RC) with a clock cycle time Tcr for the reference trigger time period Trr, and by finding an integer X (Ceiling or Floor[Mod[Trr,Tcr](M/Tcr)]) that is prime to and is less than the number of time bins M, for recurrently calculating a new clock cycle time (Tc1) given by an equation of Tc, $$Tc = Trr/(Y+(X/M))$$

for recurrently deciding a time position of the stored digital data (20) to be displayed on a basis of the first and second reference triggers (RT1 and 2) and of each of time points (SP) sampled by the clock (3), and for recurrently instructing (48) to store waveform data to be displayed;

generating means (300) for generating recurrently the clock (3) of the new clock cycle time (Tc1) so as to satisfy the coherent sampling conditions; and storing means (50) for recurrently storing the waveform data to be displayed by the instruction (48) of the processing means (40).

7. A coherent sampling apparatus according to claim 6, wherein said processing means (40) comprises determining means for recurrently determining a number of time bins M(=Tc/Tres) by dividing the clock rate time (Tc) by a predetermined time resolution (Tres), getting means for recurrently getting a time difference variation δTs(=Ts2−Ts1) between the first time difference (Ts1) and the second time difference (Ts2) every time of a plurality times of m, obtaining means for recurrently obtaining the reference trigger time period (Trr) between the first reference trigger (RT1) and the second reference trigger (RT2), accumulating means for recurrently accumulating the reference trigger times periods (Trrs) the m-times to get an accumulated reference trigger time period (LTrr), seeking means for recurrently seeking the coherent sampling conditions by finding an integer Y that is a number (Floor[LTrr/m/Tcr]) of pulses of the reference clock (RC) with a clock cycle time Tcr for a mean reference trigger time period (LTrr/m), that is the accumulated reference trigger time period (LTrr) divided by the m, and by finding an integer X (Ceiling or Floor[Mod[LTrr/m,Tcr](M/Tcr)]) that is prime to and is less than the number of time bins M, calculating means for recurrently calculating a new clock cycle time (Tc1) given by an equation of Tc, $$Tc = (LTrr/m)/(Y+(X/M))$$

deciding means for recurrently deciding a time position of the stored digital data (20) to be displayed on a basis of the first and second reference triggers (RT1 and 2) and of each of time points (SP) sampled by the clock (3), and instructing means (48) for recurrently instructing to store waveform data to be displayed.

8. A coherent sampling apparatus according to any of claims 6 and 7, wherein the timebase means (200) comprises, measuring means (203) for recurrently measuring the first time difference (Ts1) between the first pulse of the synchronizing signal (52) synchronizing with the first reference trigger (RT1) and the clock of timing (c1) of the clock (3) applied thereafter to produce the first time difference (Ts1) as a time interpolation data, pretrigger-counting means (206) for recurrently counting a number of pulses (Npre) of the clock (3) occurring for a time period from a clock timing when the digital data (20) was obtained to another clock timing (c1) of the clock (3) immediately after the reference trigger (RT1), posttrigger-counting means (204) for recurrently counting a number of pulses (Npst) of the clock 3 occurring for a time period from the reference trigger (RT1) to a clock of timing when the digital data (20) was obtained, period-counting means (207) for recurrently counting a number of pulses of the clock 3 occurring for a time duration except the hold time period (Tmh).

9. A coherent sampling apparatus according to any of claims 6, 7 and 8, wherein said generating means (300) comprises converting means (301, 303, 304) for recurrently converting a data of the new clock cycle time (Tc1) to an analog voltage, and oscillating means for oscillating (305) the clock 3 so as to have the new clock cycle time (Tc1) by being controlled with the analog voltage.

10. A coherent sampling apparatus according to any of claims 6, 7 and 8, wherein said processing means (40) comprises, deciding means for recurrently deciding a first number of pulses (Npst) of the clock (3) occurring for a time period from the reference trigger (RT1) to a clock of timing when the digital data (20) was obtained, a second number of pulses (Npre) of the clock (3) occurring after a clock timing when the digital data (20) was obtained, in which the first number of pulses (Npst) indicate a posttrigger acquisition time period (c1 to 3) and the second number of pulses (Npre; c8 to 10) is included in a pretrigger acquisition time period (c8 to 12), defining means for recurrently defining a measuring time period (Ts1+Tm1) including the posttrigger acquisition time period (c1 to 3), calculating means for recurrently calculating the delay time (Td=Tc−Ts1) from the clock cycle time (Tc) and the first time difference (Ts1), transmitting means for recurrently transmitting the stored digital data of said acquisition storing (30) to said storing means (50) for a predetermined data processing time period (c5 to 8: Tm2), appointing means for recurrently appointing a pretrigger time period (c8 to 11: Tm3, Npre) included in the pretrigger acquisition time period (c8 to 12), and providing means for recurrently providing the hold time period (Tmh=Ts1+Td+Tm1+Tm2+Tm3) by adding the measuring time period (Ts1+Tm1), the delay time (Td), the data processing time period (Tm2) and the pretrigger time period (Tm3).

* * * * *